(12) United States Patent
Chu et al.

(10) Patent No.: US 12,283,545 B2
(45) Date of Patent: *Apr. 22, 2025

(54) PACKAGE STRUCTURE AND METHOD OF MANUFACTURING THE SAME

(71) Applicant: Taiwan Semiconductor Manufacturing Company, Ltd., Hsinchu (TW)

(72) Inventors: Yung-Chi Chu, Kaohsiung (TW); Hung-Jui Kuo, Hsinchu (TW); Yu-Hsiang Hu, Hsinchu (TW); Wei-Chih Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/363,698

(22) Filed: Aug. 1, 2023

(65) Prior Publication Data

US 2023/0378065 A1 Nov. 23, 2023

Related U.S. Application Data

(60) Division of application No. 17/513,904, filed on Oct. 29, 2021, now Pat. No. 11,862,560, which is a
(Continued)

(51) Int. Cl.
*H01L 23/528* (2006.01)
*H01L 21/56* (2006.01)
(Continued)

(52) U.S. Cl.
CPC ........ *H01L 23/5283* (2013.01); *H01L 21/563* (2013.01); *H01L 21/76873* (2013.01); *H01L 23/3128* (2013.01); *H01L 23/5226* (2013.01); *H01L 23/5383* (2013.01); *H01L 23/5386* (2013.01); *H01L 24/09* (2013.01); *H01L 24/14* (2013.01); *H01L 24/33* (2013.01); *H01L 24/73* (2013.01); *H01L 25/0655* (2013.01); *H01L 2224/0231* (2013.01); *H01L 2224/02373* (2013.01); *H01L 2224/02379* (2013.01);
(Continued)

(58) Field of Classification Search
CPC ............. H01L 21/563; H01L 21/76873; H01L 23/3128; H01L 23/8226; H01L 23/5283; H01L 23/5383; H01L 23/5386; H01L 25/0655; H01L 25/50; H01L 2224/0231; H01L 2224/02373; H01L 2224/73203
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Dao H Nguyen
(74) *Attorney, Agent, or Firm* — JCIPRNET

(57) ABSTRACT

A package structure includes a semiconductor die and a first redistribution circuit structure. The first redistribution circuit structure is disposed on and electrically connected to the semiconductor die, and includes a first build-up layer. The first build-up layer includes a first metallization layer and a first dielectric layer laterally wrapping the first metallization layer, wherein at least a portion of the first metallization layer is protruded out of the first dielectric layer.

20 Claims, 43 Drawing Sheets

Related U.S. Application Data continuation of application No. 16/352,843, filed on Mar. 14, 2019, now Pat. No. 11,164,814.

(51) Int. Cl.
  *H01L 21/768* (2006.01)
  *H01L 23/00* (2006.01)
  *H01L 23/31* (2006.01)
  *H01L 23/522* (2006.01)
  *H01L 23/538* (2006.01)
  *H01L 25/065* (2023.01)

(52) U.S. Cl.
  CPC .............. *H01L 2224/02381* (2013.01); *H01L 2224/0401* (2013.01); *H01L 2224/73203* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,659,806 B2 * | 5/2017 | Chang ................. H01L 23/5384 |
| 10,283,443 B2 * | 5/2019 | Liao ........................ H01L 24/20 |
| 2016/0120033 A1 * | 4/2016 | Furusawa ............... H05K 1/115 174/251 |
| 2020/0185314 A1 * | 6/2020 | Kim ................... H01L 23/49822 |
| 2020/0279815 A1 * | 9/2020 | Huang .................. H01L 23/552 |

\* cited by examiner

PACKAGE STRUCTURE AND METHOD OF MANUFACTURING THE SAME

CROSS-REFERENCE TO RELATED APPLICATION

This application is a divisional application of and claims the priority benefits of a prior U.S. application Ser. No. 17/513,904, filed on Oct. 29, 2021. The prior U.S. application Ser. No. 17/513,904 is a continuation application of and claims the priority benefit of a prior U.S. application Ser. No. 16/352,843, filed on Mar. 14, 2019, now allowed. The entirety of each of the above-mentioned patent application is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging (e.g. formation of redistribution circuit structure/layer). In addition, such packages may further be integrated to a semiconductor substrate or carrier after dicing.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
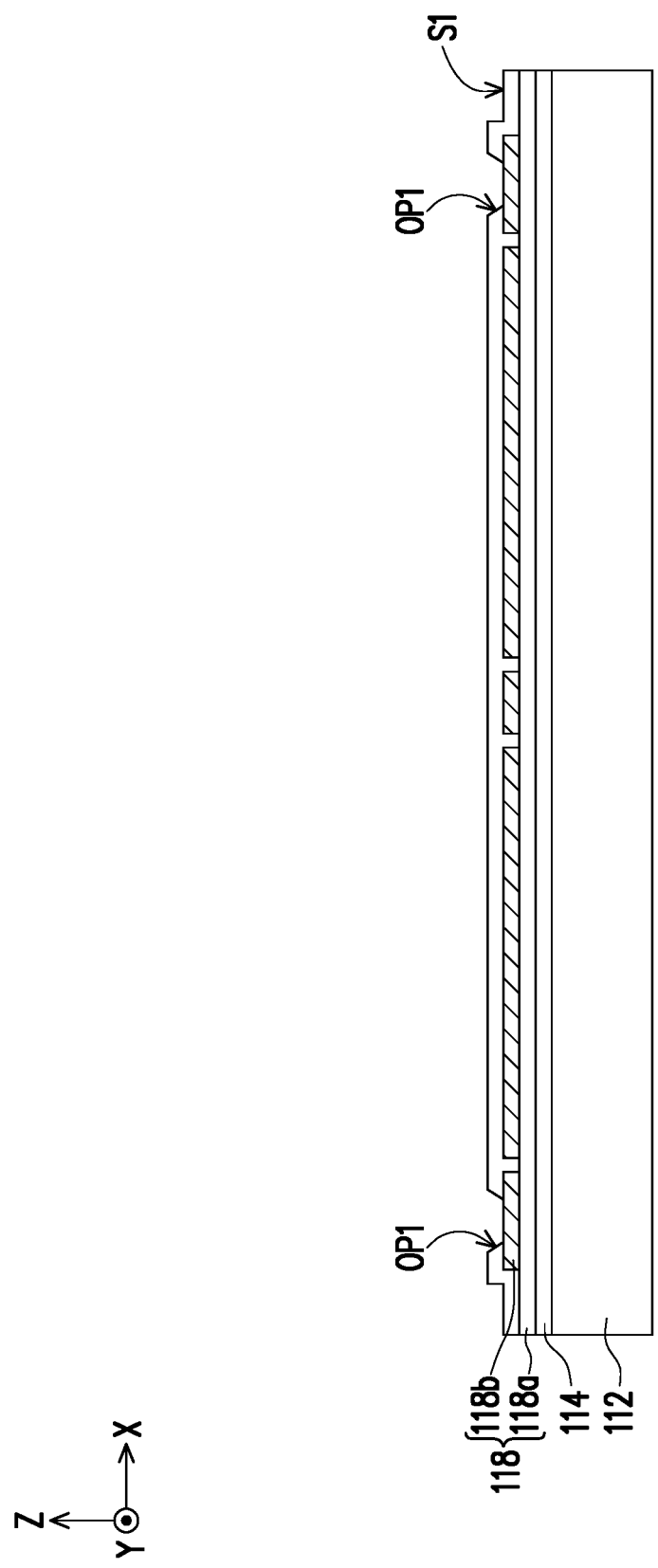
FIG. 1 to FIG. 32 are schematic cross sectional views of various stages in a manufacturing method of a package structure in accordance with some embodiments of the present disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", "fifth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease cost.

FIG. 1 to FIG. 32 are schematic cross sectional views of various stages in a manufacturing method of a package structure in accordance with some embodiments of the present disclosure. In embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure. In FIG. 1 to FIG. 32, more than one (semiconductor) chips or dies are shown to represent plural (semiconductor) chips or dies of the wafer, and one (semiconductor) package structure is shown to represent plural (semiconductor) package structures obtained following the (semiconductor) manufacturing method, however the disclosure is not limited thereto. In other embodiments, one or more than one (semiconductor) chips or dies are shown to represent plural (semiconductor) chips or dies of the wafer, and one or more than one (semiconductor) package structure are shown to represent plural (semiconductor) package structures obtained following the (semiconductor) manufacturing method, however the disclosure is not limited thereto.

Referring to FIG. 1, in some embodiments, a carrier 112 is provided. In some embodiments, the carrier 112 may be a glass carrier or any suitable carrier for carrying a semiconductor wafer or a reconstituted wafer for the manufacturing method of the semiconductor package. In some embodiments, the carrier 112 is coated with a debond layer 114. The material of the debond layer 114 may be any material suitable for bonding and debonding the carrier 112 from the above layer(s) or any wafer(s) disposed thereon.

In some embodiments, the debond layer 114 may include a dielectric material layer made of a dielectric material including any suitable polymer-based dielectric material (such as benzocyclobutene (BCB), polybenzoxazole (PBO)). In an alternative embodiment, the debond layer 114 may include a dielectric material layer made of an epoxy-based thermal-release material, which loses its adhesive property when heated, such as a light-to-heat-conversion (LTHC) release coating film. In a further alternative embodiment, the debond layer 114 may include a dielectric material layer made of an ultra-violet (UV) glue, which loses its adhesive property when exposed to UV lights. In certain embodiments, the debond layer 114 may be dispensed as a liquid and cured, or may be a laminate film laminated onto the carrier 112, or may be the like. The top surface of the debond layer 114, which is opposite to a bottom surface contacting the carrier 112, may be levelled and may have a high degree of coplanarity. In certain embodiments, the debond layer 114 is, for example, a LTHC layer with good chemical resistance, and such layer enables room temperature debonding from the carrier 112 by applying laser irradiation, however the disclosure is not limited thereto.

In an alternative embodiment, a buffer layer (not shown) may be coated on the debond layer 114, where the debond layer 114 is sandwiched between the buffer layer and the carrier 112, and the top surface of the buffer layer may further provide a high degree of coplanarity. In some embodiments, the buffer layer may be a dielectric material layer. In some embodiments, the buffer layer may be a polymer layer which made of polyimide (PI), PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

Continued on FIG. 1, in some embodiments, a redistribution circuit structure 118 is formed over the carrier 112. For example, in FIG. 1, the redistribution circuit structure 118 is formed on the debond layer 114, and the formation of the redistribution circuit structure 118 includes sequentially forming one or more dielectric layers 118a and one or more metallization layers 118b in alternation. In some embodiments, the redistribution circuit structure 118 includes two dielectric layers 118a and one metallization layer 118b as shown in FIG. 1, where the metallization layer 118b is sandwiched between the dielectric layers 118a, and portions of a top surface of the metallization layer 118b are respectively exposed by the openings of a topmost layer of the dielectric layers 118a. However, the disclosure is not limited thereto. The numbers of the dielectric layers 118a and the metallization layer 118b included in the redistribution circuit structure 118 is not limited thereto, and may be designated and selected based on the demand. For example, the numbers of the dielectric layers 118a and the metallization layer 118b may be one or more than one.

In certain embodiments, the portions of a top surface of the metallization layer 118b are exposed by contact openings OP1 formed in the topmost layer of the dielectric layers 118a, as shown in FIG. 1. For example, the topmost layer of the dielectric layers 118a includes two contact openings OP1 as shown in FIG. 1. However, the disclosure is not limited thereto. The number and shape of the contact openings OP1 formed in the topmost layer of the dielectric layers 118a is not limited thereto, and may be designated and selected based on the demand.

In certain embodiments, the material of the dielectric layers 118a may be PI, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 118a formed by suitable fabrication techniques such as spin-on coating process, chemical vapor deposition (CVD) process (such as plasma-enhanced chemical vapor deposition (PECVD) process), or the like. The disclosure is not limited thereto.

In some embodiments, the material of the metallization layer 118b may be made of conductive materials formed by electroplating or deposition, such as aluminum, titanium, copper, nickel, tungsten, and/or alloys thereof, which may be patterned using a photolithography and etching process. In some embodiments, the metallization layer 118b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 2:
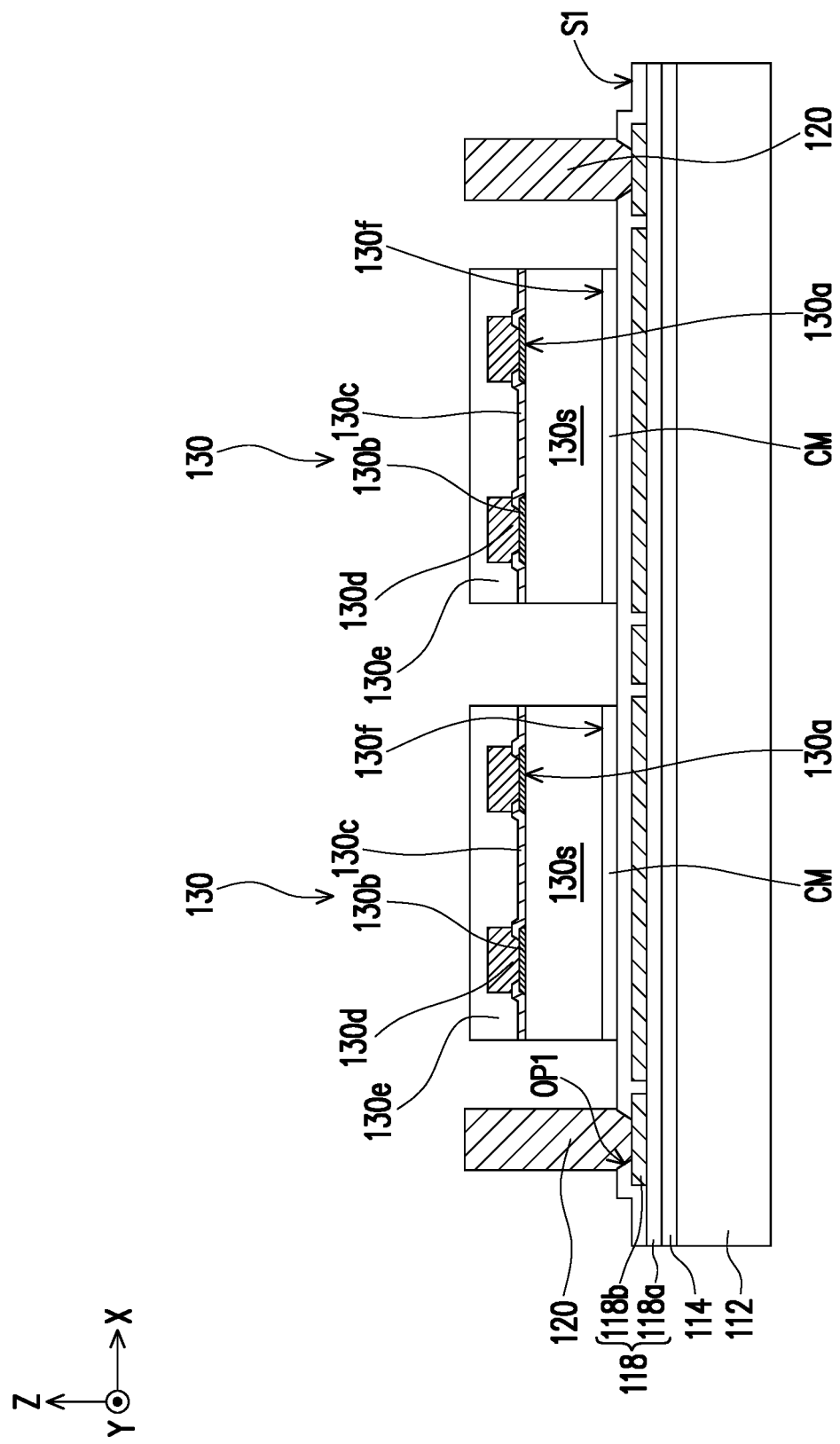

Referring to FIG. 2, in some embodiments, through vias 120 are formed on the redistribution circuit structure 118 (e.g. a first side S1 of the redistribution circuit structure 118). In some embodiments, the through vias 120 may be through integrated fan-out (InFO) vias. In some embodiments, the through vias 122 are arranged along but not on a cutting line (not shown) between two package structures PS1. For simplification, only two through vias 120 are presented in FIG. 2 for illustrative purposes, however it should be noted that more than two through vias 120 may be formed; the disclosure is not limited thereto. The number of the through vias 120 may be designated and selected based on the demand, and adjusted by changing the number and shape of the contact openings OP1.

In some embodiments, the through vias 120 are formed by photolithography, plating, photoresist stripping processes or any other suitable method. For example, the plating process may include an electroplating plating, an electroless plating, or the like. In one embodiment, the through vias 120 may be formed by forming a mask pattern (not shown) covering the redistribution circuit structure 118 with openings exposing the top surface of the metallization layer 118b exposed by the contact openings OP1 formed in the topmost layer of the dielectric layers 118a, forming a metallic material filling the openings formed in the mask pattern and the contact openings OP1 to form the through vias 120 by electroplating or deposition, and then removing the mask pattern. In one embodiment, the mask pattern may be removed by acceptable ashing process and/or photoresist stripping process, such as using an oxygen plasma or the like. In one embodiment, prior to the formation of the mask pattern, a seed layer may be formed conformally over the redistribution circuit structure. The disclosure is not limited thereto. In one embodiment, the material of the through vias 120 may include a metal material such as copper or copper alloys, or the like.

However, the disclosure is not limited thereto. In alternative embodiments, the through vias 120 may be pre-fabricated through vias which may be disposed on the redistribution circuit structure 118 by picking- and placing.

Continued on FIG. 2, in some embodiments, at least one semiconductor die 130 with a connecting film CM disposed thereon is provided over the carrier 112. Hereafter, two semiconductor dies 130 are shown in FIG. 2 for illustration purpose; however, the disclosure is not limited thereto. In other embodiments, the number of the semiconductor die 130 may be one or more than one based on the demand and the design layout.

For example, as shown in FIG. 2, the semiconductor dies 130 are disposed over the carrier 102 and on the redistribution circuit structure 118 through the connecting films CM, respectively. In some embodiments, each of the connecting films CM is located between a respective one of the semiconductor dies 130 and the redistribution circuit structure 118, and each of the connecting films CM physically contacts a backside surface 130f of the respective one of the semiconductor dies 130 and the redistribution circuit structure 118 (e.g. the topmost layer of the dielectric layers 118a). In some embodiments, due to the connecting films CM provided between the semiconductor dies 130 and the redistribution circuit structure 118, the semiconductor dies 130 and the redistribution circuit structure 118 are stably adhered to each other. In some embodiments, the connecting films CM may be, for example, a semiconductor die attach film, a layer made of adhesives or epoxy resin, or the like. In some embodiments, the redistribution circuit structure 118 is referred to as a back-side redistribution layer of the semiconductor dies 130 for providing routing function.

In some embodiments, as shown in FIG. 2, the semiconductor dies 130 each include a semiconductor substrate 130s having an active surface 130a and the backside surface 130f opposite to the active surface 130a, a plurality of pads 130b distributed on the active surface 130a, a passivation layer 130c covering the active surface 130a exposed by the pads 130b and a portion of the pads 130b, a plurality of conductive vias 130d connected to the portion of the pads 130b exposed by the passivation layer 130c and a portion of the passivation layer 130c, and a protection layer 130e covering the conductive vias 130d and the passivation layer 130c exposed by the conductive vias 130d. The pads 130b are partially covered by the passivation layer 130c, the conductive vias 130d are directly disposed on and electrically connected to the pads 130b, and the protection layer 130e covers the passivation layer 130c and the conductive vias 130d.

In an alternative embodiment, the conductive vias 130d and the protection layer 130e may be omitted; that is, the semiconductor dies 130 each may include the semiconductor substrate 130s having the active surface 130a and the backside surface 130f opposite to the active surface 130a, the pads 130b distributed on the active surface 130a, the passivation layer 130c covering the active surface 130a and the pads 130b. The disclosure is not limited thereto.

The material of the semiconductor substrate 130s may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 130s may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 130s may further include an interconnection structure (not shown) disposed on the active surface 130a. In certain embodiments, the interconnection structure may include one or more inter-dielectric layers and one or more patterned conductive layers stacked alternately for providing routing function to the active components and the passive components embedded in the semiconductor substrate 130s, where the pads 130b may be referred to as an outermost layer of the patterned conductive layers. In one embodiment, the interconnection structure may be formed in a back-end-of-line (BEOL) process. For example, the inter-dielectric layers may be silicon oxide layers, silicon nitride layers, silicon oxy-nitride layers, or dielectric layers formed by other suitable dielectric materials, and the inter-dielectric layers may be formed by deposition or the like. For example, the patterned conductive layers may be patterned copper layers or other suitable patterned metal layers, and the patterned conductive layers may be formed by electroplating or deposition. However, the disclosure is not limited thereto.

In some embodiments, the pads 130b may be aluminum pads or other suitable metal pads. In some embodiments, the conductive vias 130d are copper pillars, copper alloy pillar or other suitable metal pillars, for example. In some embodiments, the passivation layer 130c and/or the protection layer 130e may be a PBO layer, a PI layer or other suitable polymers. In some alternative embodiments, the passivation layer 130c and/or the protection layer 130e may be made of inorganic materials, such as silicon oxide, silicon nitride, silicon oxynitride, or any suitable dielectric material. In certain embodiments, the materials of the passivation layer 130c and the protection layer 130e may be the same or different, the disclosure is not limited thereto.

In some embodiments, each of the semiconductor dies 130 described herein may be referred to as a chip or an integrated circuit (IC). In some embodiments, the semiconductor dies 130 may include chip(s) of the same type or different types. For example, the semiconductor dies 130 include wireless and radio frequency (RF) chips. For example, in an alternative embodiment, the semiconductor dies 130 digital chips, analog chips, or mixed signal chips, such as application-specific integrated circuit ("ASIC") chips, sensor chips, wireless and radio frequency (RF) chips, memory chips, logic chips, voltage regulator chips, or a combination thereof. In an alternative embodiment, the semiconductor dies 130, one or all, may be referred to as a chip or a IC of combination-type. For example, at least one of the semiconductor dies 130 may be a WiFi chip simultaneously including both of a RF chip and a digital chip. The disclosure is not limited thereto.

As shown in FIG. 2, in some embodiments, the through vias 120 are located aside of a location of the semiconductor dies 130, and are mechanically and electrically connected to the metallization layer 118b of the redistribution circuit structure 118. In FIG. 2, a height of the through vias 120 is greater than a height of the semiconductor dies 130, for example; however, the disclosure is not limited thereto. In an alternative embodiment, the height of the through vias 120 may be less than or substantially equal to the height of the semiconductor dies 130. In one embodiment, the through vias 120 may be formed prior to the formation of the semiconductor dies 130. In an alternative embodiment, the through vias 120 may be formed after the formation of the semiconductor dies 130. The disclosure is not limited to the disclosure.

Figure 3:
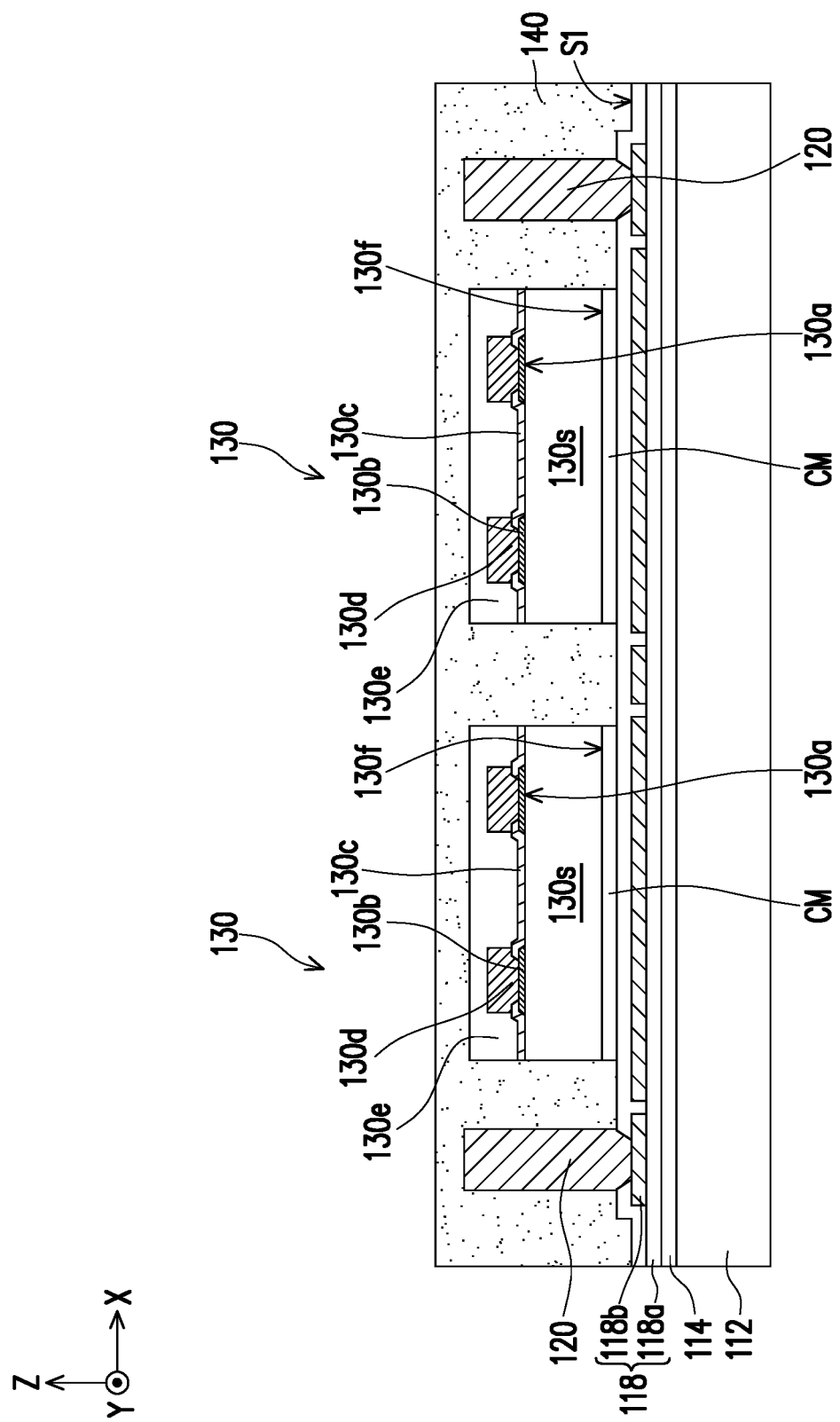

Referring to FIG. 3, in some embodiments, the through vias 120 and the semiconductor dies 130 are encapsulated in an insulating encapsulation 140. In some embodiments, the insulating encapsulation 140 is formed on the redistribution circuit structure 118 and over the carrier 112. As shown in FIG. 3, the insulating encapsulation 140 at least fills up the gaps between the semiconductor dies 130, between the through vias 120, and between the semiconductor dies 130 and the through vias 120, for example. In some embodiments, the insulating encapsulation 140 covers the through vias 120 and the semiconductor dies 130. In other words, for example, the through vias 120 and the semiconductor dies 130 are not accessibly revealed by and embedded in the insulating encapsulation 140.

In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto.

Figure 4:
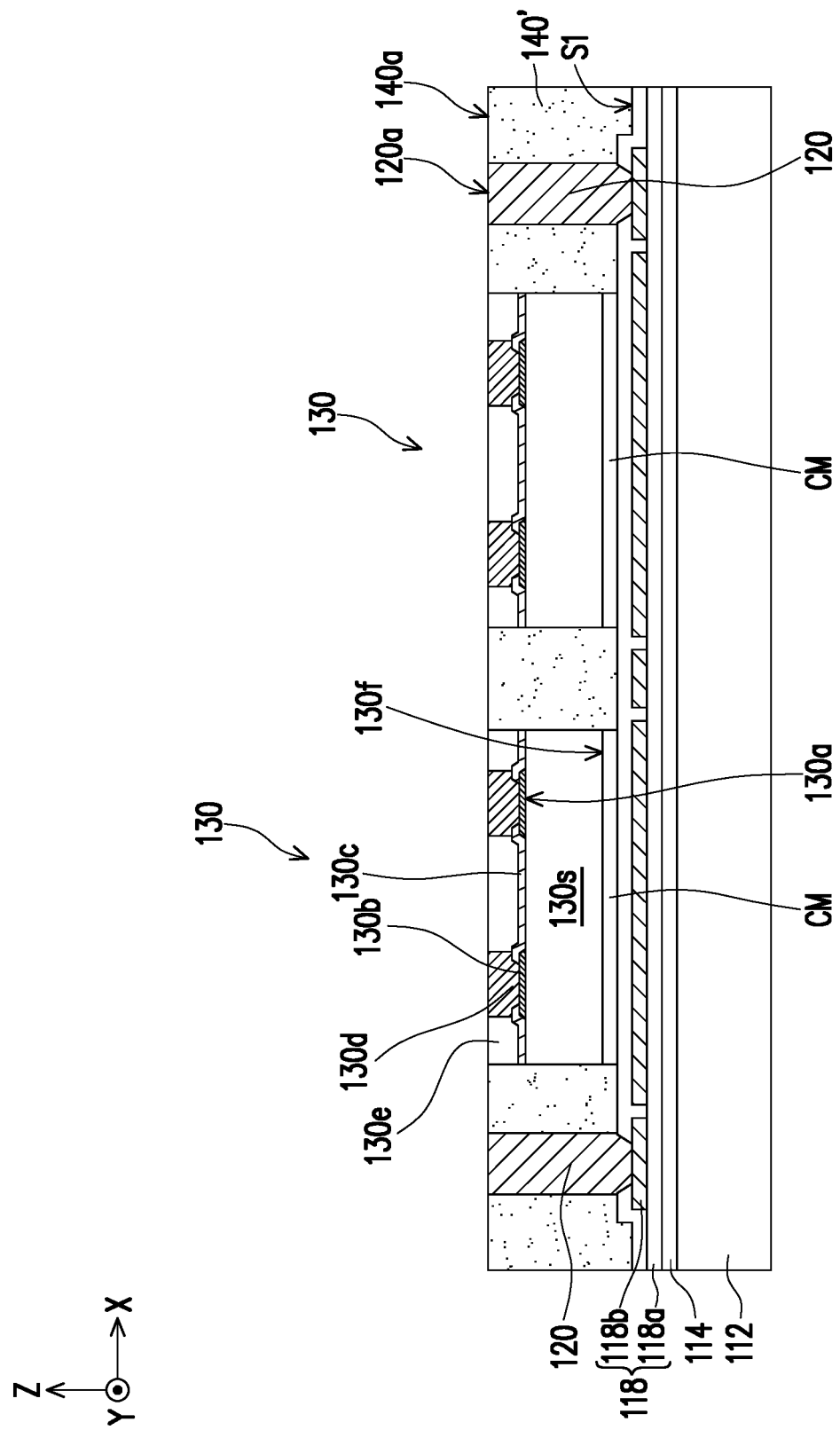

Referring to FIG. 4, in some embodiments, the insulating encapsulation 140 is planarized to form an insulating encapsulation 140' exposing the through vias 120 and the semiconductor dies 130. In certain embodiments, as shown in FIG. 4, after the planarization, top surfaces 120a of the through vias 120 and top surfaces of the semiconductor dies 130 (e.g. top surfaces of the conductive vias 130d and the protection layer 130e of each of the semiconductor dies 130) are exposed by a top surface 140a of the insulating encapsulation 140'. That is, for example, the top surfaces 120a of the through vias 120 and the top surfaces of the semiconductor dies 130 become substantially leveled with the top surface 140a of the insulating encapsulation 140'. In other words, the top surfaces 120a of the through vias 120, the top surfaces of the semiconductor dies 130, and the top surface 140a of the insulating encapsulation 140' are substantially coplanar to each other. In some embodiments, as shown in FIG. 4, the through vias 120 and the semiconductor dies 130 are accessibly revealed by the insulating encapsulation 140'. That is, for example, the conductive vias 130d of the semiconductor dies 130 and the through vias 120 are accessibly revealed by the insulating encapsulation 140'.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive vias 130d and the protection layer 130e of the semiconductor dies 130 and/or the through vias 120 may also be planarized. In certain embodiments, the planarizing step may be, for example, performed on the over-molded insulating encapsulation 140 to level the top surface 140a of the insulating encapsulation 140', the top surfaces 120a of the through vias 120, and the top surfaces of the conductive vias 130d and the protection layer 130e of each of the semiconductor dies 130.

In some embodiments, a redistribution circuit structure 150 is formed on the semiconductor dies 130 and the insulating encapsulation 140'. As shown in FIG. 5 to FIG. 25, the redistribution circuit structure 150 includes one or more than one seed layers 152 (e.g., a seed layer 152-1, a seed layer 152-2, a seed layer 152-3, and a seed layer 152-4), one or more than one patterned conductive layers 154 (e.g., a patterned conductive layer 154-1, a patterned conductive layer 154-2a, a patterned conductive layer 154-2b, and a patterned conductive layer 154-3), and one or more than one dielectric layers 156 (e.g., a dielectric layer 156-1, a dielectric layer 156-2, and a dielectric layer 156-3). However, in the disclosure, the numbers of layers of the seed layers 152, the patterned conductive layer 154, and the dielectric layers 156 are not limited to what is depicted in FIG. 5 to FIG. 25. The numbers of the layers of the seed layers 152, the patterned conductive layer 154, and the dielectric layers 156 may be one or more than one based on the demand and the design layout.

Figure 5:
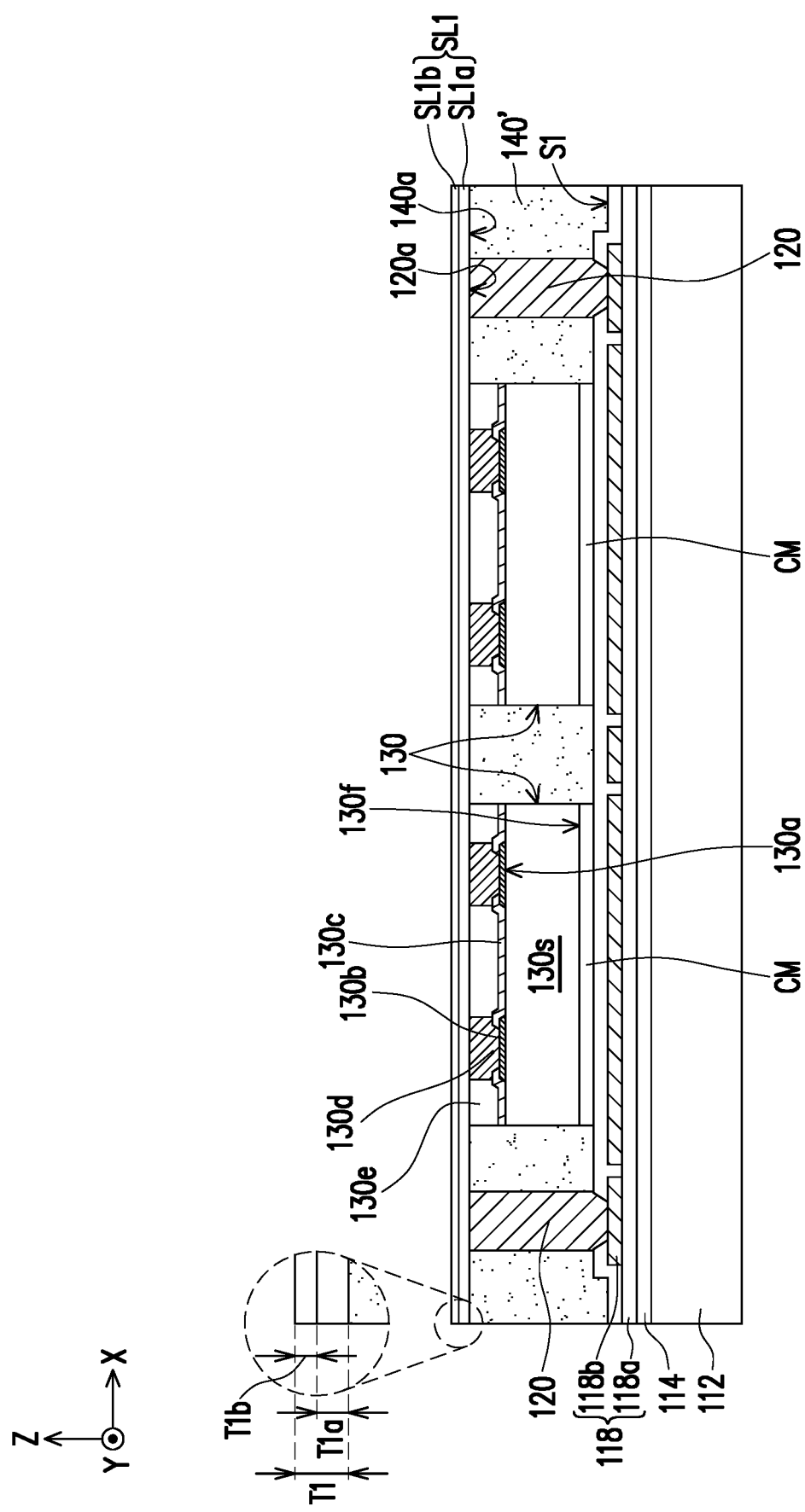

Referring to FIG. 5, in some embodiments, a seed material layer SL1 is disposed on the semiconductor dies 130 and the insulating encapsulation 140'. In some embodiments, the seed material layer SL1 is conformally formed on the semiconductor die dies 130 and the insulating encapsulation 140' in a form of multiple metal or metal alloy layers, where each of the multiple metal or metal alloy layers is a blanket layer of metal or metal alloy materials.

In some embodiments, as shown in FIG. 5, the seed material layer SL1 includes a first seed material layer SL1$a$ and a second seed material layer SL1$b$ stacked on the first seed material layer SL1$a$ along a stacking direction (e.g. a direction Z) of the redistribution circuit structure 118 and the semiconductor dies 130. As shown in FIG. 5, along the direction Z, a thickness T1$a$ of the first seed material layer SL1$a$ is greater than a thickness T1$b$ of the second seed material layer SL1$b$, for example. In some embodiments, the thickness T1$a$ of the first seed material layer SL1$a$ approximately ranges from 10 nm to 30 nm. In some embodiments, the thickness T1$b$ of the second seed material layer SL1$b$ approximately ranges from 40 nm to 70 nm. In some embodiments, a ratio of the thickness T1$a$ of the first seed material layer SL1$a$ to the thickness T1$b$ of the second seed material layer SL1$b$ approximately ranges from $1/7$ to $3/4$. In other words, a thickness of the seed material layer SL1 has a thickness T1, where the thickness T1 is a sum of the thickness T1$a$ of the first seed material layer SL1$a$ and the thickness T1$b$ of the second seed material layer SL1$b$.

For example, a material of the first seed material layer SL1$a$ may include copper, copper alloy or the like, and the first seed material layer SL1$a$ may be formed by deposition (such as physical vapor deposition (PVD)) or sputtering. For example, a material of the second seed material layer SL1$b$ may include titanium, titanium alloy or the like, and the second seed material layer SL1$b$ may be formed by deposition (such as PVD) or sputtering. As shown in FIG. 5, in some embodiments, the seed material layer SL1 is in physical and electrical contact with the conductive vias 130d of the semiconductor dies 130 and the top surface 140a of the insulating encapsulation 140'.

Figure 6:
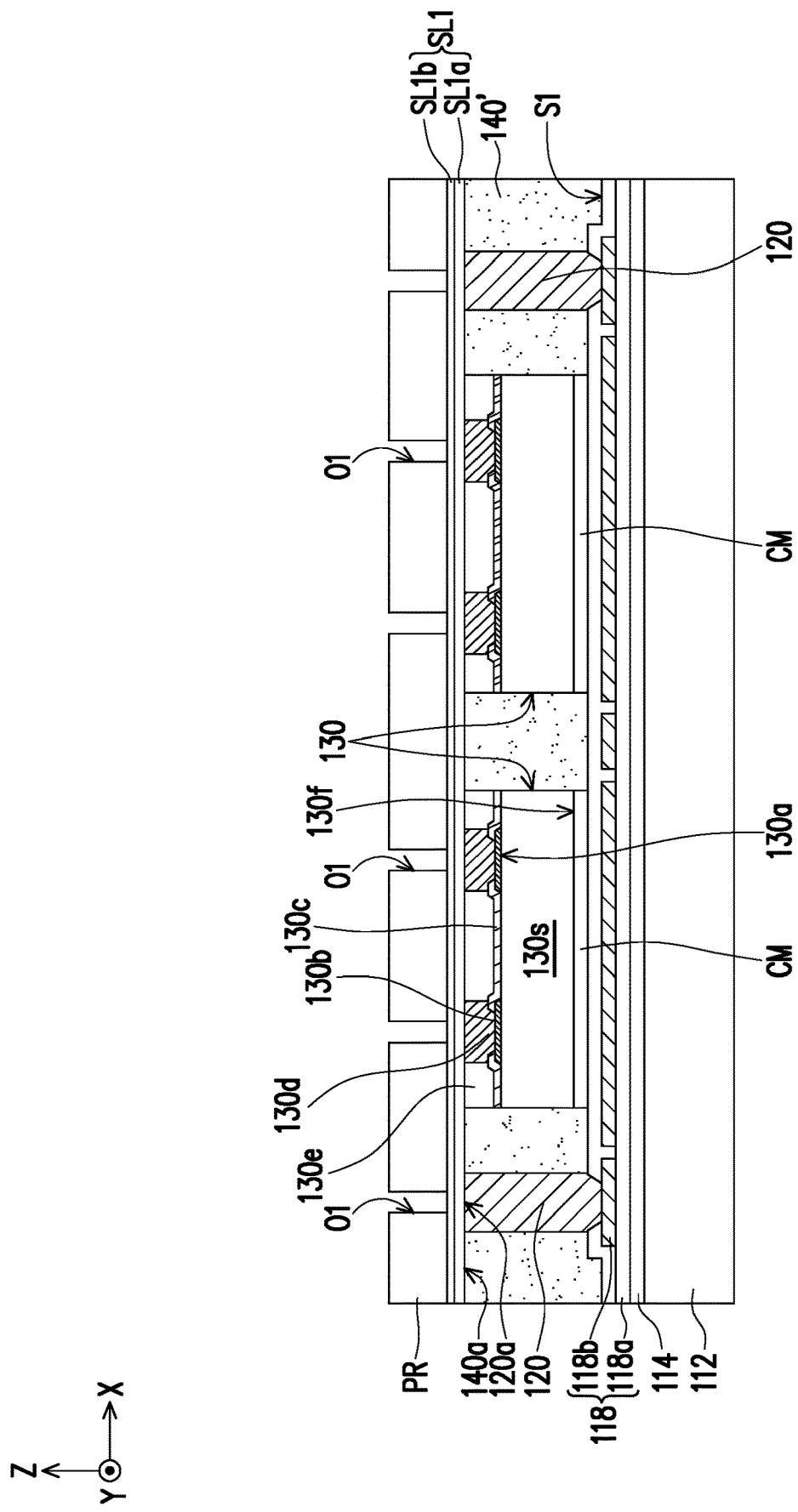

Referring to FIG. 6, in some embodiments, a patterned photoresist layer PR1 is formed on the seed material layer SL1, where the patterned photoresist layer PR1 includes at least one opening O1. In some embodiments, as shown in FIG. 6, a plurality of openings O1 are formed in the patterned photoresist layer PR1. In one embodiment, the patterned photoresist layer PR1 may be formed by coating and photolithography processes or the like. The number and shape of the openings O1 may, for example, correspond to the number and shape of later-formed conductive structure (s) (such as a conductive segment or a conductive trace, a conductive pillar or conductive via). However, the disclosure is not limited thereto. As shown in FIG. 6, portions of the seed material layer SL1 are exposed by the openings O1 formed in the patterned photoresist layer PR1, respectively. In some embodiments, a material of the patterned photoresist layer PR1, for example, includes a positive resist material or a negative resist material, that is suitable for a patterning process such as a photolithography process with a mask or a mask-less photolithography process (for instance, an electron-beam (e-beam) writing or an ion-beam writing).

Figure 7:
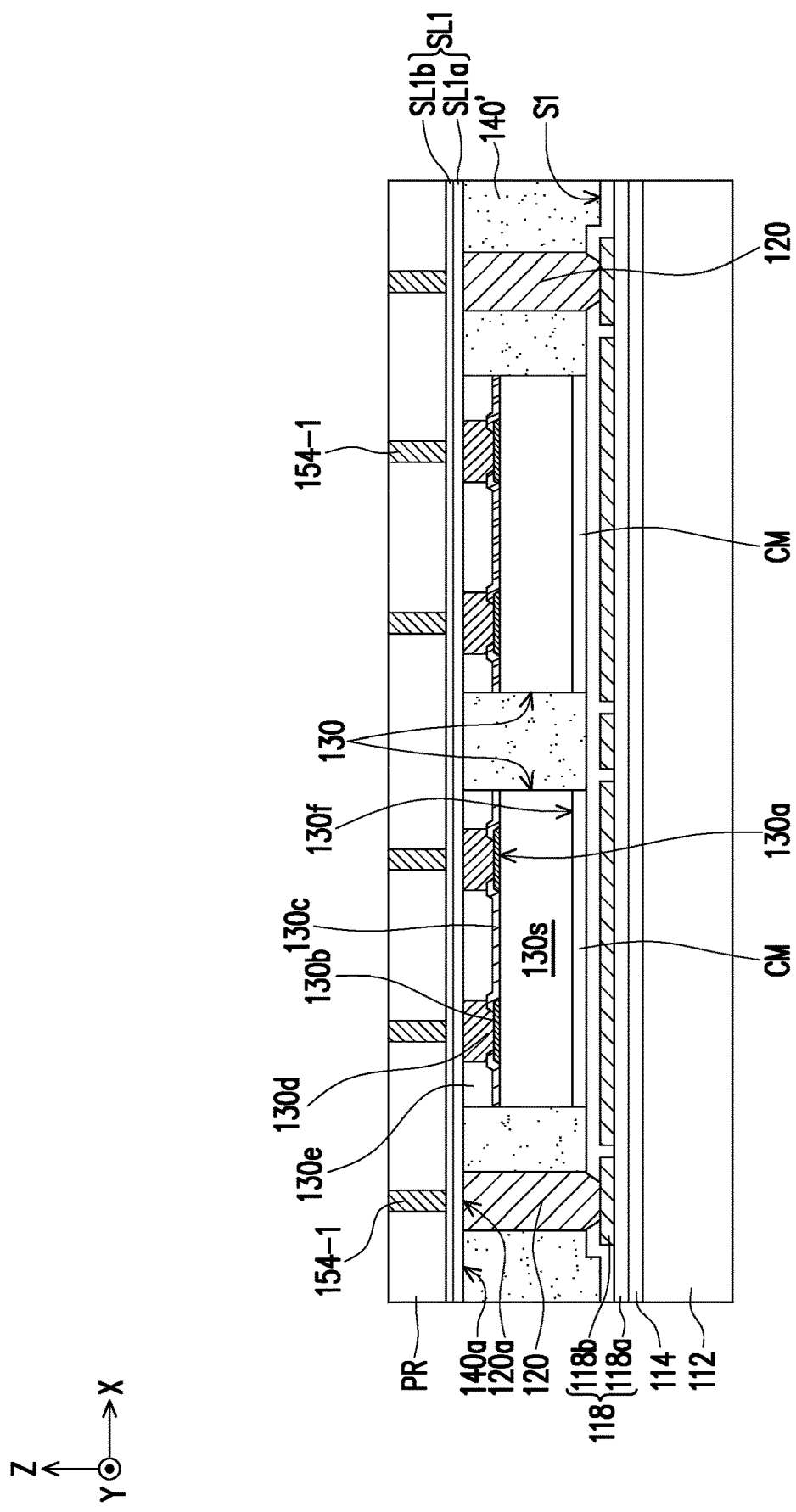

Referring to FIG. 7, in some embodiments, the patterned conductive layer 154-1 is formed on the seed material layer SL1. In some embodiments, the patterned conductive layer 154-1 is formed by plating process, deposition, or any other suitable method, where the plating process may include electroplating or electroless plating, or the like. In one embodiment, a metallic material filling the openings O1 formed in the patterned photoresist layer PR1 is formed by electroplating or deposition to form the patterned conductive layer 154-1. In one embodiment, the material of the patterned conductive layer 154-1 may include a metal material such as copper or copper alloys, or the like. The number of patterns in the patterned conductive layer 154-1 can be selected based on the demand, and adjusted by changing the number and shape of the openings O1. As shown in FIG. 7, the patterned conductive layer 154-1 is located on the seed material layer SL1 and in the openings O1 of the patterned photoresist layer PR1, where the patterned conductive layer 154-1 is in physical and electrical contact with the seed material layer SL1.

Figure 8:
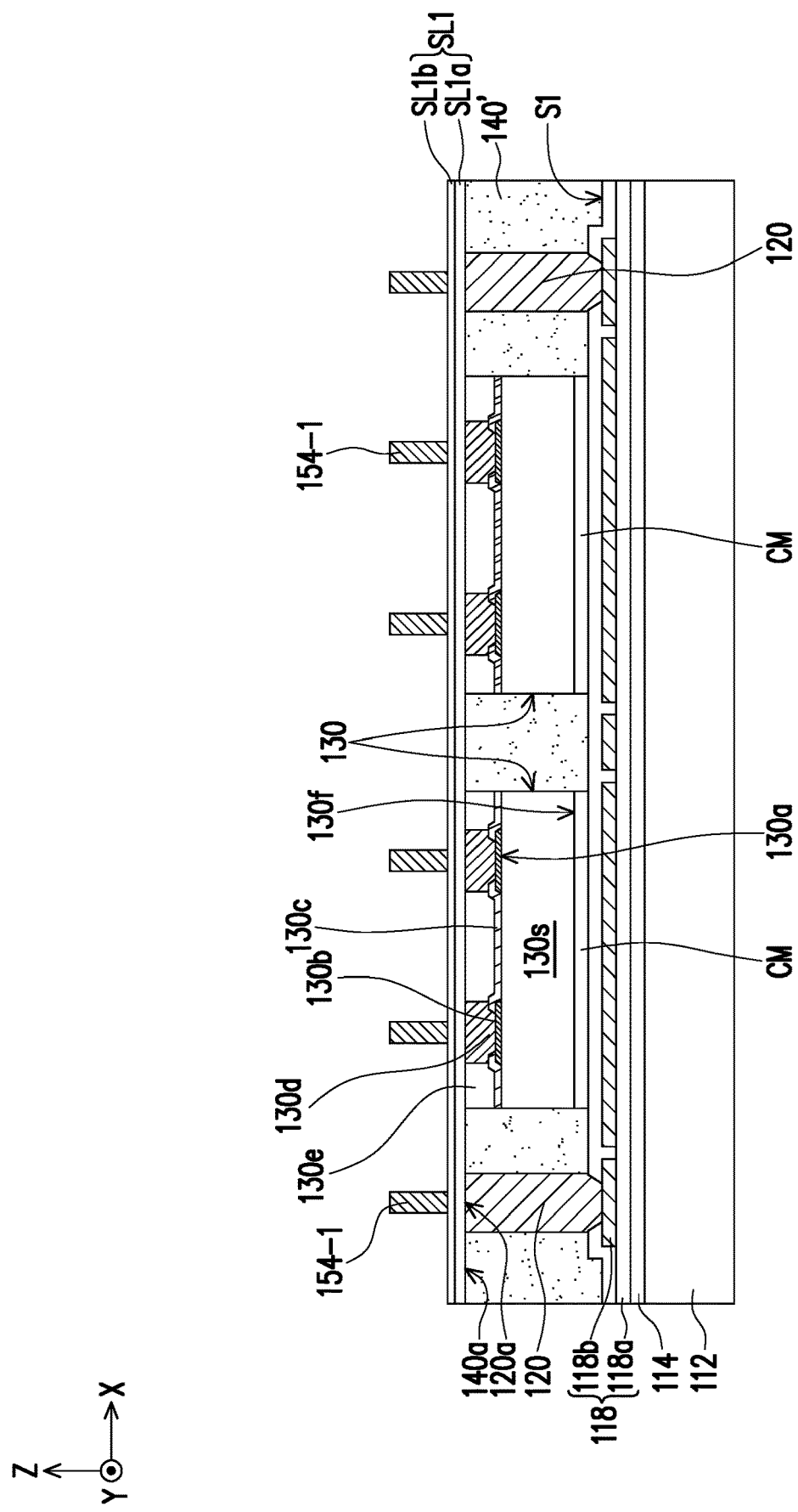

Referring to FIG. 8, in some embodiments, after the patterned conductive layer 154-1 is formed, the patterned photoresist layer PR1 is removed. In one embodiment, the patterned photoresist layer PR1 is removed by acceptable ashing process and/or photoresist stripping process, such as using an oxygen plasma or the like. The disclosure is not limited thereto.

Figure 9:
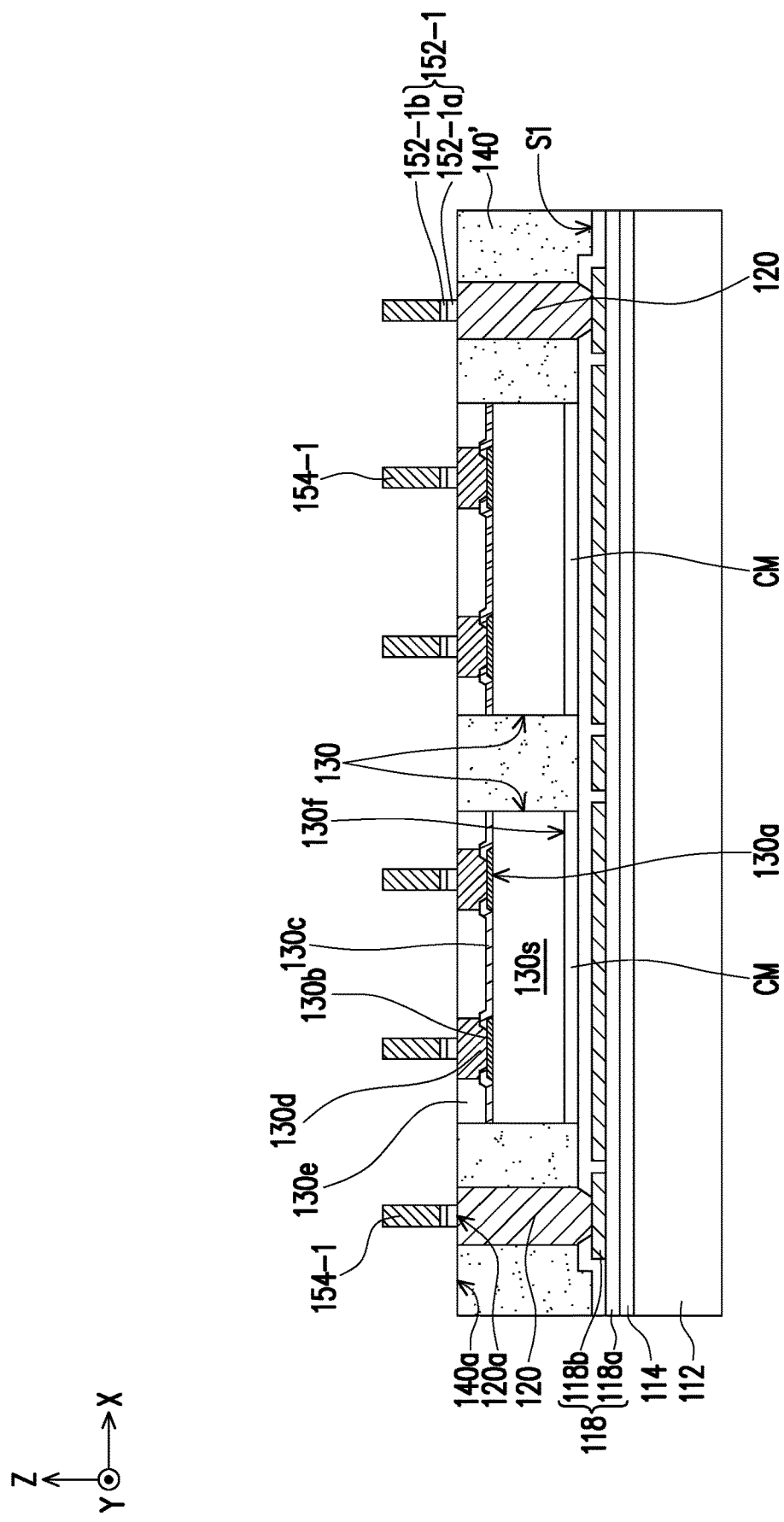

Referring to FIG. 9, in some embodiments, the seed material layer SL1 is patterned to form the seed layer 152-1, where the first seed material layer SL1a is patterned to form a first sub-layer 152-1a and the second seed material layer SL1b is patterned to form a second sub-layer 152-1b. In other words, the first sub-layer 152-1a and the second sub-layer 152-1b are together referred to as the seed layer 152-1. In some embodiments, the seed layer 152-1 and the patterned conductive layer 154-1 together form one or more conductive patterns/features (such as conductive vias or conductive traces) which are mechanically and electrically isolated from one another, where each of the conductive patterns/features includes the seed layer 152-1 (including the first seed material layer SL1a and the second seed material layer SL1b) and the patterned conductive layer 154-1 stacked thereon and electrically connected thereto, for example.

In certain embodiments, portions of the seed material layer SL1 (including the first seed material layer SL1a and the second seed material layer SL1b) not covered by the patterned conductive layer 154-1 are removed to form the seed layer 152-1. In other words, for example, the seed material layer SL1 is etched to form the seed layer 152-1 by using the patterned conductive layer 154-1 as an etching mask. With such, in a vertical projection on the carrier 112 along the stacking direction (e.g. the direction Z) of the redistribution circuit structure 118 and the semiconductor dies 130, a projection area of the patterned conductive layer 154-1 is substantially the same as the projection area of the seed layer 152-1. That is, in direction Z, the patterned conductive layer 154-1 is completely overlapped with the seed layer 152-1 (including the first sub-layer 152-1a and the second sub-layer 152-1b). In some embodiments, sidewalls of one pattern in the seed layer 152-1 are aligned with sidewalls of a respective one pattern in the patterned conductive layer 154-1. For example, the etching process may include a dry etching process or a wet etching process. As shown in FIG. 9, the patterned conductive layer 154-1 is electrically connected to the semiconductor dies 130 through the seed layer 152-1.

Figure 10:
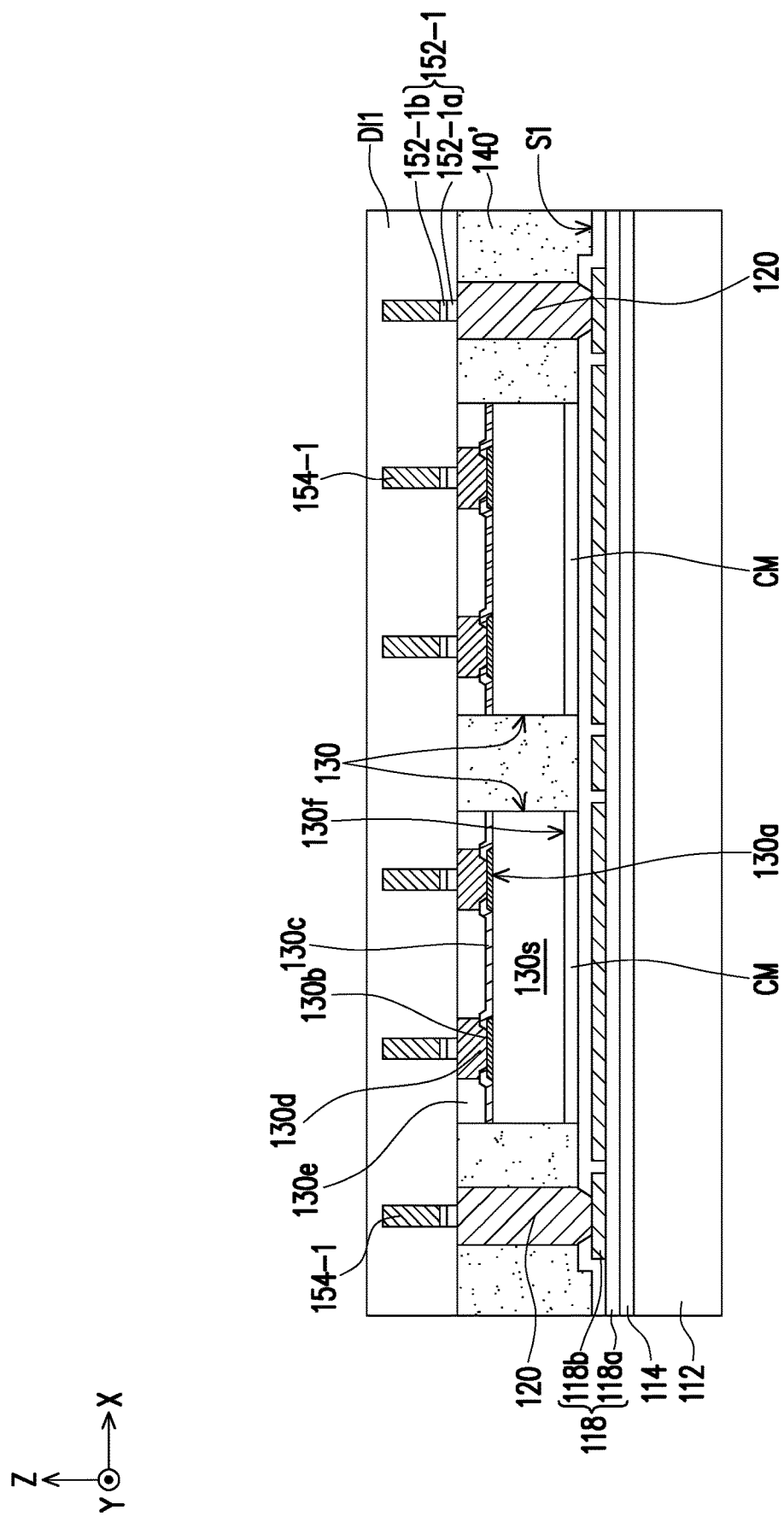

Referring to FIG. 10, in some embodiments, a dielectric material layer DI1 is formed on the patterned conductive layer 154-1 and over the carrier 112. The dielectric material layer DI1 is formed by, but not limited to, forming a blanket layer of dielectric material over the structure depicted in FIG. 9 to completely cover the seed layer 152-1, the patterned conductive layer 154-1, and the semiconductor dies 130 and the insulating encapsulation 140' exposed by the seed layer 152-1 and the patterned conductive layer 154-1. In some embodiments, the material of the dielectric material layer DI1 may be PI, PBO, BCB, a nitride such as silicon nitride, an oxide such as silicon oxide, PSG, BSG, BPSG, a combination thereof or the like. In some embodiments, the dielectric material layer DI1 may be formed by suitable fabrication techniques such as spin-on coating, CVD (e.g. PECVD), or the like. The disclosure is not limited thereto. As shown in FIG. 10, the patterned conductive layer 154-1 is not accessibly revealed by the dielectric material layer DI1.

Figure 11:
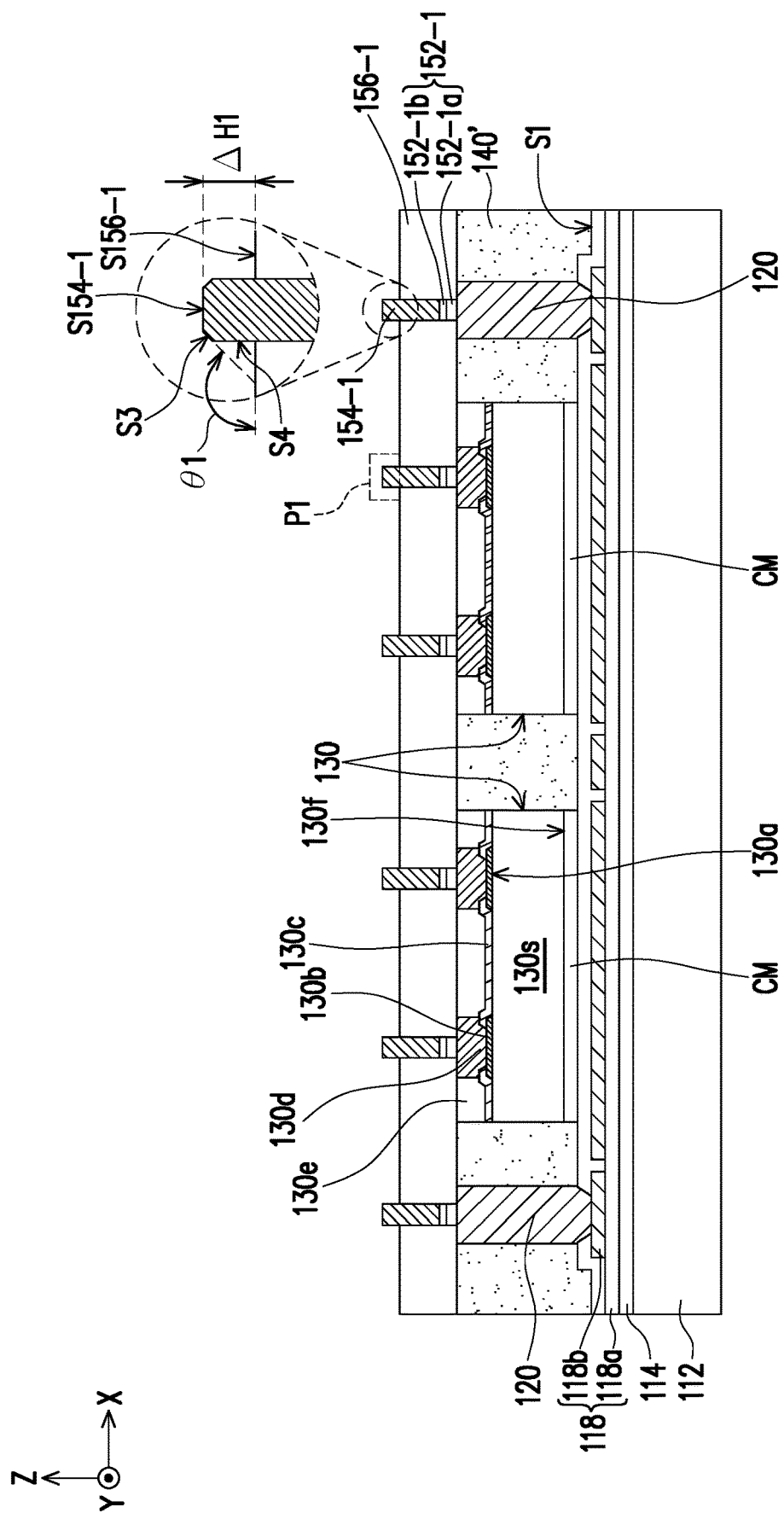

Referring to FIG. 11, in some embodiments, the dielectric material layer DI1 is planarized to form the dielectric layer 156-1 exposing portions P1 of the patterned conductive layer 154-1. In certain embodiments, as shown in FIG. 11, after the planarization, the portions P1 of the patterned conductive layer 154-1 are protruded out of and exposed by the dielectric layer 156-1. In other words, the portions P1 of the patterned conductive layer 154-1 are not in physical contact with the dielectric layer 156-1. In some embodiments, top surfaces S154-1 of the portions P1 of the patterned conductive layer 154-1 are non-coplanar to a top surface S156-1 of the dielectric layer 156-1. In some embodiments, a height difference ΔH1 between the top surfaces S154-1 of the portions P1 of the patterned conductive layer 154-1 and the top surface S156-1 of the dielectric layer 156-1 is approximately ranging from 0.1 μm to 0.7 μm. In other words, the top surfaces S154-1 of the portions P1 of the patterned conductive layer 154-1 and the top surface S156-1 of the dielectric layer 156-1 are misaligned to each other along a direction X perpendicular to the stacking direction Z. In some embodiments, as shown in FIG. 11, the patterned conductive layer 154-1 is accessibly revealed by the dielectric layer 156-1, where the portions P1 of the patterned conductive layer 154-1 are free of the dielectric layer 156-1. In the disclosure, the seed layer 152-1 (including the first sub-layer 152-1a and the second sub-layer 152-1b), the patterned conductive layer 154-1, and the dielectric layer 156-1 are together referred to as a first build-up layer of the redistribution circuit structure 150.

The dielectric material layer DI1 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the dielectric material layer DI1, portions of the portions P1 of the patterned conductive layer 154-1 may also be removed. In certain embodiments, as shown in FIG. 11, each of the portions P1 has the top surface S154-1, a sidewalls S3, and a sidewall S4, where the top surface S154-1 is connected to the sidewall S4 by the sidewalls S3. In some embodiments, an angle θ1 defined by an extending line of the sidewalls S3 of each portion P1 and an extending line of the top surface S156-1 of the dielectric layer 156-1 is approximately ranging from 100° to 140°. Furthermore, due to the angle θ1 (e.g. the presence of the sidewall S3), a contact area between the seed layer 152-2 and the patterned conductive layer 154-1 is increased, thereby significantly suppressing a delamination phenonium occurring at the interface of the seed layer 152-2 and the patterned conductive layer 154-1.

Figure 12:
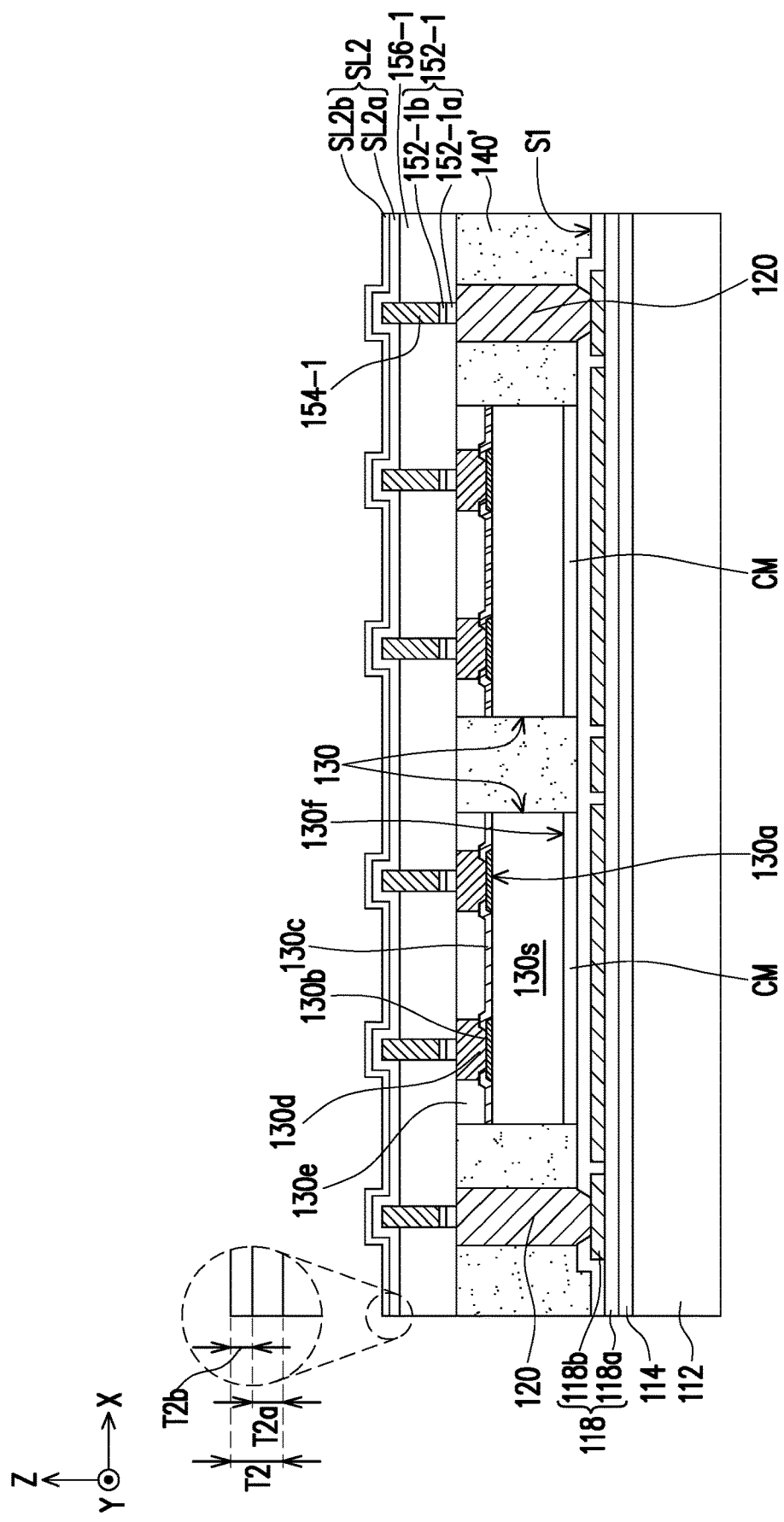

Referring to FIG. 12, in some embodiments, a seed material layer SL2 is disposed on the patterned conductive layer 154-1 and the dielectric layer 156-1. In some embodiments, the seed material layer SL2 is conformally formed on the patterned conductive layer 154-1 and the dielectric layer 156-1 in a form of multiple metal or metal alloy layers. In some embodiments, as shown in FIG. 12, the seed material layer SL2 includes a first seed material layer SL2a and a second seed material layer SL2b stacked on the first seed material layer SL2a along the stacking direction (e.g. the direction Z) of the redistribution circuit structure 118 and the semiconductor dies 130.

As shown in FIG. 12, along the direction Z, a thickness T2a of the first seed material layer SL2a is greater than a thickness T2b of the second seed material layer SL2b, for example. In some embodiments, the thickness T2a of the first seed material layer SL2a approximately ranges from 10 nm to 30 nm. In some embodiments, the thickness T2b of the second seed material layer SL2b approximately ranges from 40 nm to 70 nm. In some embodiments, a ratio of the thickness T2a of the first seed material layer SL2a to the thickness T2b of the second seed material layer SL2b approximately ranges from 1/7 to 3/4. In other words, a thickness of the seed material layer SL2 has a thickness T2, where the thickness T2 is a sum of the thickness T2a of the first seed material layer SL2a and the thickness T2b of the second seed material layer SL2b. For example, the material and formation of the first seed material layer SL2a may the same as the material and formation of the first seed material layer SL1a, the material and formation of the second seed material layer SL2b may the same as the material and formation of the second seed material layer SL1b, and thus are not repeated herein for simplicity. As shown in FIG. 12, in some embodiments, the seed material layer SL2 is in physical and electrical contact with the portions P1 of the patterned conductive layer 154-1.

Figure 13:
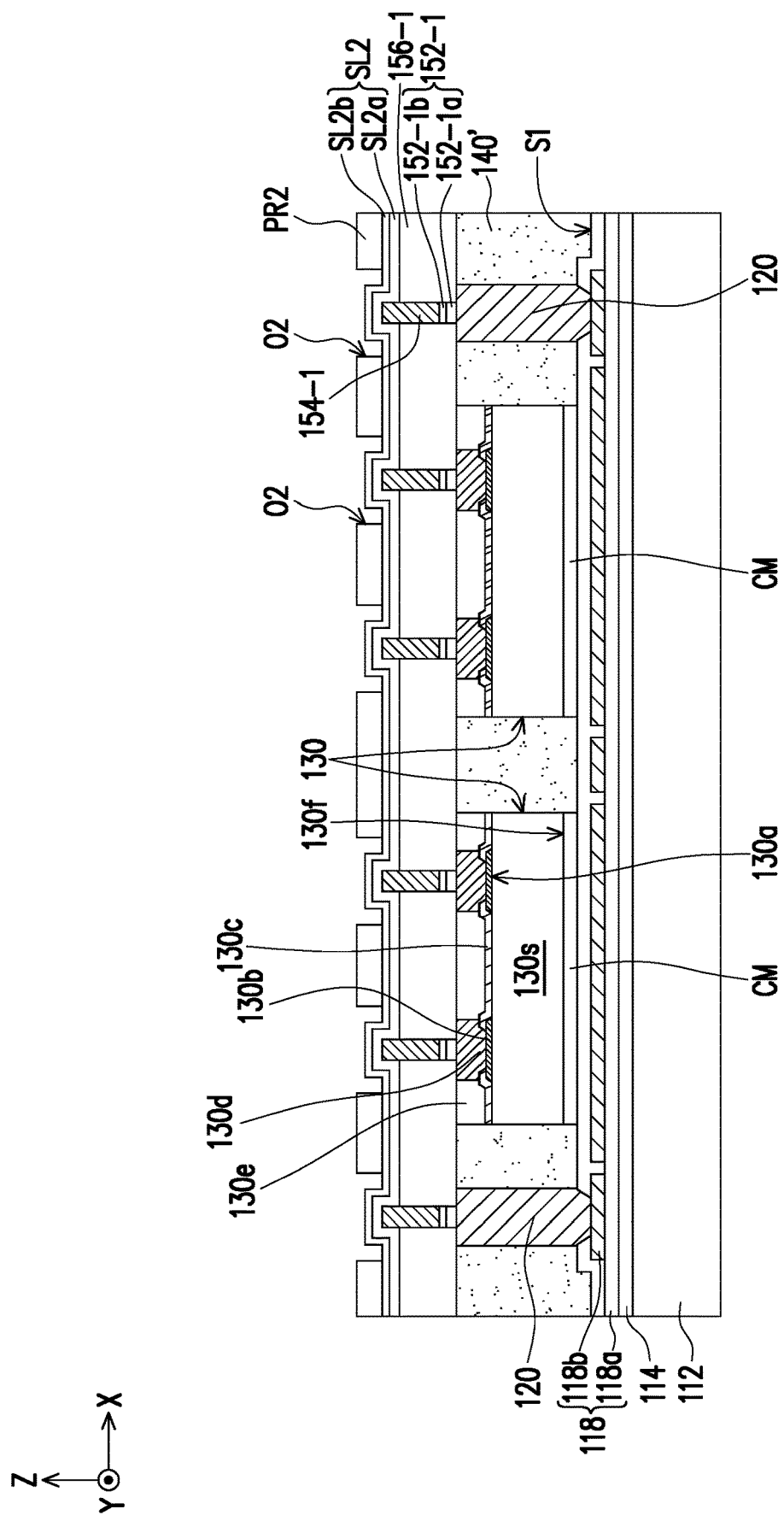

Referring to FIG. 13, in some embodiments, a patterned photoresist layer PR2 is formed on the seed material layer SL2, where the patterned photoresist layer PR2 includes at least one opening O2. For example, as shown in FIG. 13, a plurality of openings O2 are formed in the patterned photoresist layer PR2 to expose portions of the seed material layer SL2. The material and formation of the patterned photoresist layer PR2 may be substantially the same or similar to the material and formation of the patterned photoresist layer PR1, and thus are not repeated herein for simplicity. The number and shape of the openings O2 may, for example, correspond to the number and shape of later-formed conductive structure(s) (such as a conductive segment or a conductive trace, a conductive pillar or conductive via), the disclosure is not limited thereto.

Figure 14:
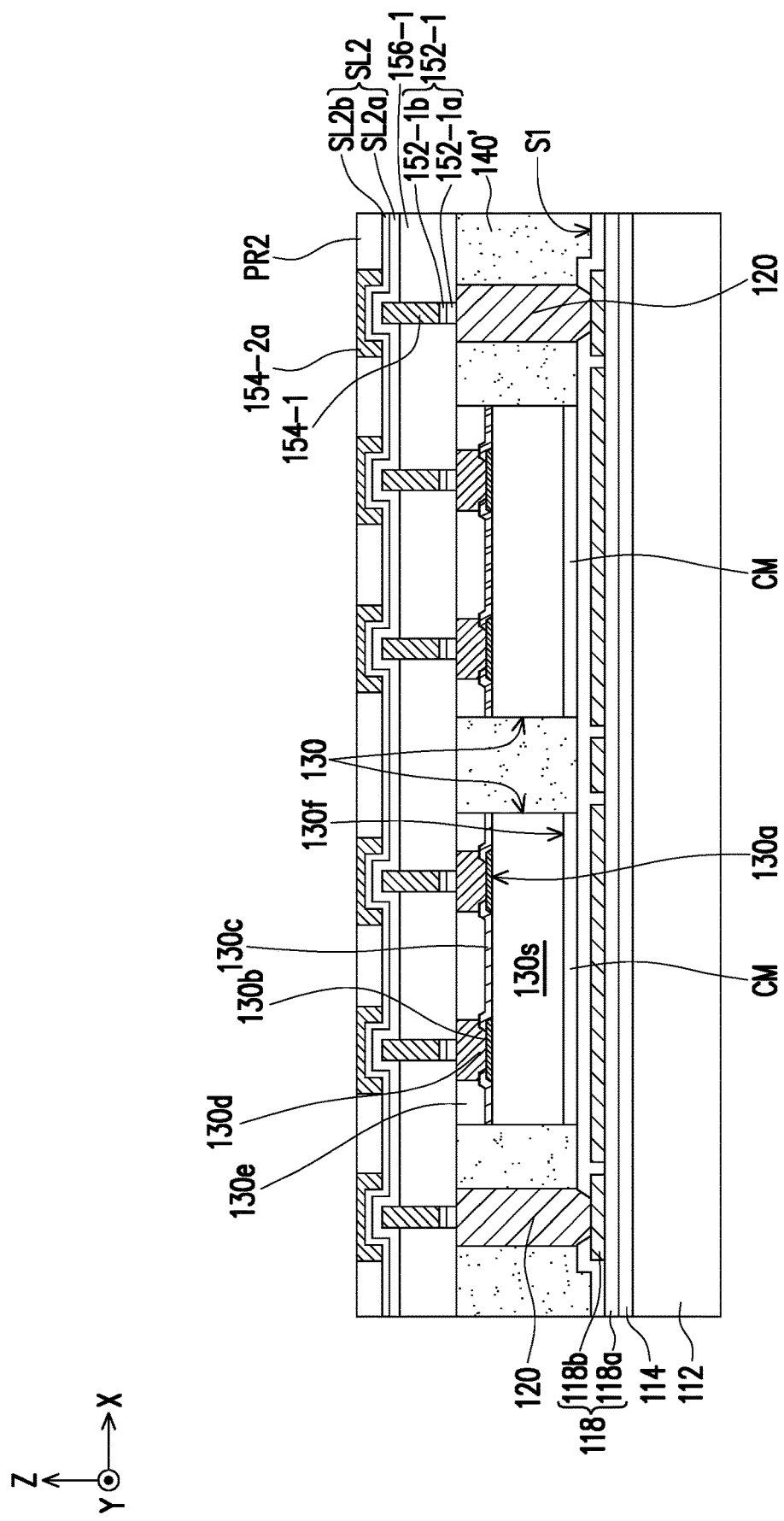

Referring to FIG. 14, in some embodiments, the patterned conductive layer 154-2a is formed on the seed material layer SL2. The material and formation of the patterned conductive layer 154-2a is substantially the same or similar to the material and formation of the patterned conductive layer 154-1, and thus are not repeated herein for simplicity. The number of patterns in the patterned conductive layer 154-2a can be selected based on the demand, and adjusted by changing the number and shape of the openings O2. As shown in FIG. 14, the patterned conductive layer 154-2a is located on the seed material layer SL2 and in the openings O2 of the patterned photoresist layer PR2, where the patterned conductive layer 154-2a is in physical and electrical contact with the seed material layer SL2.

Figure 15:
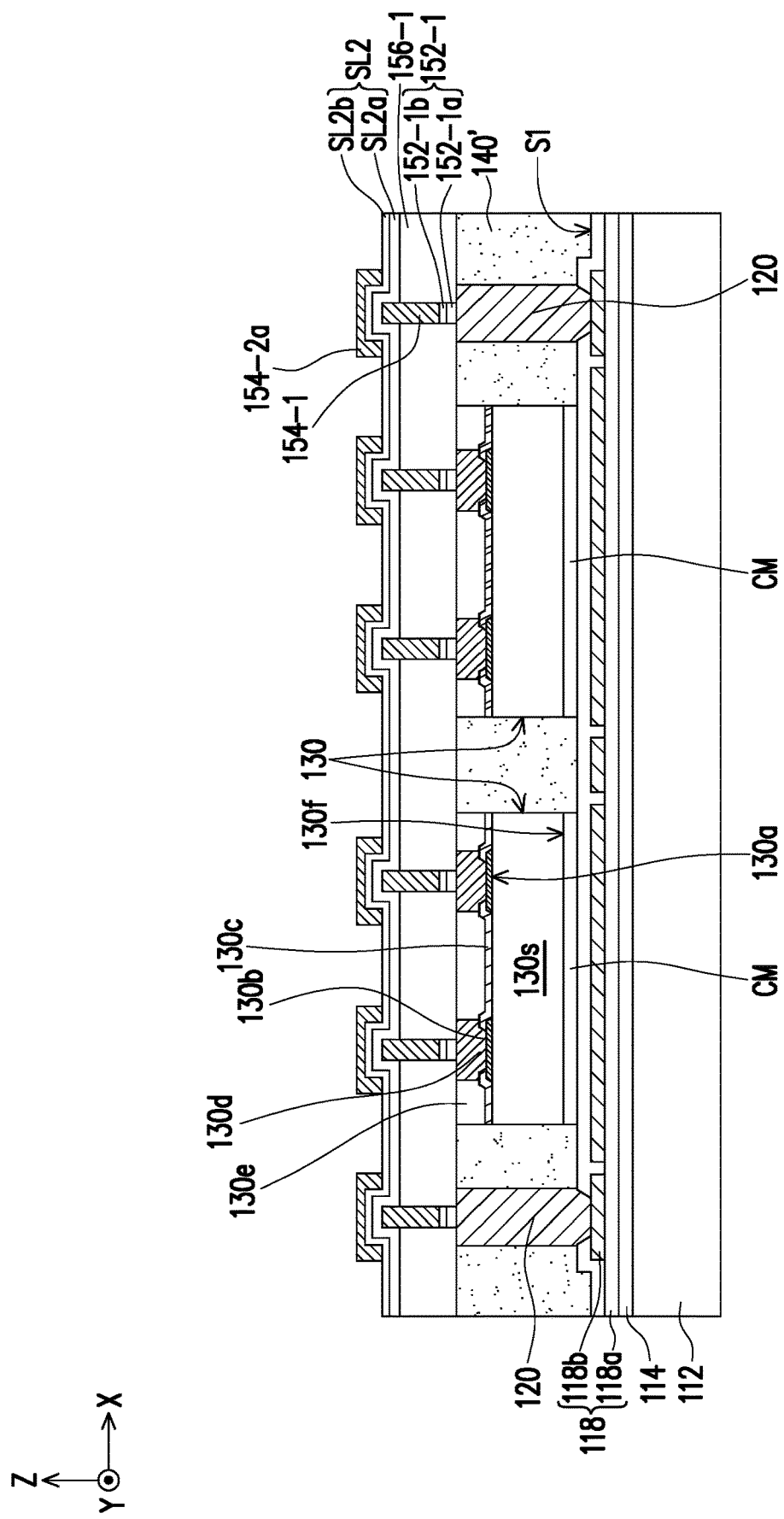

Referring to FIG. 15, in some embodiments, after the patterned conductive layer 154-2a is formed, the patterned photoresist layer PR2 is removed. In one embodiment, the patterned photoresist layer PR2 is removed by acceptable ashing process and/or photoresist stripping process, such as using an oxygen plasma or the like. The disclosure is not limited thereto.

Figure 16:
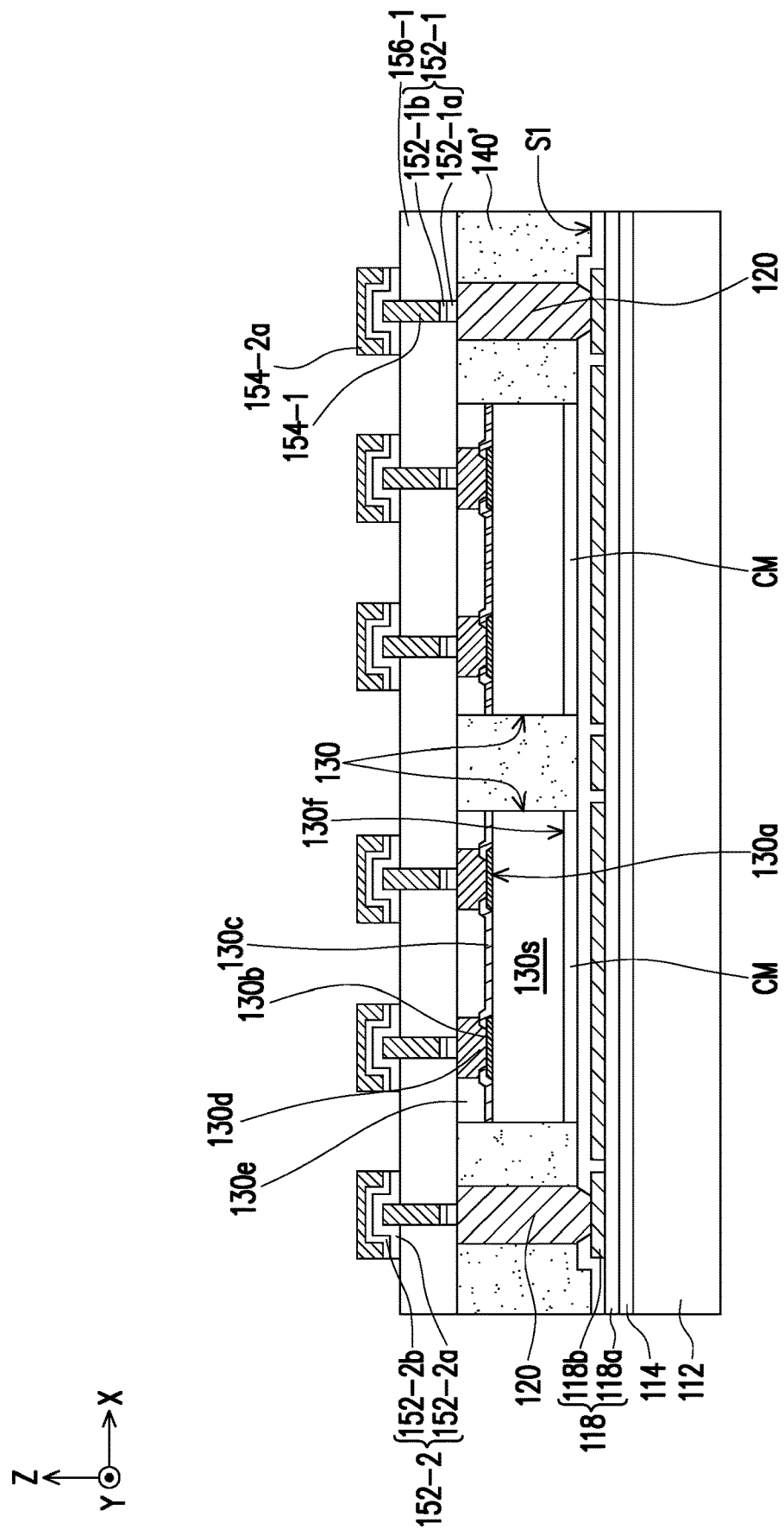

Referring to FIG. 16, in some embodiments, the seed material layer SL2 is patterned to form the seed layer 152-2, where the first seed material layer SL2a is patterned to form a first sub-layer 152-2a and the second seed material layer SL2b is patterned to form a second sub-layer 152-2b. In other words, the first sub-layer 152-2a and the second sub-layer 152-2b are together referred to as the seed layer 152-2. The formation of the seed layer 152-2 (including the first sub-layer 152-2a and the second sub-layer 152-2b) is similar to the formation of the seed layer 152-1 described in FIG. 9, and thus is not repeated herein.

In some embodiments, in a vertical projection on the carrier 112 along the stacking direction (e.g. the direction Z) of the redistribution circuit structure 118 and the semiconductor dies 130, a projection area of the patterned conductive layer 154-2a is substantially the same as the projection area of the seed layer 152-2. That is, in direction Z, the patterned conductive layer 154-2a is completely overlapped with the seed layer 152-2 (including the first sub-layer 152-2a and the second sub-layer 152-2b). In some embodiments, sidewalls of one pattern in the seed layer 152-2 are aligned with sidewalls of a respective one pattern in the patterned conductive layer 154-2a. As shown in FIG. 16, the patterned conductive layer 154-2a is electrically connected to the patterned conductive layer 154-1 through the seed layer 152-2.

Figure 17:
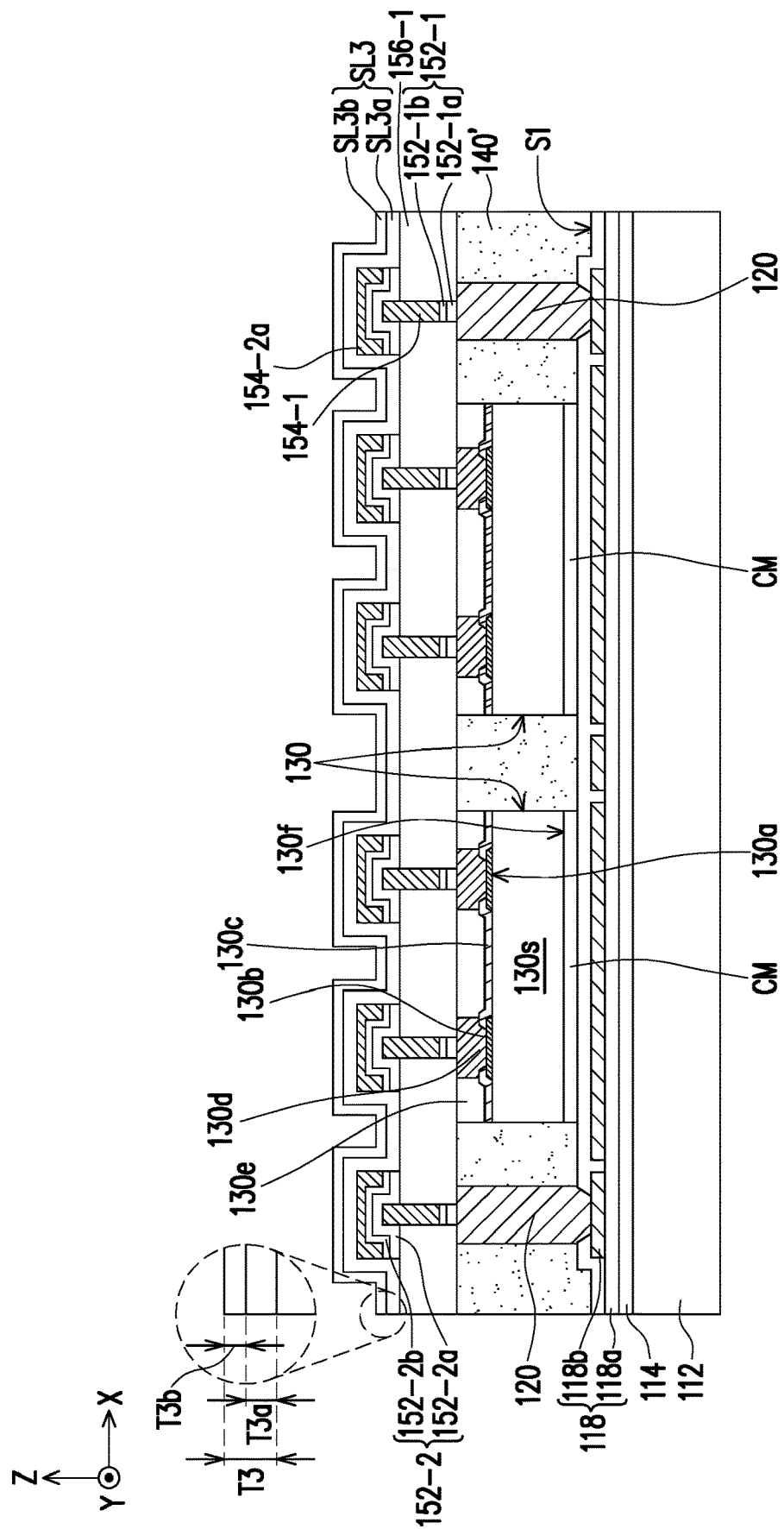

Referring to FIG. 17, in some embodiments, a seed material layer SL3 is disposed on the patterned conductive layer 154-2a, the seed layer 152-2, and the dielectric layer 156-1 exposed by the patterned conductive layer 154-2a and the seed layer 152-2. In some embodiments, the seed material layer SL3 is conformally formed on the patterned conductive layer 154-2a, the seed layer 152-2, and the dielectric layer 156-1 exposed by the patterned conductive layer 154-2a and the seed layer 152-2 in a form of multiple metal or metal alloy layers, where each of the multiple metal or metal alloy layers is a blanket layer of metal or metal alloy materials.

In some embodiments, as shown in FIG. 17, the seed material layer SL3 includes a first seed material layer SL3a and a second seed material layer SL3b stacked on the first seed material layer SL3a along a stacking direction (e.g. a direction Z) of the redistribution circuit structure 118 and the semiconductor dies 130. As shown in FIG. 17, along the direction Z, a thickness T3a of the first seed material layer SL3a is greater than a thickness T3b of the second seed material layer SL3b, for example. In some embodiments, the thickness T3a of the first seed material layer SL3a approximately ranges from 60 nm to 80 nm. In some embodiments, the thickness T3b of the second seed material layer SL3b approximately ranges from 100 nm to 140 nm. In some embodiments, a ratio of the thickness T3a of the first seed material layer SL3a to the thickness T3b of the second seed material layer SL3b approximately ranges from 3/7 to 4/5. In other words, a thickness of the seed material layer SL3 has a thickness T3, where the thickness T3 is a sum of the thickness T3a of the first seed material layer SL3a and the thickness T3b of the second seed material layer SL3b.

For example, the material and formation of the first seed material layer SL3a are substantially the same or similar to the materials and formations of the first seed material layer SL1a, SL2a, and the material and formation of the second seed material layer SL3b are substantially the same or similar to the materials and formations of the second seed material layer SL1b, SL2b, and thus are not repeated herein. As shown in FIG. 17, in some embodiments, the seed material layer SL3 is in physical and electrical contact with the patterned conductive layer 154-2a and the seed layer 152-2.

Figure 18:
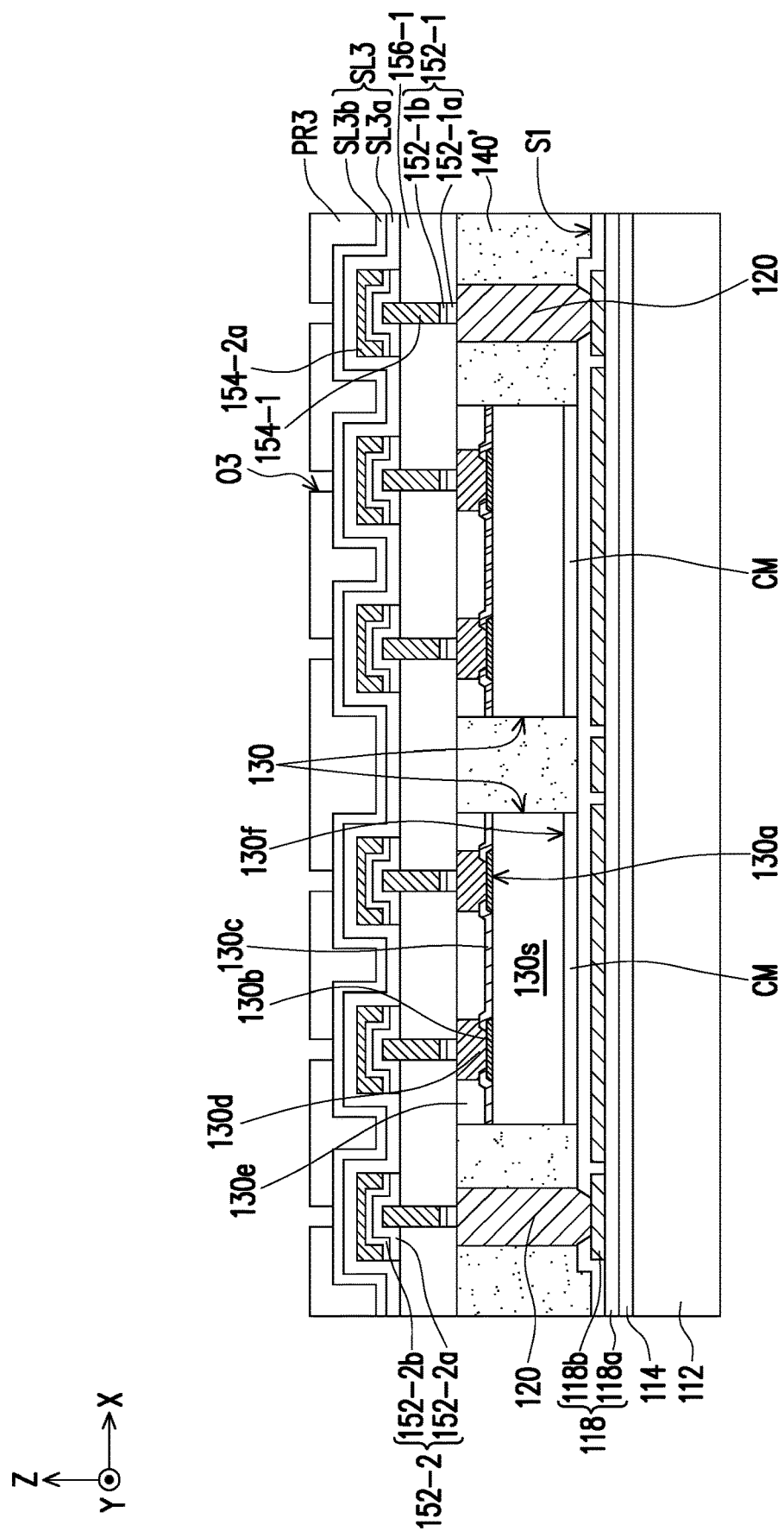

Referring to FIG. 18, in some embodiments, a patterned photoresist layer PR3 is formed on the seed material layer SL3, where the patterned photoresist layer PR3 includes at least one opening O3. For example, as shown in FIG. 18, a plurality of openings O3 are formed in the patterned photoresist layer PR3 to expose portions of the seed material layer SL3. The material and formation of the patterned photoresist layer PR3 may be substantially the same or similar to the materials and formations of the patterned photoresist layers PR1 and/or PR2, and thus are not repeated herein for simplicity. The number and shape of the openings O3 may, for example, correspond to the number and shape of later-formed conductive structure(s) (such as a conductive segment or a conductive trace, a conductive pillar or conductive via), the disclosure is not limited thereto.

Figure 19:
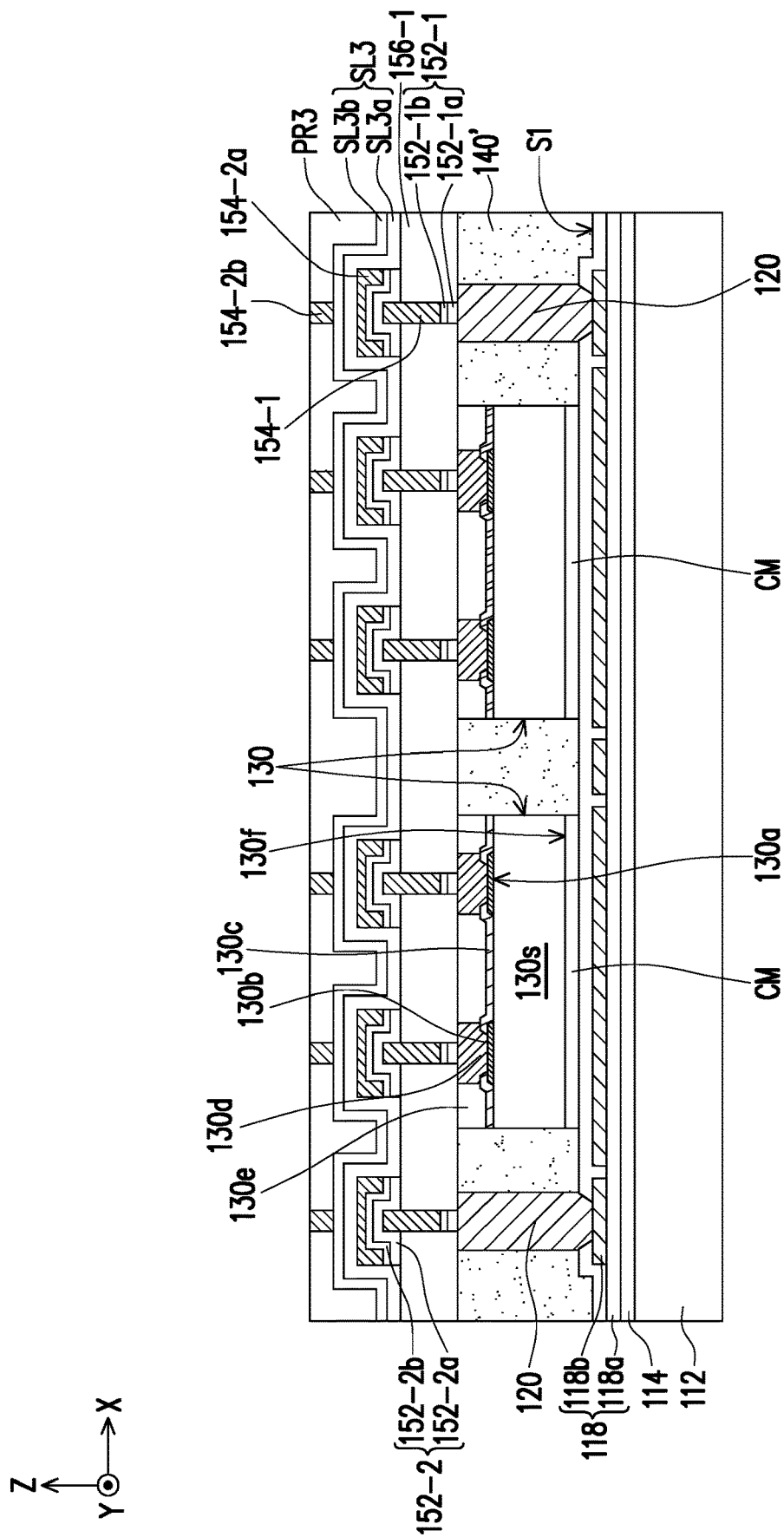

Referring to FIG. 19, in some embodiments, the patterned conductive layer 154-2b is formed on the seed material layer SL3. The material and formation of the patterned conductive layer 154-2b is substantially the same or similar to the materials and formations of the patterned conductive layers 154-1 and/or 154-2a, and thus are not repeated herein. The number and shape of patterns in the patterned conductive layer 154-2b can be selected based on the demand, and adjusted by changing the number and shape of the openings O3. As shown in FIG. 19, the patterned conductive layer 154-2b is located on the seed material layer SL3 and in the openings O3 of the patterned photoresist layer PR3, where the patterned conductive layer 154-2b is in physical and electrical contact with the seed material layer SL3.

Figure 20:
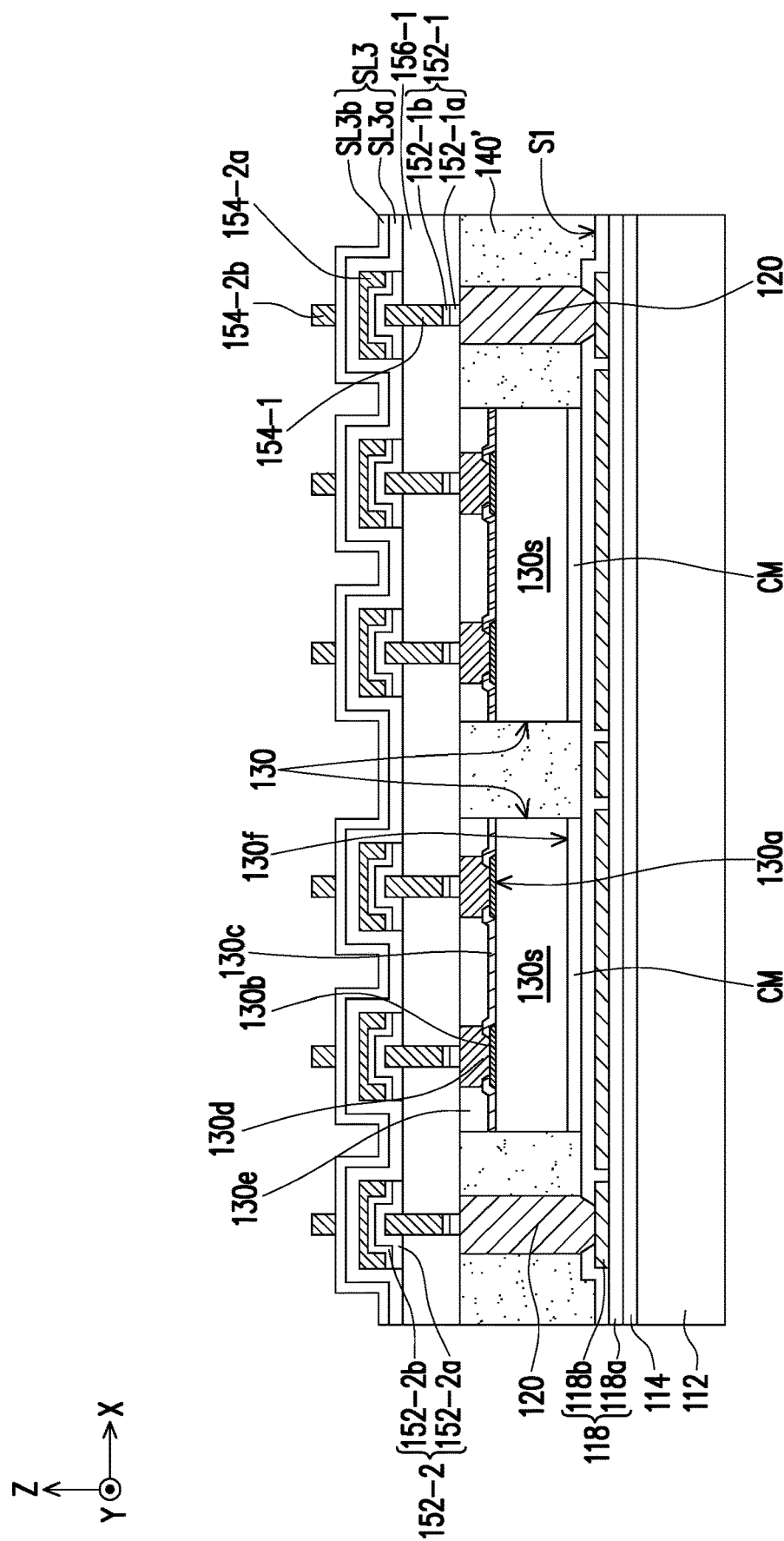

Referring to FIG. 20, in some embodiments, after the patterned conductive layer 154-2b is formed, the patterned photoresist layer PR3 is removed. In one embodiment, the patterned photoresist layer PR3 is removed by acceptable ashing process and/or photoresist stripping process, such as using an oxygen plasma or the like. The disclosure is not limited thereto.

Figure 21:
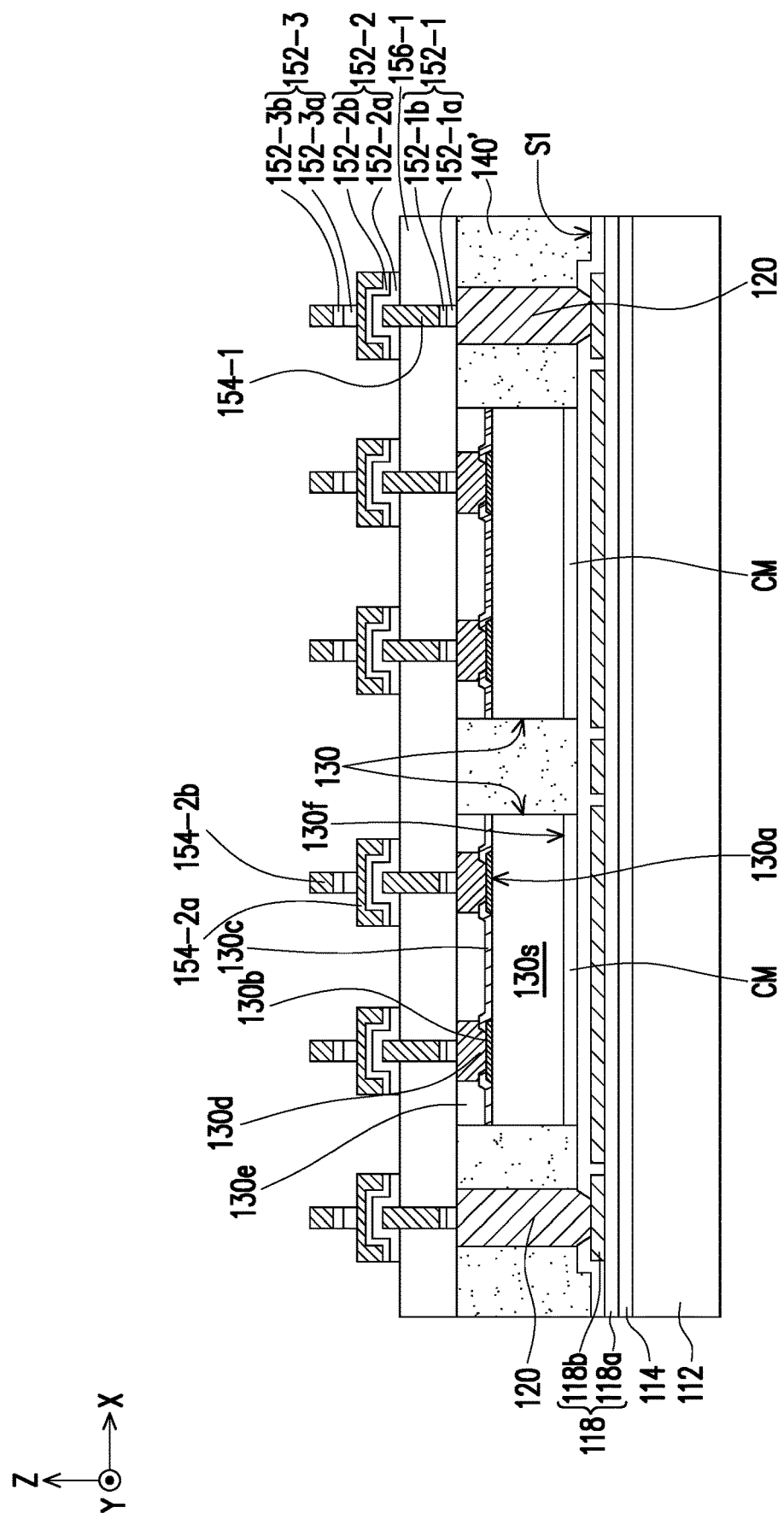

Referring to FIG. 21, in some embodiments, the seed material layer SL3 is patterned to form the seed layer 152-3, where the first seed material layer SL3a is patterned to form a first sub-layer 152-3a and the second seed material layer SL3b is patterned to form a second sub-layer 152-3b. In other words, the first sub-layer 152-3a and the second sub-layer 152-3b are together referred to as the seed layer 152-3. The formation of the seed layer 152-3 (including the first sub-layer 152-3a and the second sub-layer 152-3b) is similar to the formation of the seed layer 152-1 described in FIG. 9, and thus is not repeated herein for simplicity.

In some embodiments, in a vertical projection on the carrier 112 along the stacking direction (e.g. the direction Z) of the redistribution circuit structure 118 and the semiconductor dies 130, a projection area of the patterned conductive layer 154-2b is substantially the same as the projection area of the seed layer 152-3. That is, in direction Z, the patterned conductive layer 154-2b is completely overlapped with the seed layer 152-3 (including the first sub-layer 152-3a and the second sub-layer 152-3b). In some embodiments, sidewalls of one pattern in the seed layer 152-3 are aligned with sidewalls of a respective one pattern in the patterned conductive layer 154-2b. As shown in FIG. 21, the patterned conductive layer 154-2b is electrically connected to the patterned conductive layer 154-2a through the seed layer 152-3. In some embodiments, the seed layer 152-2, the patterned conductive layer 154-2a, the seed layer 152-3, and the patterned conductive layer 154-2b together form one or more conductive patterns/features (such as conductive vias or conductive traces) which are mechanically and electrically isolated from one another, for example.

Figure 22:
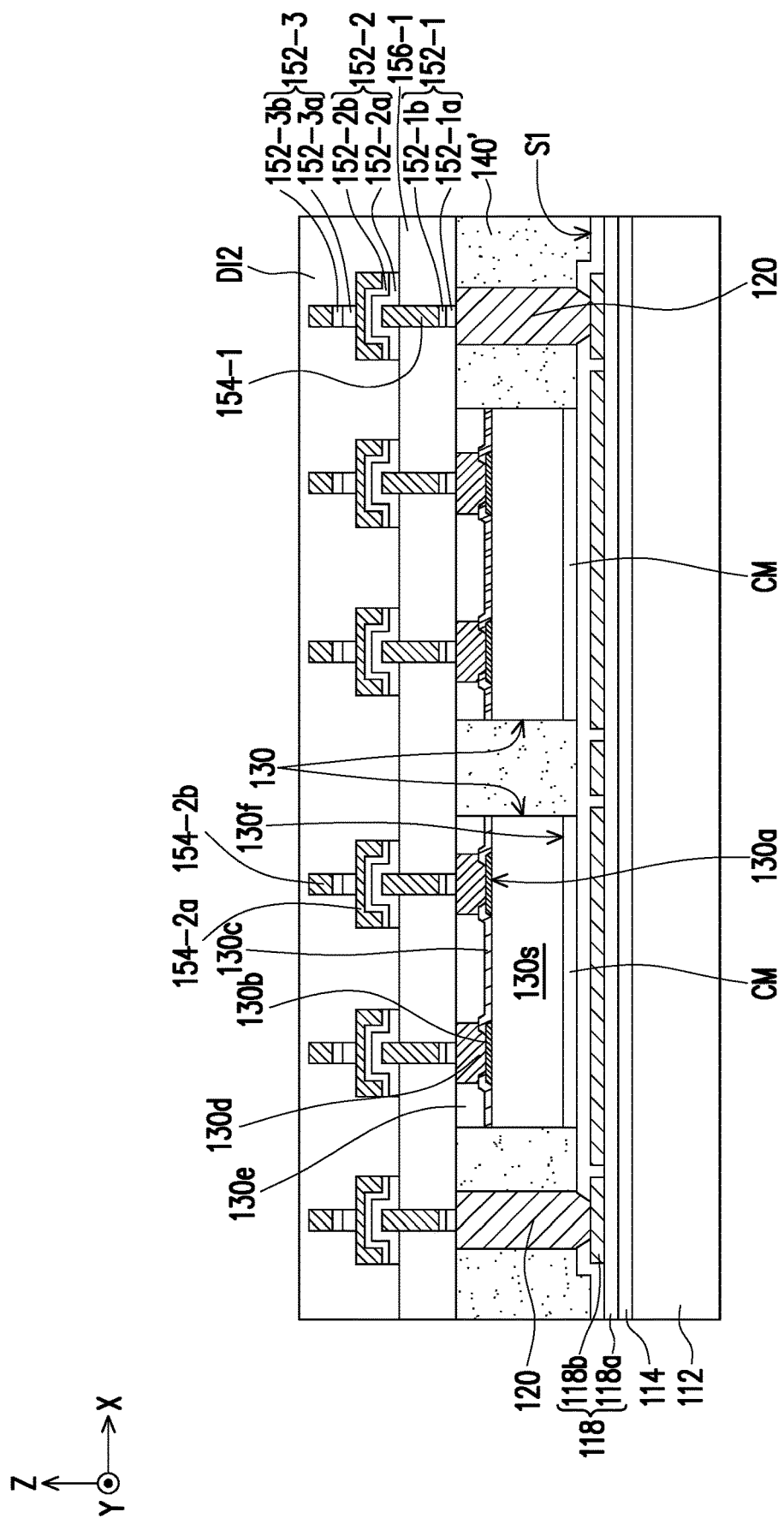

Referring to FIG. 22, in some embodiments, a dielectric material layer DI2 is formed on the patterned conductive layers 154-2a, 154-2b and over the carrier 112. The dielectric material layer DI2 is formed by, but not limited to, forming a blanket layer of dielectric material over the structure depicted in FIG. 21 to completely cover the seed layer 152-2, the patterned conductive layer 154-2a, the seed layer 152-3, the patterned conductive layer 154-2b, and the dielectric layer 156-1 exposed by the seed layer 152-2, the patterned conductive layer 154-2a, the seed layer 152-3, and the patterned conductive layer 154-2b. In some embodiments, the material and formation of the dielectric material layer DI2 may be substantially the same or similar to the material and formation of the dielectric material layer DI1, and thus is not repeated herein. As shown in FIG. 22, the seed layer 152-2, the patterned conductive layer 154-2a, the seed layer 152-3, the patterned conductive layer 154-2b, and the dielectric layer 156-1 is not accessibly revealed by the dielectric material layer DI2.

Figure 23:
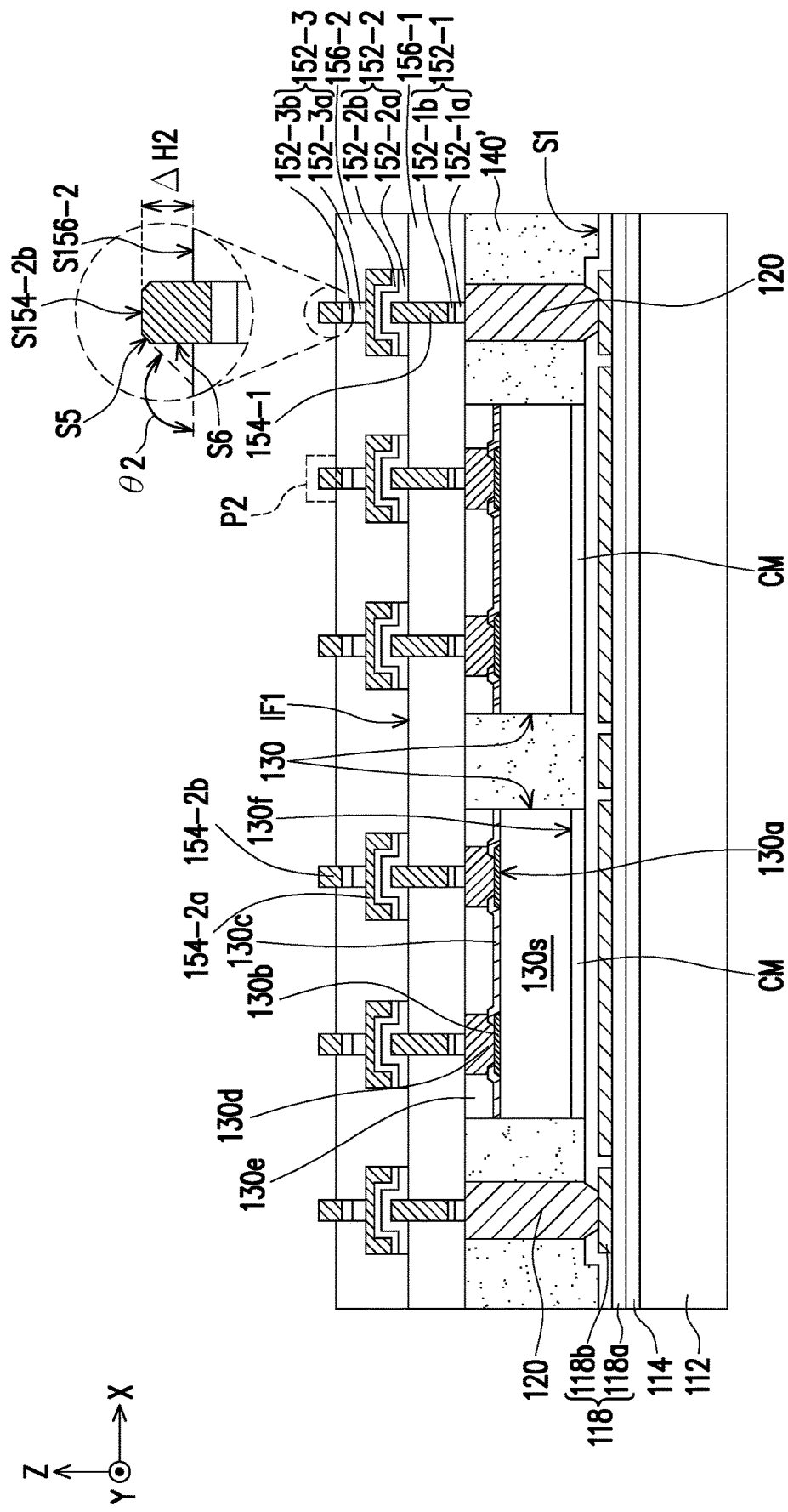

Referring to FIG. 23, in some embodiments, the dielectric material layer DI2 is planarized to form the dielectric layer 156-2 exposing portions P2 of the patterned conductive layer 154-2b. The planarizing process is similar to the planarizing process described in FIG. 11, and thus is not repeated herein for simplicity. In certain embodiments, as shown in FIG. 23, after the planarization, the portions P2 of the patterned conductive layer 154-2b are protruded out of and exposed by the dielectric layer 156-2. In other words, the portions P2 of the patterned conductive layer 154-2b are not in physical contact with the dielectric layer 156-2. In some embodiments, top surfaces S154-2b of the portions P2 of the patterned conductive layer 154-2b are non-coplanar to a top surface S156-2 of the dielectric layer 156-2. In some embodiments, a height difference ΔH2 between the top surfaces S154-2b of the portions P2 of the patterned conductive layer 154-2 and the top surface S156-2 of the dielectric layer 156-2 is approximately ranging from 0.1 μm to 0.7 μm. In other words, the top surfaces S154-2b of the portions P2 of the patterned conductive layer 154-2 and the top surface S156-2 of the dielectric layer 156-2 are misaligned to each other along a direction X perpendicular to the stacking direction Z. In some embodiments, as shown in FIG. 23, the patterned conductive layer 154-2b is accessibly revealed by the dielectric layer 156-2, where the portions P2 of the patterned conductive layer 154-2b are free of the dielectric layer 156-2. In the disclosure, the seed layer 152-2 (including the first sub-layer 152-2a and the second sub-layer 152-2b), the patterned conductive layer 154-2a, the seed layer 152-3 (including the first sub-layer 152-3a and the second sub-layer 152-3b), the patterned conductive layer 154-2b, and the dielectric layer 156-2 are together referred to as a second build-up layer of the redistribution circuit structure 150. In some embodiments, as shown in FIG. 23, an interface IF1 of the dielectric layer 156-1 and the dielectric layer 156-2 is located at a sidewall of the patterned conductive layer 154-1.

In some embodiments, during planarizing the dielectric material layer DI2, portions of the portions P2 of the patterned conductive layer 154-2b may also be removed. In certain embodiments, as shown in FIG. 23, each of the portions P2 has the top surface S154-2b, a sidewalls S5, and a sidewall S6, where the top surface S154-2b is connected to the sidewall S6 by the sidewalls S5. In some embodiments, an angle θ2 defined by an extending line of the sidewalls S5 of each portion P2 and an extending line of the top surface S156-2 of the dielectric layer 156-2 is approximately ranging from 100° to 140°. Furthermore, due to the angle θ2 (e.g. the presence of the sidewall S5), a contact area between the seed layer 152-4 and the patterned conductive layer 154-2b is increased, thereby significantly suppressing a delamination phenonium occurring at the interface of the seed layer 152-4 and the patterned conductive layer 154-2b.

Figure 24:
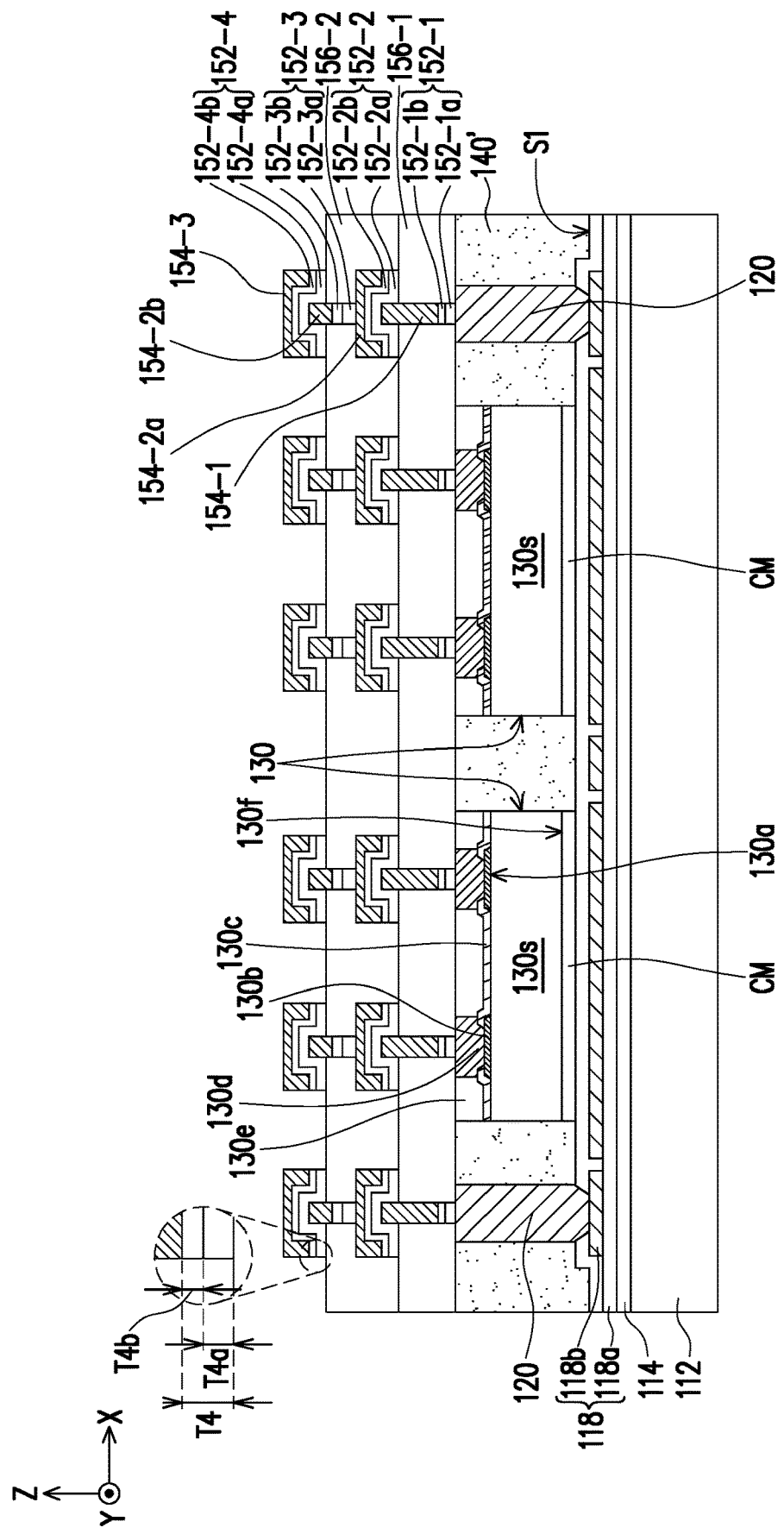

Referring to FIG. 24, in some embodiments, a seed layer 152-4 and a patterned conductive layer 154-3 are sequentially formed on the dielectric layer 156-2 and the patterned conductive layer 154-2b exposed by the dielectric layer 156-2. In some embodiments, the seed layer 152-4 and the patterned conductive layer 154-3 together form one or more conductive patterns/features (such as conductive vias or conductive traces) which are mechanically and electrically isolated from one another, where each of the conductive patterns/features includes the seed layer 152-4 and the patterned conductive layer 154-3 stacked thereon and electrically connected thereto, for example. The material and formation of the seed layer 152-4 is substantially the same or similar to the materials and formations of the seed layers 152-1, 152-2, and/or 152-3, and the material and formation of the patterned conductive layer 154-3 is substantially the same or similar to the materials and formations of the patterned conductive layers 154-1, 154-2a, and/or 154-2b, and thus are not repeated therein.

As shown in FIG. 24, for example, the seed layer 152-4 is in physical and electrical contact with the patterned conductive layer 154-2b, where the seed layer 152-4 includes a first sub-layer 152-4a and the second sub-layer 152-4b, and the first sub-layer 152-4a is sandwiched between the patterned conductive layer 154-2b and the second sub-layer 152-4b. In some embodiments, in a vertical projection on the carrier 112 along the stacking direction (e.g. the direction Z) of the redistribution circuit structure 118 and the semiconductor dies 130, a projection area of the patterned conductive layer 154-3 is substantially the same as the projection area of the seed layer 152-4. That is, in direction Z, the patterned conductive layer 154-3 is completely overlapped with the seed layer 152-4 (including the first sub-layer 152-4a and the second sub-layer 152-4b). In some embodiments, sidewalls of one pattern in the seed layer 152-4 are aligned with sidewalls of a respective one pattern in the patterned conductive layer 154-3. As shown in FIG. 24, the patterned conductive layer 154-3 is electrically connected to the patterned conductive layer 154-2b through the seed layer 152-4.

For example, the material of the first sub-layer 152-4a is substantially the same or similar to the materials of the first sub-layers 152-1a, 152-2a, and/or 152-3a, and the material of the second sub-layer 152-4b is substantially the same or similar to the materials of the second sub-layers 152-1b, 152-2b, and/or 152-3. In some embodiments, the thickness T4a of the first sub-layer 152-4a approximately ranges from 10 nm to 30 nm. In some embodiments, the thickness T4b of the second sub-layer 152-4b approximately ranges from 40 nm to 70 nm. In some embodiments, a ratio of the thickness T4a of the first sub-layer 152-4a to the thickness T4b of the second sub-layer 152-4b approximately ranges from 1/7 to 3/4. In other words, a thickness of the seed layer 152-4 has a thickness T4, where the thickness T4 is a sum of the thickness T4a of the first sub-layer 152-4a and the thickness T4b of the second sub-layer 152-4b.

Figure 25:
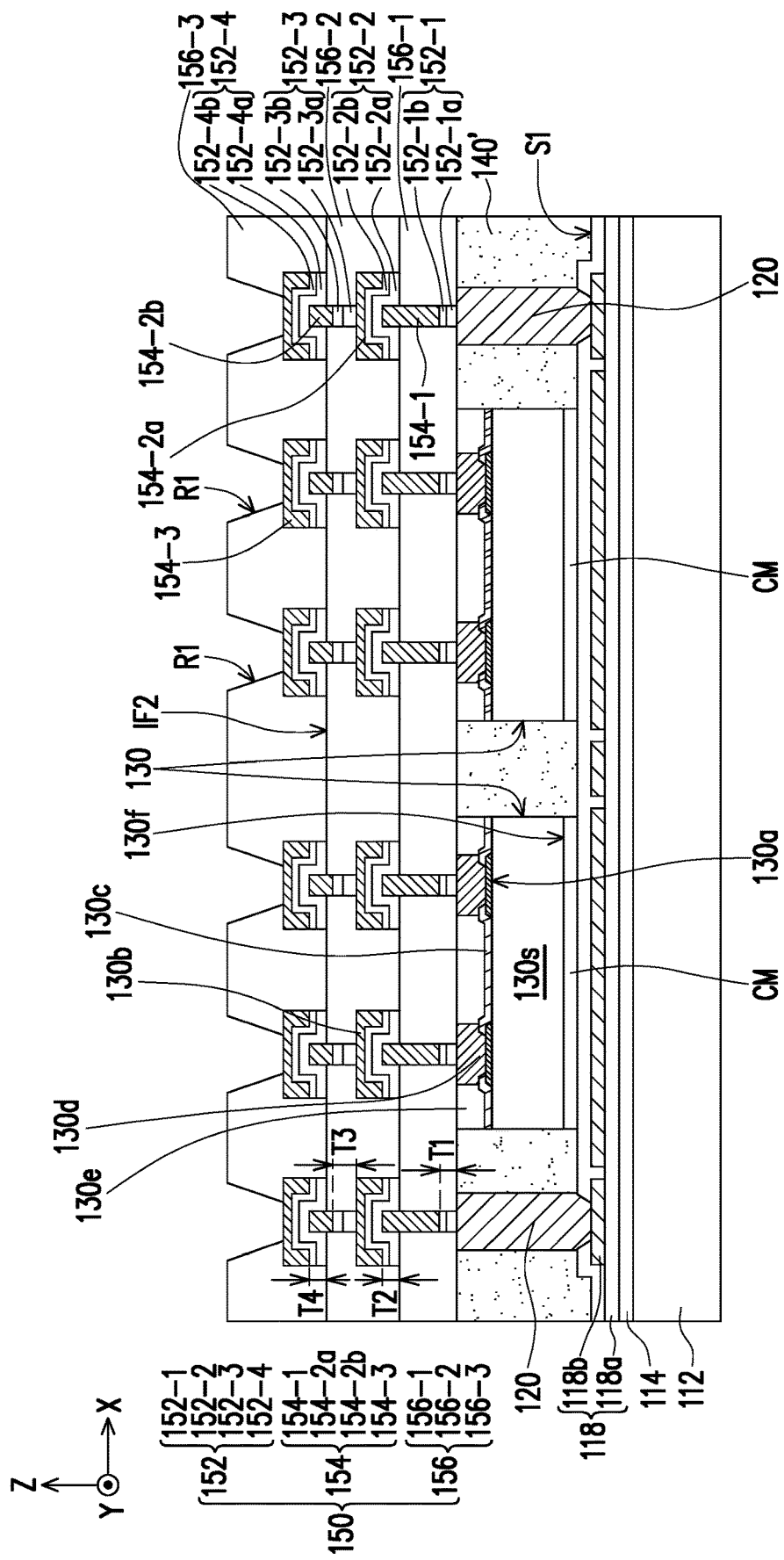

Referring to FIG. 25, in some embodiments, the dielectric layer 156-3 is formed on the patterned conductive layer 154-3 and over the carrier 112. The dielectric layer 156-3 is formed with a plurality of recesses R1 exposing portions of the patterned conductive layer 154-3, for example. In some embodiments, the material of the dielectric layer 156-3 may be PI, PBO, BCB, a nitride such as silicon nitride, an oxide such as silicon oxide, PSG, BSG, BPSG, a combination thereof or the like. In some embodiments, the dielectric layer 156-3 may be formed by suitable fabrication techniques such as spin-on coating, deposition along with a patterning process (such as photolithograph and etching steps), or the like. The disclosure is not limited thereto. In the disclosure, the seed layer 152-4 (including the first sub-layer 152-4a and the second sub-layer 152-4b), the patterned conductive layer 154-3, and the dielectric layer 156-3 are together referred to as a third build-up layer of the redistribution circuit structure 150. In some embodiments, as shown in FIG. 25, an interface IF2 of the dielectric layer 156-2 and the dielectric layer 156-3 is located at a sidewall of the patterned conductive layer 154-2b. Upon this, the redistribution circuit structure 150 of the package structure PS1 is manufactured.

Figure 39:
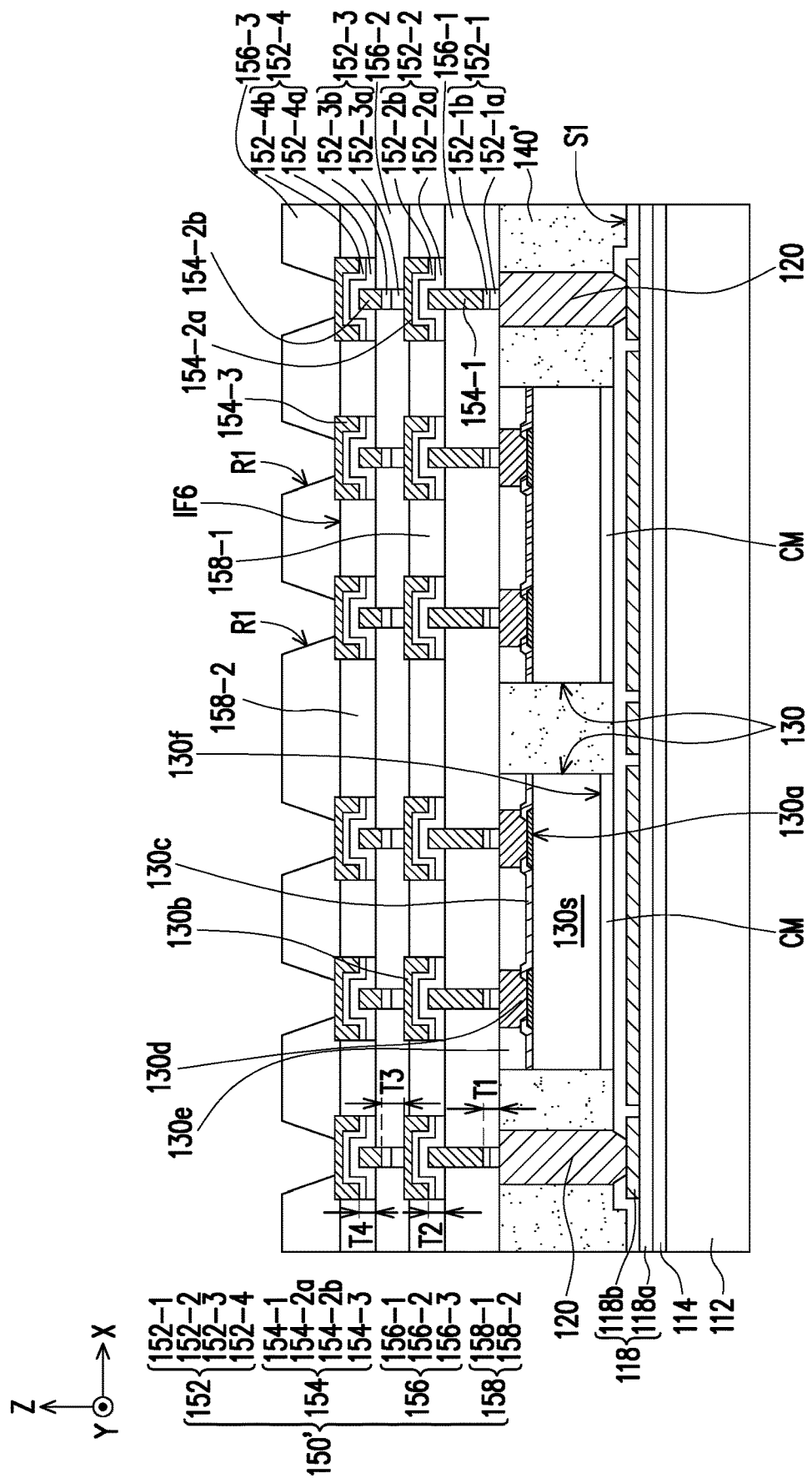

In addition, the critical dimensions of the patterned conductive layer 154-1, 152-2a, 152-2b, and 152-3 can be controlled by respectively adjusting the thickness T1 of the seed layer 152-1, the thickness T2 of the seed layer 152-2, the thickness T3 of the seed layer 152-3, and the thickness T4 of the seed layer 152-4. That is, in the disclosure, the critical dimension of the metal features in the redistribution circuit structure 150' can be controlled by adjusting the seed layer underlying thereto while maintaining the reliability of the circuitry of the redistribution circuit structure 150. For example, as shown in FIG. 39, due to the thickness T3 of the seed layer 152-3 is greater than the thickness T1 of the seed layer 152-1, the thickness T2 of the seed layer 152-2, and the thickness T4 of the seed layer 152-4, the critical dimension of the patterned conductive layer 154-2b is smaller the critical dimensions of the patterned conductive layer 154-1, 152-2a, and 152-3, where the critical dimension of the patterned conductive layer 154-2b may be reduced to less than 2 μm by controlling the thickness T3 of the seed layer 152-3.

Referring to FIG. 5 to FIG. 25 together, in some embodiments, the redistribution circuit structure 150 is formed on the semiconductor dies 130 and the insulating encapsulation 140', where the redistribution circuit structure 150 is electrically connected to the semiconductor dies 130. For example, the redistribution circuit structure 150 is formed on the top surfaces of the semiconductor dies 130 and the top surface 140a of the insulating encapsulation 140'. In some embodiments, the redistribution circuit structure 150 is electrically connected to the semiconductor dies 130 through the conductive vias 130d and the pads 130b. In some embodiments, the redistribution circuit structure 150 is referred to as a front-side redistribution layer of the semiconductor dies 130 for providing routing function. In some embodiments, the semiconductor dies 130 are located between the redistribution circuit structure 150 and the connecting films CM, and the insulating encapsulation 140' are located between the redistribution circuit structure 150 and the debond layer 114. As shown in FIG. 25, the semiconductor dies 130 are electrically communicated to each other through the redistribution circuit structure 150, for example. In some embodiments, the redistribution circuit structure 118 is electrically coupled to the semiconductor dies 130 through the through vias 120 and the redistribution circuit structure 150.

In the disclosure, for illustration purpose, one of each of the first, second, and third build-up layers are included in the redistribution circuit structure 150 of FIG. 25; however, the disclosure is not limited thereto. The numbers of the first build-up layer, the second build-up layer, and the third build-up layer included in the redistribution circuit structure 150 is not limited in the disclosure, and may be determined based on the demand and the design layout. For example, the number of each of the first build-up layer, the second build-up layer, and the third build-up layer included in the redistribution circuit structure 150 may be zero, one, or more than one.

Figure 26:
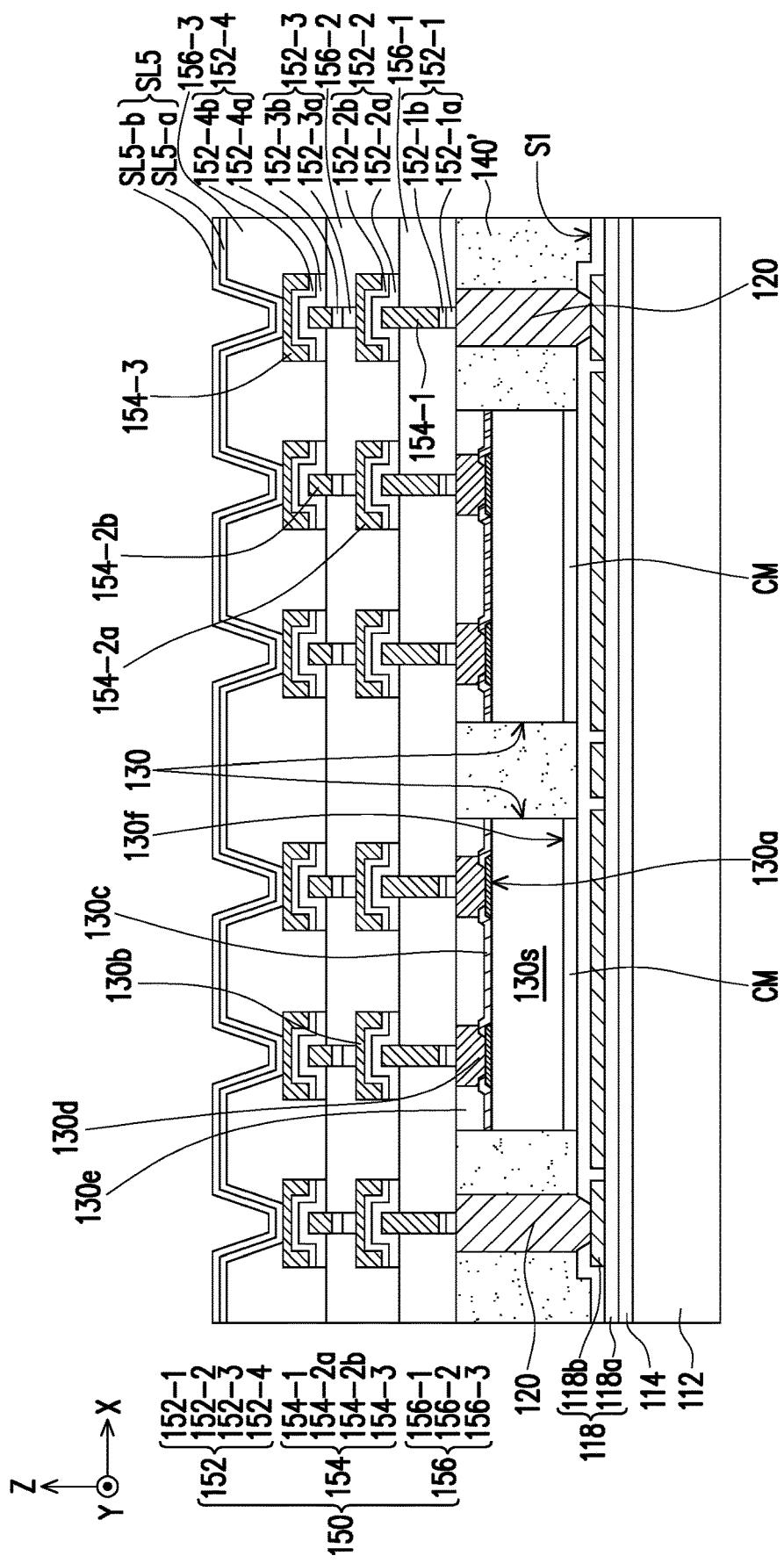

Referring to FIG. 26, in some embodiments, a seed material layer SL5 is disposed on the dielectric layer 156-3. In some embodiments, the seed material layer SL5 is conformally formed on the dielectric layer 156-3 and further extends into the recesses R1 to physically contact the exposed portions of the patterned conductive layer 154-3 in a form of multiple metal or metal alloy layers. In some embodiments, as shown in FIG. 26, the seed material layer SL5 includes a first seed material layer SL5a and a second seed material layer SL5b stacked on the first seed material layer SL5a along the stacking direction (e.g. the direction Z) of the redistribution circuit structure 118 and the semiconductor dies 130.

In one embodiment, along the direction Z, a thickness of the first seed material layer SL5a is substantially equal to a thickness of the second seed material layer SL5b, for example; however, the disclosure is not limited thereto. In an alternative embodiment, the thickness of the first seed material layer SL5a is greater than the thickness of the second seed material layer SL5b. In a further alternative embodiment, the thickness of the first seed material layer SL5a is less than the thickness of the second seed material layer SL5b. In one embodiment, the material and formation of the first seed material layer SL5a may the same as the material and formation of the first seed material layers SL1a, SL2a, SL3a and/or SL4a, the material and formation of the second seed material layer SL5b may be the same as the material and formation of the second seed material layers SL1b, SL2b, SL3b and/or SL4b, and thus are not repeated herein for simplicity. As shown in FIG. 26, in some embodiments, the seed material layer SL5 is in physical and electrical contact with the patterned conductive layer 154-3 exposed by the dielectric layer 156-3.

Figure 27:
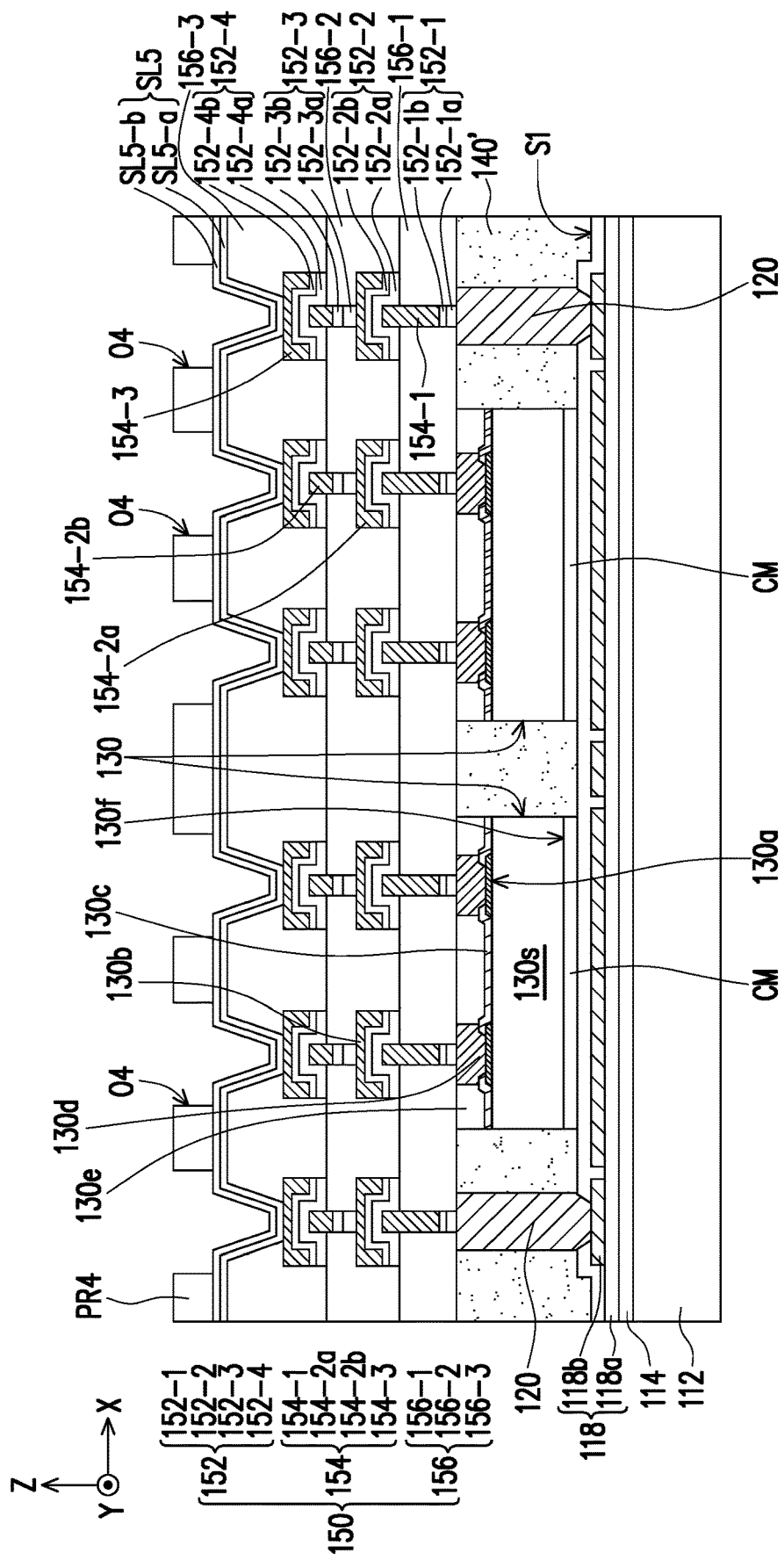

Referring to FIG. 27, in some embodiments, a patterned photoresist layer PR4 is formed on the seed material layer SL5, where the patterned photoresist layer PR4 includes at least one opening O4. For example, as shown in FIG. 27, a plurality of openings O4 are formed in the patterned photoresist layer PR4 to expose portions of the seed material layer SL5. The material and formation of the patterned photoresist layer PR4 may be substantially the same or similar to the material and formation of the patterned photoresist layers PR1, PR2, and/or PR3, and thus are not repeated herein for simplicity. The number and shape of the openings O4 may, for example, correspond to the number and shape of later-formed conductive structure(s) (such as a conductive segment or a conductive trace, a conductive pillar or conductive via), the disclosure is not limited thereto.

Figure 28:
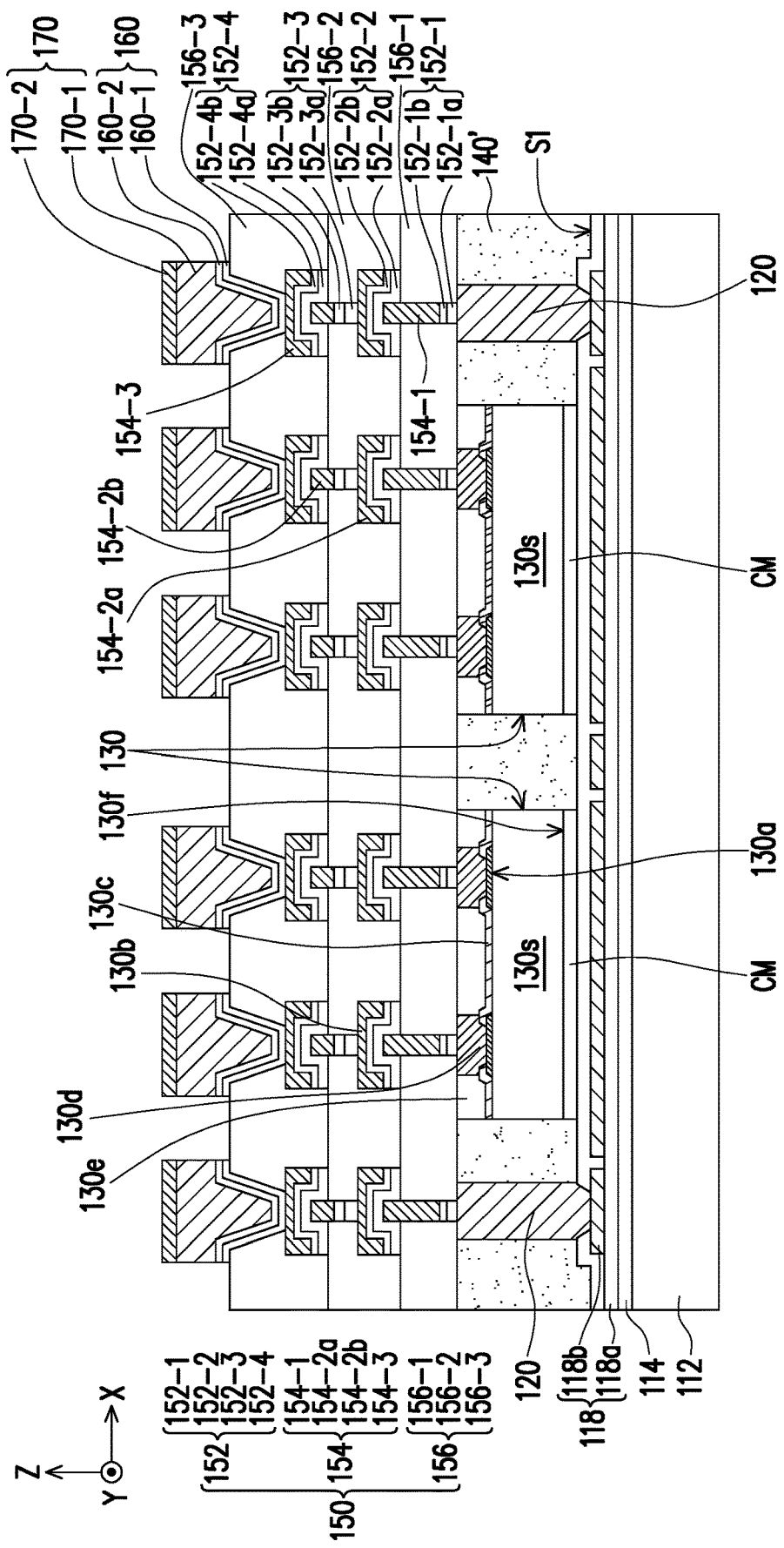

Referring to FIG. 28, in some embodiments, a plurality of seed-layer patterns 160 and a plurality of conductive terminals 170 are formed over the redistribution circuit structure 150, where the seed-layer patterns 160 are sandwiched between the redistribution circuit structure 150 and the conductive terminals 170. In some embodiments, the seed-layer patterns 160 each are located between a respective one of the conductive terminals 170 and the redistribution circuit structure 150. Due to the seed-layer patterns 160, the adhesive strength between the conductive terminals 170 and the redistribution circuit structure 150 is enhanced. In some embodiments, the seed-layer patterns 160 are directly located on dielectric layer 156-3 and further extend into the recesses R1 formed in the dielectric layer 156-3 to physically and electrically contact the portions of the patterned conductive layer 154-3 exposed by the recesses R1 formed in the dielectric layer 156-3. As shown in FIG. 28, in some embodiments, the seed-layer patterns 160 are electrically connected to the redistribution circuit structure 150, and the conductive terminals 170 are electrically connected to the redistribution circuit structure 150 through the seed-layer patterns 160. In some embodiments, some of the conductive terminals 170 are electrically connected to at least one of the semiconductor dies 130 through the redistribution circuit structure 150 and the seed-layer patterns 160. In some embodiments, some of the conductive terminals 170 are electrically connected to the redistribution circuit structure 118 through the through vias 120, the redistribution circuit structure 150, and the seed-layer patterns 160.

In some embodiments, the seed-layer patterns 160 and the conductive terminals 170 may be formed by the following steps. For example, a plurality of conductive elements 170-1 are formed on the seed material layer SL5 and in the openings O4 formed in the patterned photoresist layer PR4 by a plating process; the conductive elements 170-2 is disposed on the conductive elements 170-1 to form the conductive terminals 170 by dispensing; the patterned photoresist layer PR4 is removed by an acceptable ashing process and/or a photoresist stripping process; and, the seed material layer SL5 is patterned by using the conductive terminals 170-1 as a mask to form the seed-layer patterns 160 by etching process(es) (such as an etching process for patterning the first seed material layer SL5a to form a first sub-layer 160-1, and an etching process for patterning the second seed material layer SL5b to form a second sub-layer 160-2). The material of the conductive elements 170-1 may include copper, copper alloy, or the like; and the material of the conductive elements 170-2 may include solder or the like. However, the disclosure is not limited thereto, the above method and processes may be substituted by any other suitable method and processes based on the demand. In some embodiments, the conductive elements 170-2 may be omitted form the conductive terminals 170.

As shown in FIG. 28, for example, in a vertical projection on the carrier 112 along the stacking direction (e.g. the direction Z) of the redistribution circuit structure 118 and the semiconductor dies 130, a projection area of the conductive terminals 170 is substantially the same as the projection area of the seed-layer patterns 160 underlying thereto, respectively. That is, in direction Z, the conductive terminals 170 each are completely overlapped with the seed-layer patterns 160 (including the first sub-layer 160-1 and the second sub-layer 160-2) underlying thereto. In some embodiments, sidewalls of one pattern in the seed-layer patterns 160 are aligned with sidewalls of a respective one pattern in the conductive terminals 170.

Figure 29:
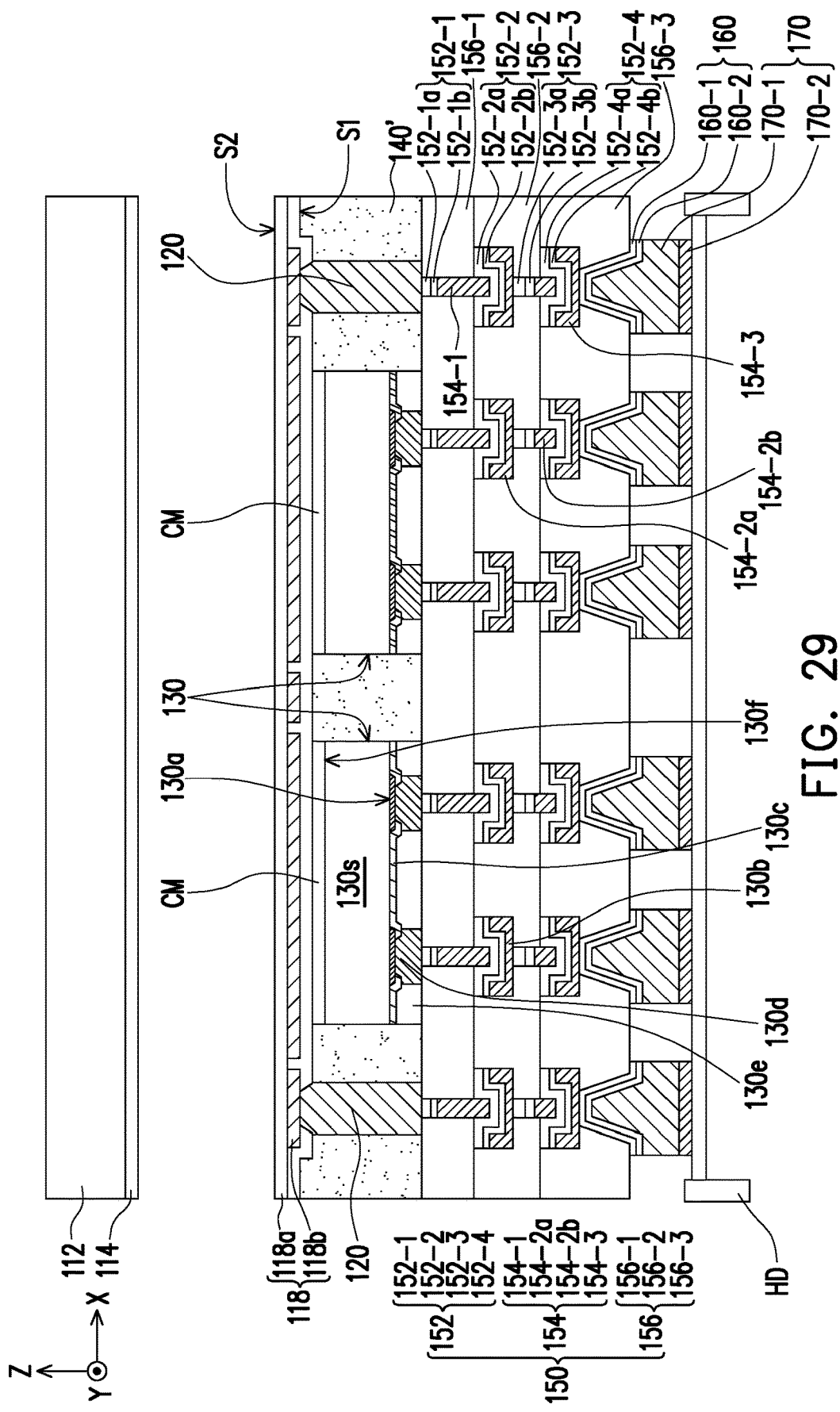

Referring to FIG. 29, in some embodiments, the whole structure depicted in FIG. 28 along with the carrier 112 is flipped (turned upside down), where the conductive terminals 170 are placed to a holding device HD, and the carrier 112 is then debonded from the redistribution circuit structure 118. As shown in FIG. 29, a surface S2 of the redistribution circuit structure 118 is exposed. In some embodiments, the holding device HD may be an adhesive tape, a carrier film or a suction pad. The disclosure is not limited thereto.

In some embodiments, the redistribution circuit structure 118 is easily separated from the carrier 112 due to the debond layer 114. In some embodiments, the carrier 112 is detached from the surface S2 of the redistribution circuit structure 118 through a debonding process, and the carrier 112 and the debond layer 114 are removed. In certain embodiments, the redistribution circuit structure 118 is exposed, as show in FIG. 29. In one embodiment, the debonding process is a laser debonding process. During the debonding step, the holding device HD is used to secure the package structure PS1 before debonding the carrier 112 and the debond layer 114.

Figure 30:
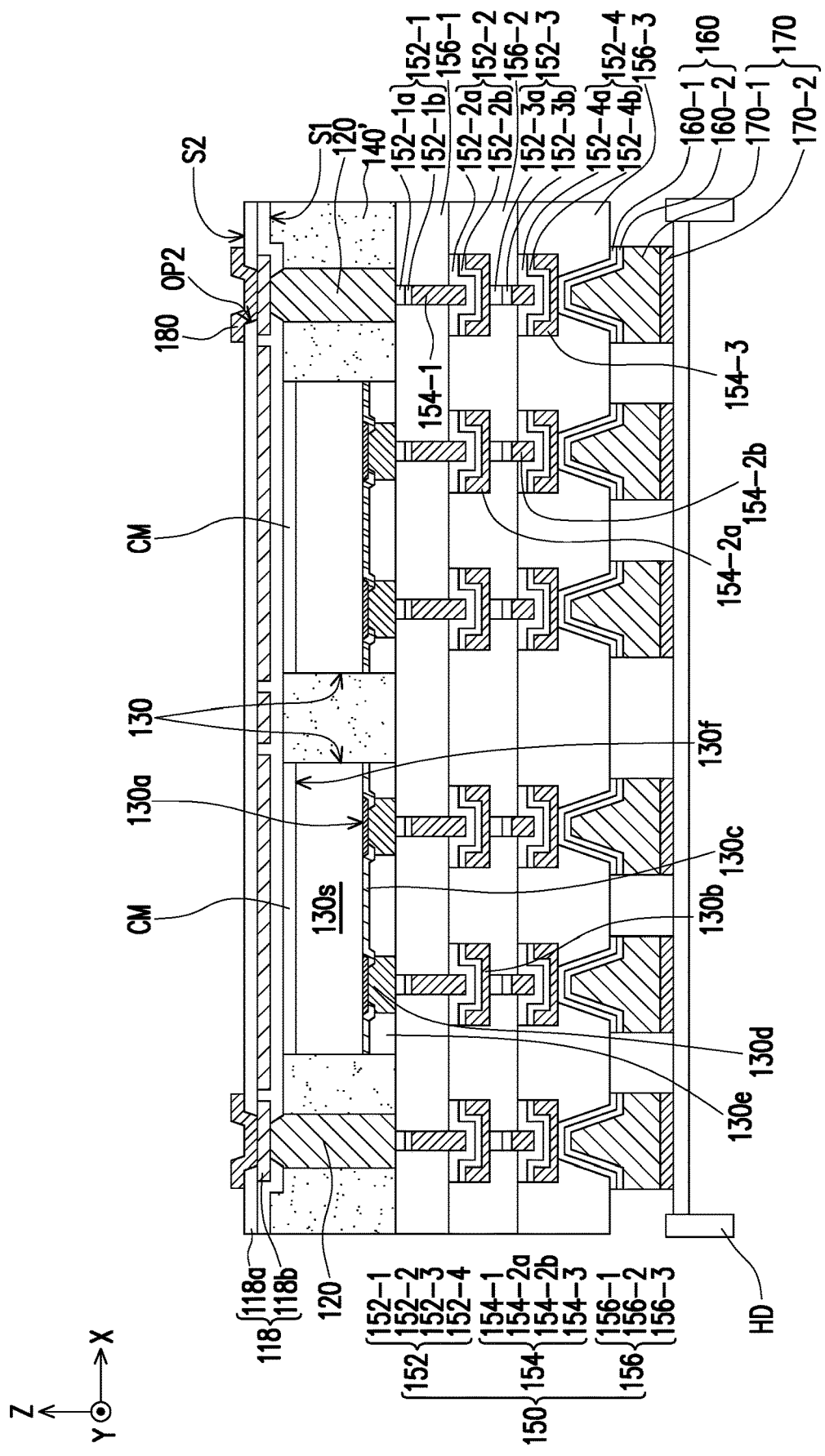

Referring to FIG. 30, in some embodiments, an outermost layer of the dielectric layers 118a of the redistribution circuit structure 118 (e.g. the bottommost layer of the dielectric layer 118a depicted in FIG. 2) is further patterned, such that a plurality of contact openings OP2 are formed in the outermost layer of the dielectric layers 118a of the redistribution circuit structure 118 to expose portions of the metallization layer 118b. The number and shape of the contact openings OP2 may, for example, correspond to the number and shape of later-formed conductive structure(s) (such as conductive terminals). However, the disclosure is not limited thereto. In some embodiments, the contact openings OP2 in the outermost layer of the dielectric layers 118a of the redistribution circuit structure 118 are formed by laser drilling process or other suitable processes.

In some embodiments, after the formation of the contact openings OP2, a plurality of under-ball metallurgy (UBM) patterns 180 are disposed on the portions of the metallization layer 118b exposed by the contact openings OP2 for electrically connecting later-formed or later-disposed conductive elements (e.g. conductive balls) to the exposed portions of the metallization layer 118b. In some embodiments, the UBM patterns 180 may be a single layer or a composite layer having a plurality of sub-layers formed of different materials. The UBM patterns 180 may include copper, nickel, titanium, tungsten, or alloys thereof or the like, and may be formed by an electroplating process, for example. As shown in FIG. 30, the UBM patterns 180 are in physical and electrical contact with the metallization layer 118b. The number of the UBM patterns 180 may correspond to the number of the contact openings OP2.

In an alternative embodiment, the UBM patterns 180 may be optionally omitted based on demand and/or design layout. In such embodiment, parts of the metallization layer 118b underlying the later-formed or later-disposed conductive elements may function as under-ball metallurgy (UBM) layers. In some embodiments, prior to forming or disposing the later-formed or later-disposed conductive elements, a solder paste (not shown) or flux is applied, so that the later-formed or later-disposed conductive elements are better fixed to the metallization layer 118b.

Figure 31:
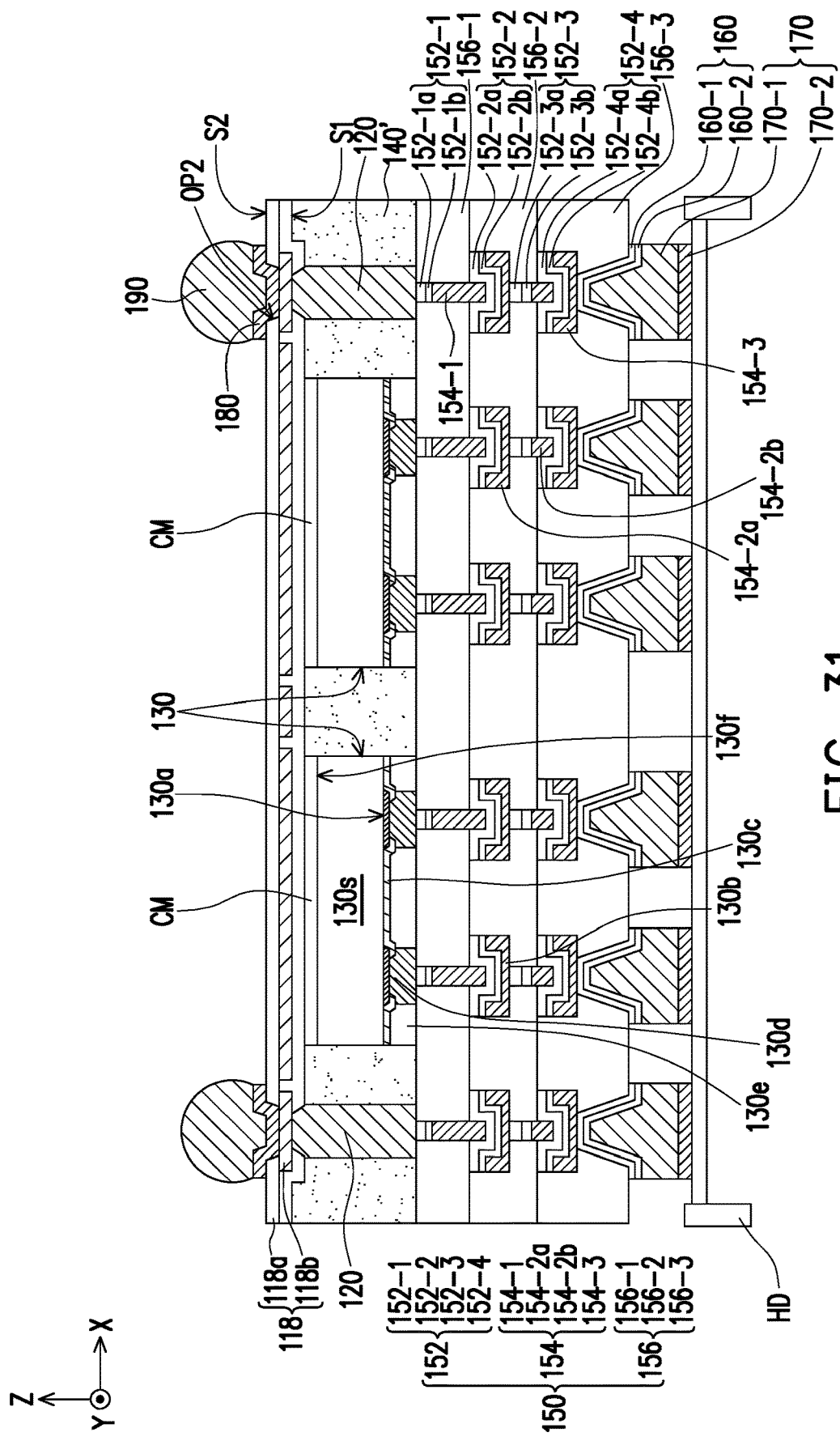

Referring to FIG. 31, in some embodiments, a plurality of conductive terminals 190 are formed on the redistribution circuit structure 118. In some embodiments, the redistribution circuit structure 118 is located between the connecting films CM and the conductive terminals 190, between the semiconductor dies 130 and the conductive terminals 190, and between the insulating encapsulation 140' and the conductive terminals 190. As shown in FIG. 31, the conductive terminals 190 are physically and electrically connected to the UBM patterns 180. In some embodiments, the conductive terminals 190 are electrically connected to the redistribution circuit structure 118 through the UBM patterns 180. In some embodiments, some of the conductive terminals 190 are electrically coupled to the redistribution circuit structure 150 through the UBM patterns 180, the redistribution circuit structure 118, and the through vias 120. In some embodiments, some of the conductive terminals 190 are electrically coupled to the semiconductor dies 130 through the UBM patterns 180, the redistribution circuit structure 118, the through vias 120, and the redistribution circuit structure 150. In some embodiments, some of the conductive terminals 190 are electrically coupled to some of the conductive terminals 170 through the UBM patterns 180, the redistribution circuit structure 118, the through vias 120, and the redistribution circuit structure 150.

In some embodiments, the conductive terminals 190 may be disposed on the UBM patterns 180 by ball placement process or reflow process. In some embodiments, the conductive terminals 190 may be solder balls or ball grid array (BGA) balls. The disclosure is not limited thereto. The number of the conductive terminals 190 may correspond to the number of the UBM patterns 180.

Figure 32:
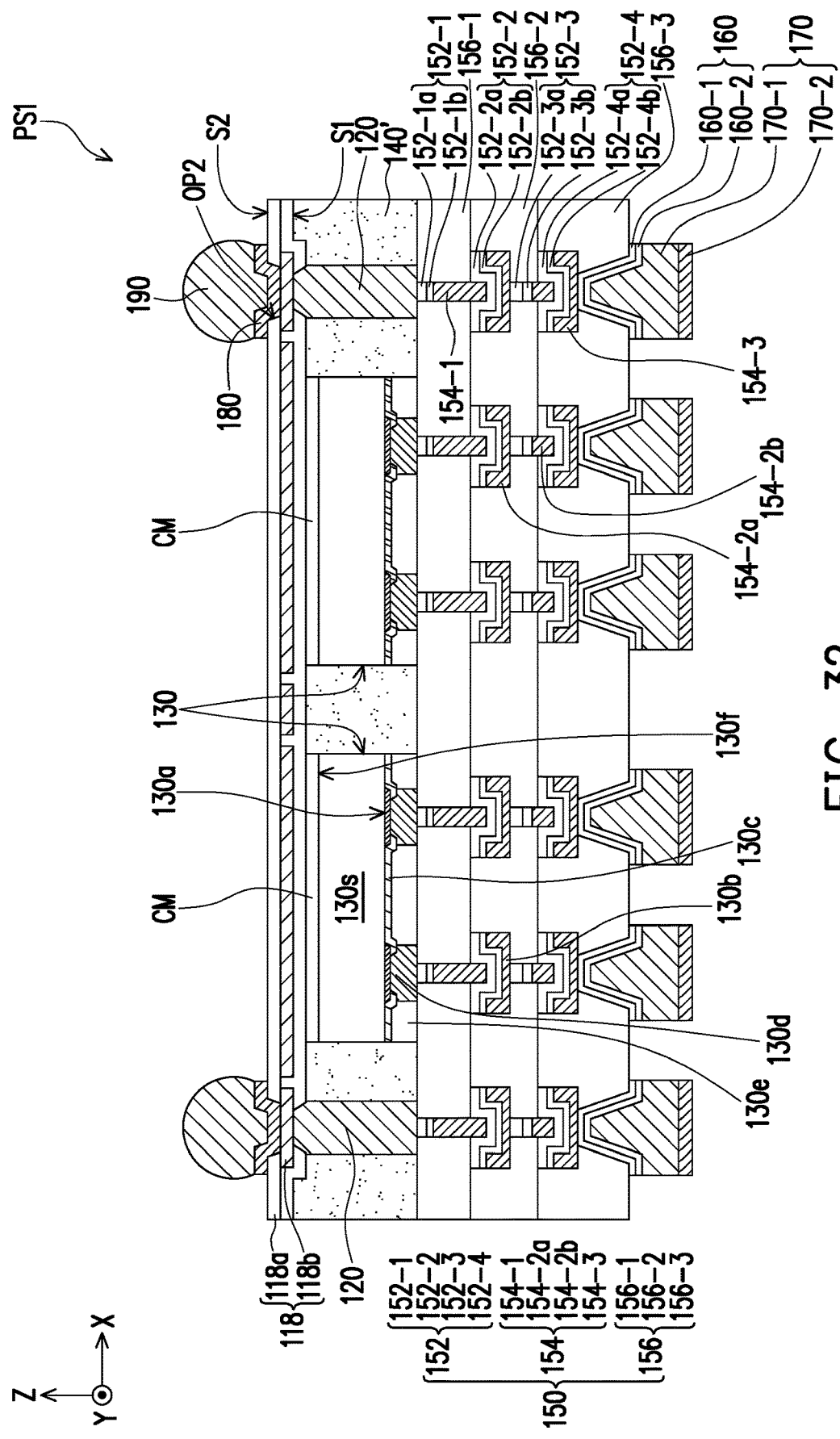

Referring to FIG. 32, in some embodiments, the conductive terminals 170 are released from the holding device HD to form the package structure PS1. In some embodiments, prior to releasing the conductive terminals 170 from the holding device HD, a dicing (singulation) process is performed to cut a plurality of the package structure PS1 interconnected therebetween into individual and separated package structures PS1. In one embodiment, the dicing (singulation) process is a wafer dicing process including mechanical blade sawing or laser cutting. The disclosure is not limited thereto. Up to here, the manufacture of the package structure PS1 is completed.

Figure 33:
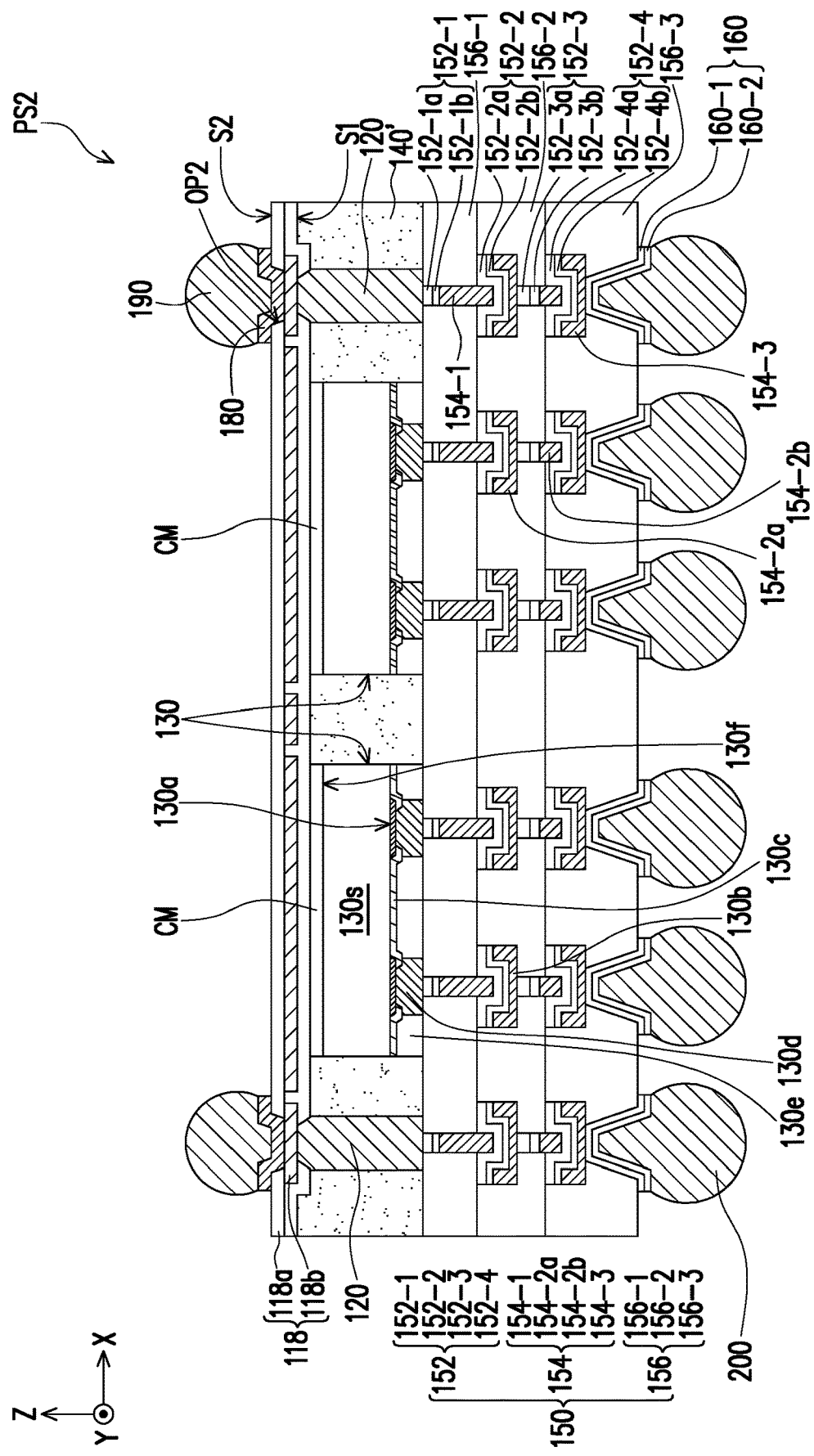
FIG. 33 is a schematic cross sectional view of a package structure in accordance with some other embodiments of the present disclosure.
Figure 34:
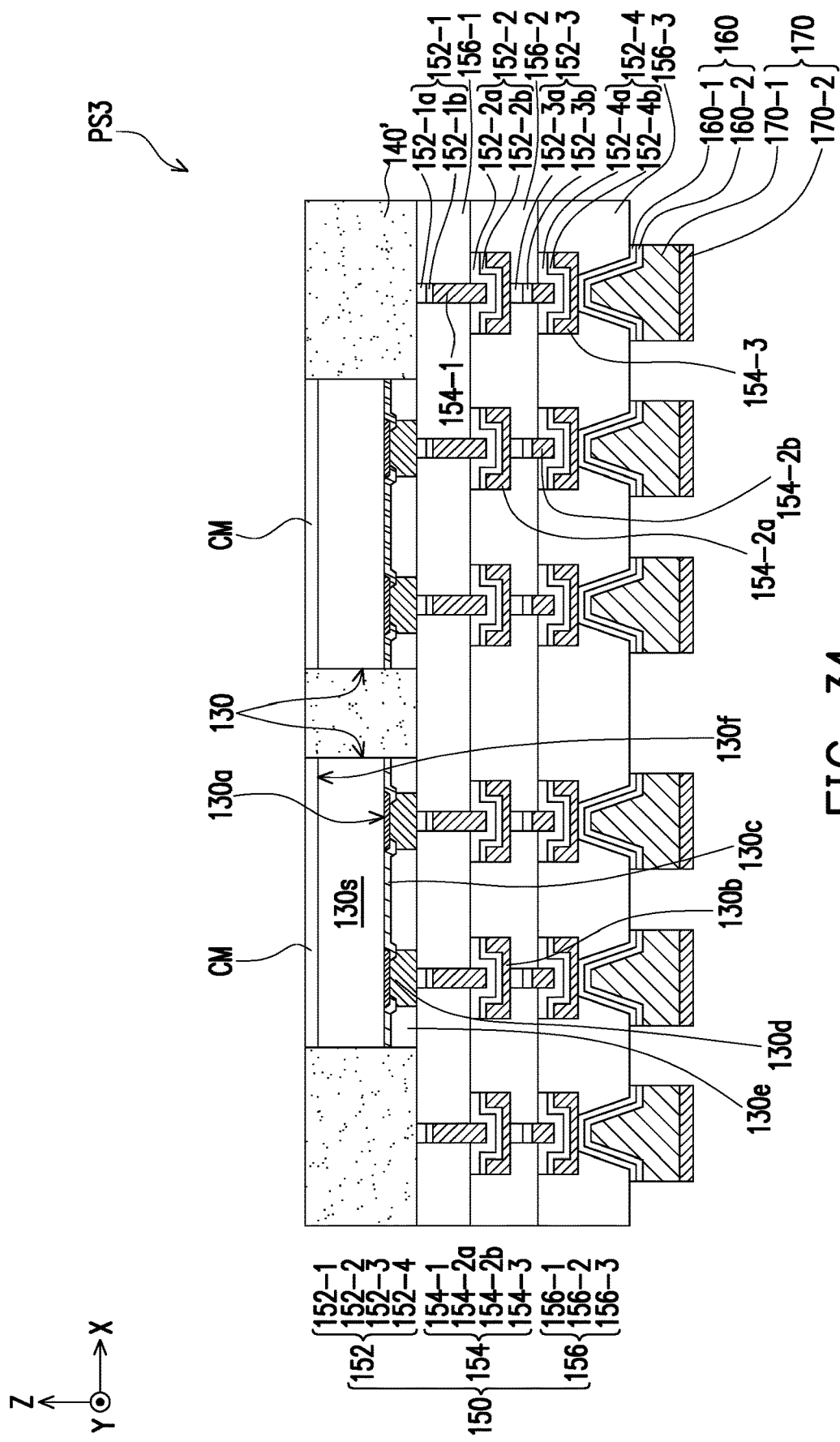
FIG. 34 is a schematic cross sectional view of a package structure in accordance with some other embodiments of the present disclosure.
Figure 35:
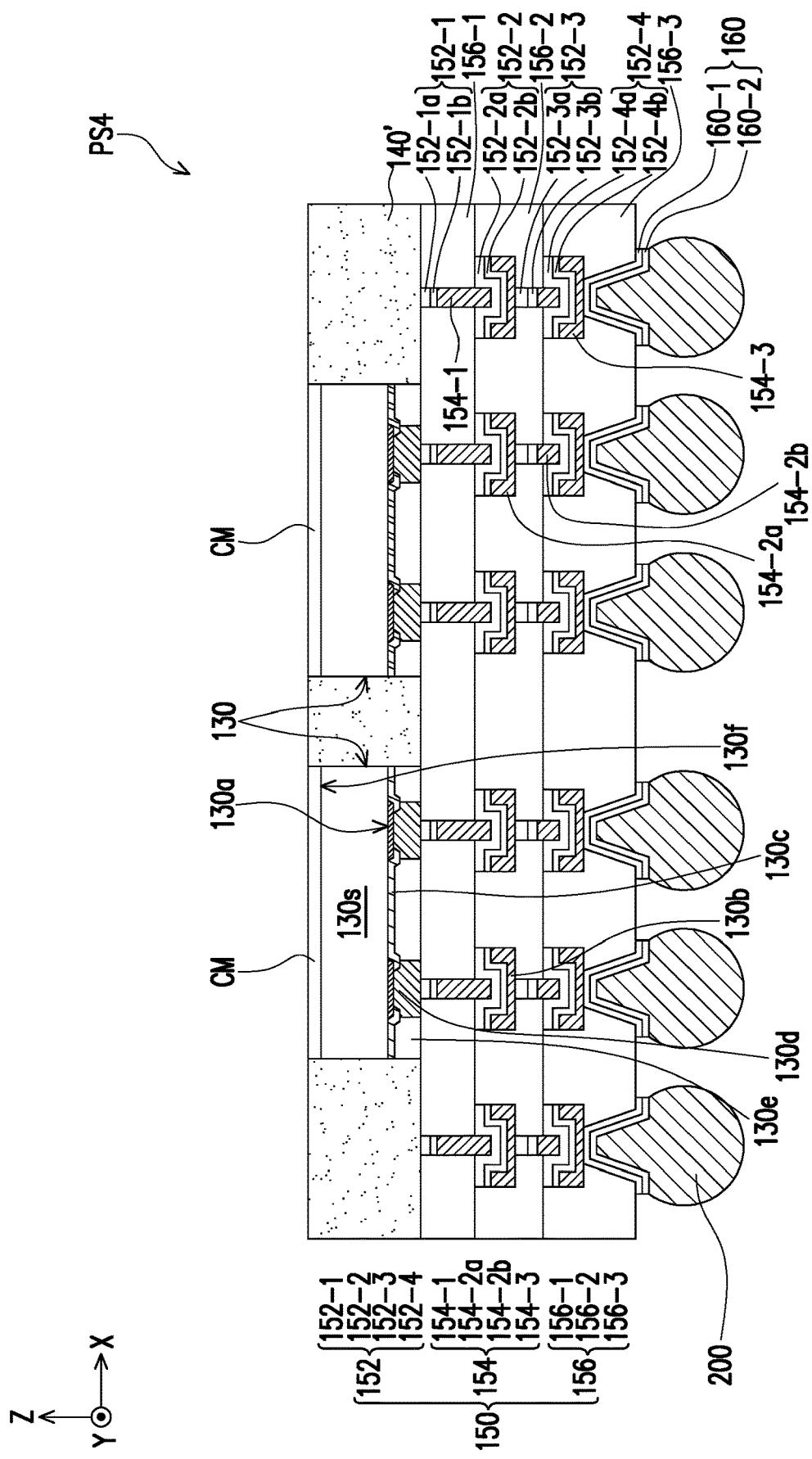
FIG. 35 is a schematic cross sectional view of a package structure in accordance with some other embodiments of the present disclosure.

However, the disclosure is not limited thereto. In certain embodiments, the conductive terminals 170 may be substituted by conductive terminals 200 which may include solder balls or BGA balls, see a package structure PS2 depicted in FIG. 33. In an alternative embodiment, the redistribution circuit structure 118, the through vias 120, the UBM patterns 180, and the conductive terminals 190 may be optionally omitted, see a package structure PS3 depicted in FIG. 34. In a further alternative embodiment, the conductive terminals 170 may be substituted by conductive terminals 200 which may include solder balls or BGA balls while the redistribution circuit structure 118, the through vias 120, the UBM patterns 180, and the conductive terminals 190 may be optionally omitted, see a package structure PS4 depicted in FIG. 35.

In further alternative embodiments, in addition to the conductive terminals 170, 190, and/or 200 in FIG. 32 to FIG. 35, an additional semiconductor element(s) (not shown) may be disposed on the seed layer patterns 160 and/or the UBM patterns 180 for electrically coupling at least one of the semiconductor dies 130. In some embodiments, the additional semiconductor element(s) may include a passive component or active component. The number of the additional semiconductor element(s) is not limited in the disclosure, and may be designated based on the demand and design layout.

Figure 40:
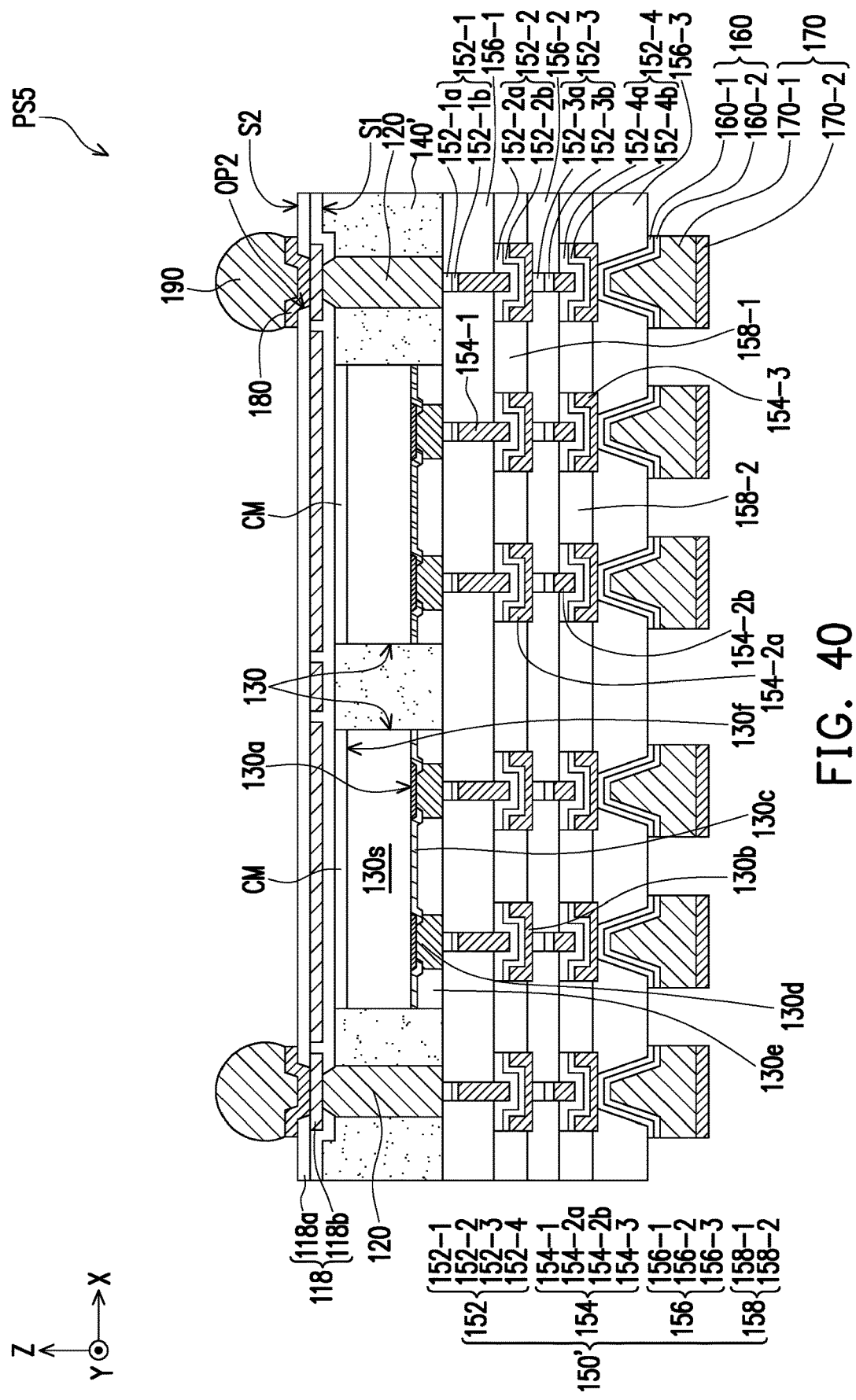

FIG. 36 to FIG. 40 are schematic cross sectional views of various stages in a manufacturing method of a package structure in accordance with some embodiments of the present disclosure. The elements similar to or substantially the same as the elements described previously will use the same reference numbers, and certain details or descriptions (e.g. the materials, formation processes, positioning configurations, etc.) of the same elements would not be repeated herein. Referring to FIG. 32 and FIG. 40, a package structure PS5 depicted in FIG. 40 is similar to the package structure PS1 depicted in FIG. 32; the difference is that, in the package structure PS7, the redistribution circuit structure 150 is substituted by a redistribution circuit structure 150'.

As shown in FIG. 36 to FIG. 39, the redistribution circuit structure 150' includes one or more than one seed layers 152 (e.g., a seed layer 152-1, a seed layer 152-2, a seed layer 152-3, and a seed layer 152-4), one or more than one patterned conductive layers 154 (e.g., a patterned conductive layer 154-1, a patterned conductive layer 154-2a, a patterned conductive layer 154-2b, and a patterned conductive layer 154-3), one or more than one dielectric layers 156 (e.g., a dielectric layer 156-1, a dielectric layer 156-2, and a dielectric layer 156-3), and one or more than one inter-layer film (e.g., an inter-layer film 158-1 and an inter-layer film 158-2). However, in the disclosure, the numbers of layers of the seed layers 152, the patterned conductive layer 154, and the dielectric layers 156, and the inter-layer films 158 are not limited to what is depicted in FIG. 36 to FIG. 39, and may be one or more than one based on the demand and the design layout.

Figure 36:
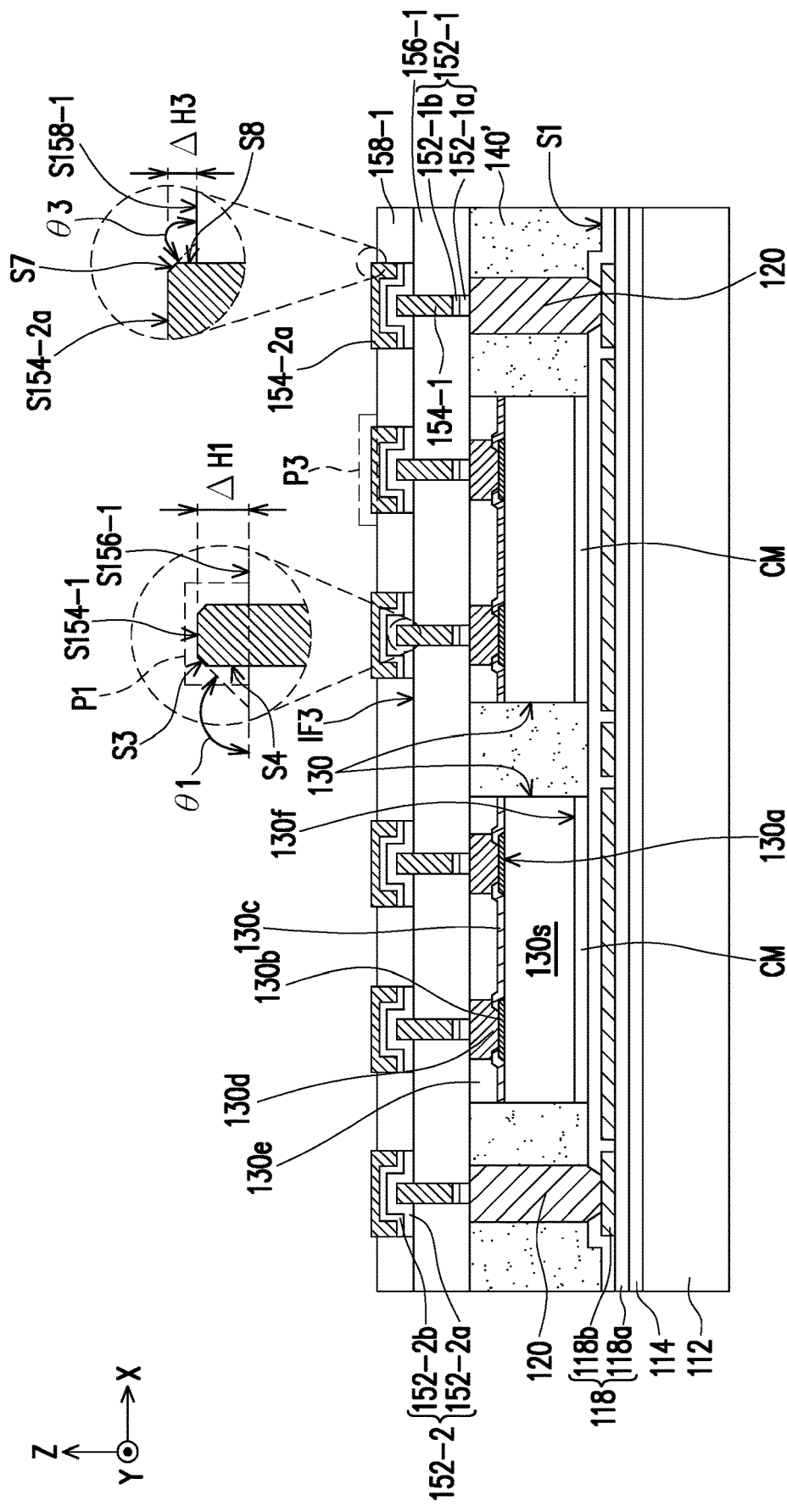
FIG. 36 to FIG. 40 are schematic cross sectional views of various stages in a manufacturing method of a package structure in accordance with some embodiments of the present disclosure.

Referring to FIG. 36, in some embodiments, the inter-layer film 158-1 is formed on the dielectric layer 156-1 and laterally wrapped around the patterned conductive layer 154-2a, following the process as described in FIG. 16. In certain embodiments, as shown in FIG. 36, portions P3 of the patterned conductive layer 154-2a are protruded out of and exposed by the inter-layer film 158-1. In other words, the portions P3 of the patterned conductive layer 154-2a are not in physical contact with the inter-layer film 158-1. In some embodiments, top surfaces S154-2a of the portions P3 of the patterned conductive layer 154-2a are non-coplanar to a top surface S158-1 of the inter-layer film 158-1. In some embodiments, a height difference ΔH3 between the top surfaces S154-2a of the portions P3 of the patterned conductive layer 154-2a and the top surface S158-1 of the inter-layer film 158-1 is approximately ranging from 0.1 μm to 0.7 μm. In other words, the top surfaces S154-2a of the portions P3 of the patterned conductive layer 154-2a and the top surface S158-1 of the inter-layer film 158-1 are misaligned to each other along a direction X perpendicular to the stacking direction Z. In some embodiments, as shown in FIG. 36, the patterned conductive layer 154-2a is accessibly revealed by the dielectric layer 158-1, where the portions P3 of the patterned conductive layer 154-2a are free of the dielectric layer 158-1. In some embodiments, as shown in FIG. 36, an interface IF3 of the dielectric layer 156-1 and the inter-layer film 158-1 is located at a sidewall of the patterned conductive layer 154-1.

The material and formation of the inter-layer film 158-1 is substantially the same or similar to the material and formation of the dielectric layer 156-1 described in FIG. 10 to FIG. 11 and/or the material and formation of the dielectric layer 156-2 described in FIG. 22 to FIG. 23, and thus are not repeated herein for simplicity. In certain embodiments, as shown in FIG. 36, each of the portions P3 has the top surface S154-2a, a sidewalls S7, and a sidewall S8, where the top surface S154-2a is connected to the sidewall S8 by the sidewalls S7. In some embodiments, an angle θ3 defined by an extending line of the sidewalls S7 of each portion P3 and an extending line of the top surface S158-1 of the inter-layer film 158-1 is approximately ranging from 100° to 140°.

Figure 37:
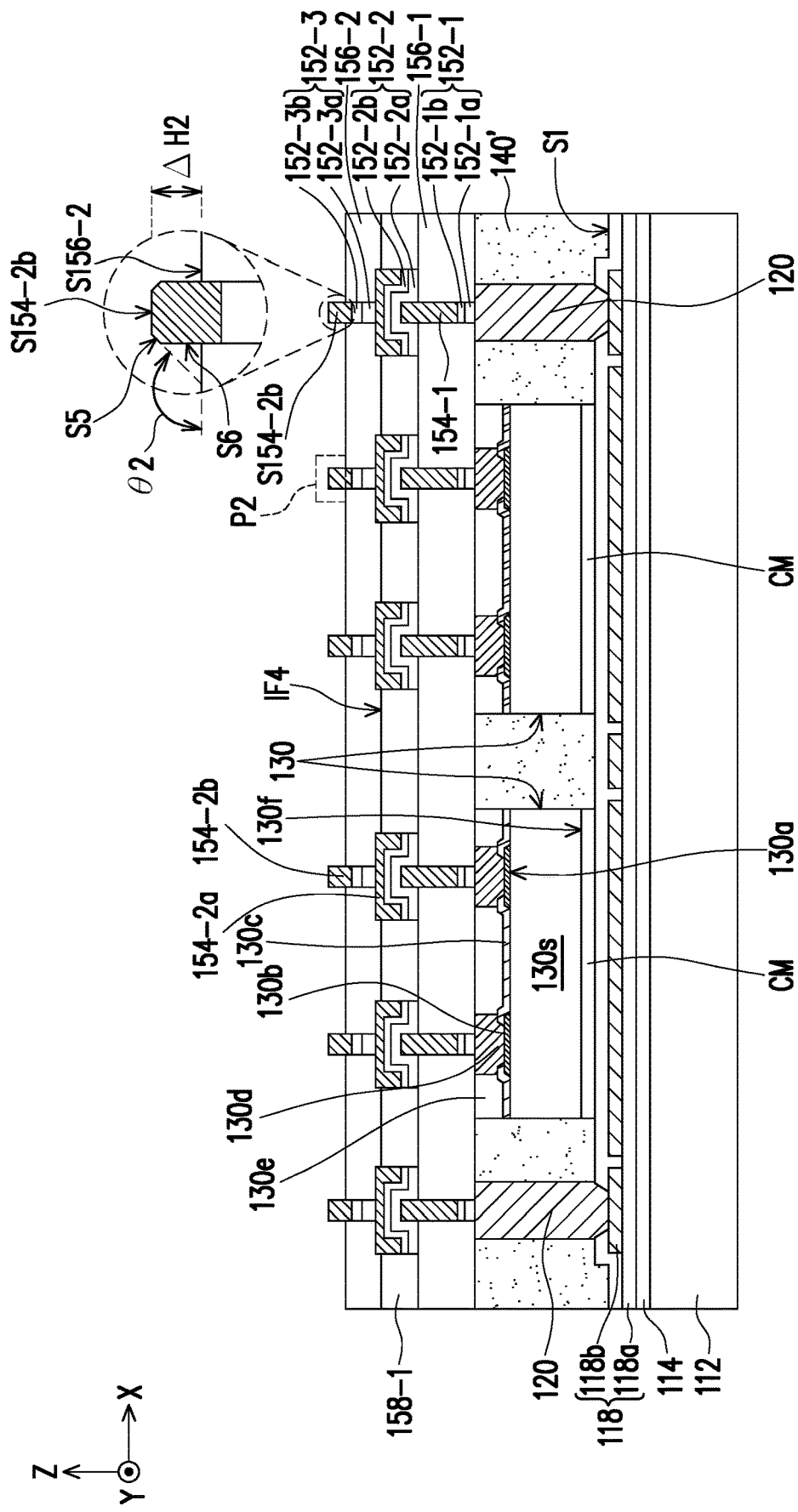

Referring to FIG. 37, in some embodiments, the seed layer 152-3, the patterned conductive layer 154-2b, and the dielectric layer 156-2 are formed on the inter-layer film 158-1. The materials and formations of the seed layer 152-3, the patterned conductive layer 154-2b, and the dielectric layer 156-2 are described in FIG. 17 to FIG. 23, and thus are not repeated herein. In the disclosure, the seed layer 152-2 (including the first sub-layer 152-2a and the second sub-layer 152-2b), the patterned conductive layer 154-2a, the inter-layer film 158-1, the seed layer 152-3 (including the first sub-layer 152-3a and the second sub-layer 152-3b), the patterned conductive layer 154-2b, and the dielectric layer 156-3 are together referred to as a second build-up layer of the redistribution circuit structure 150'. In some embodiments, as shown in FIG. 37, an interface IF4 of the inter-layer film 158-1 and the dielectric layer 156-2 is located at a sidewall of the patterned conductive layer 154-2a.

Figure 38:
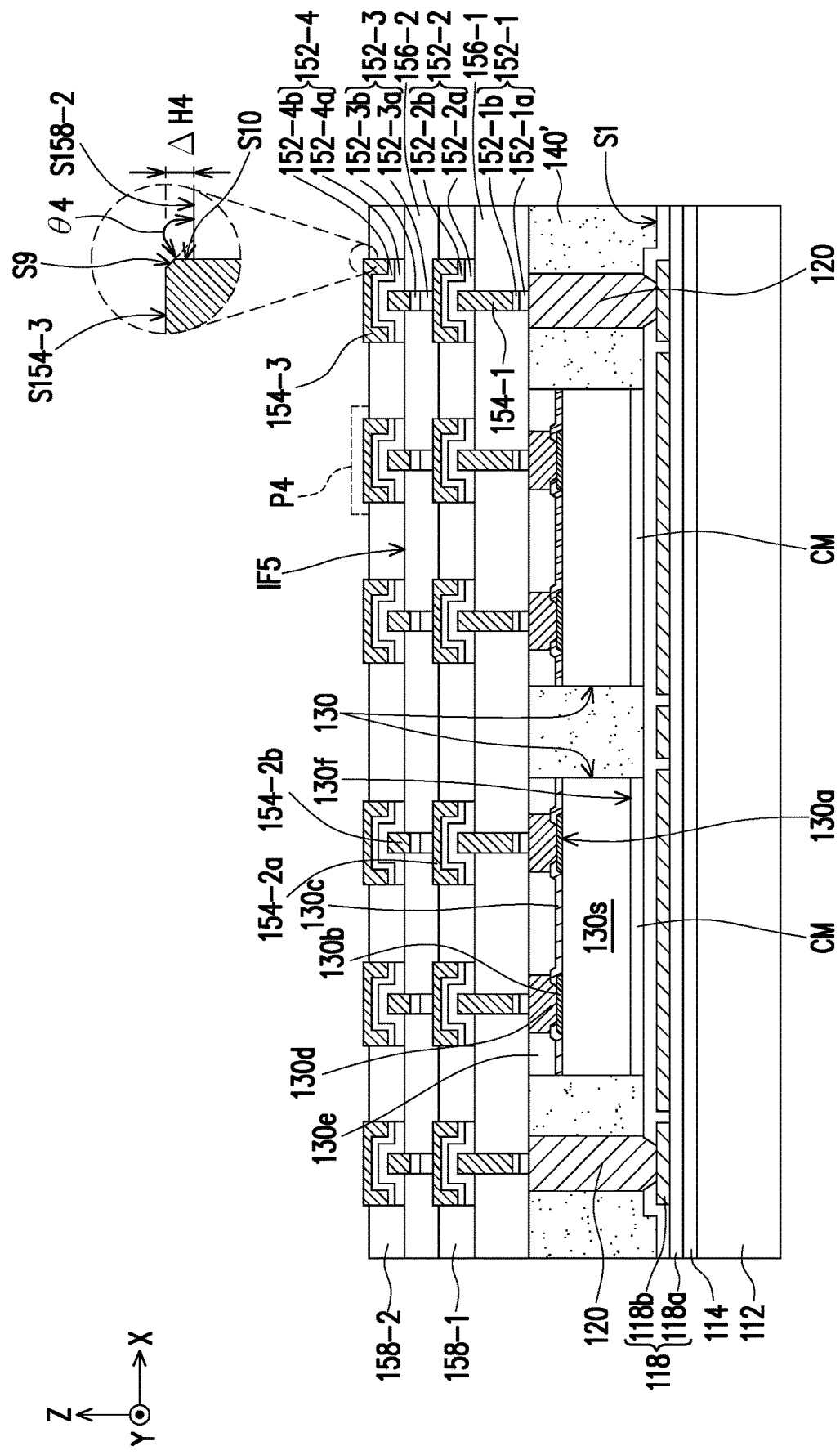

Referring to FIG. 38, in some embodiments, the seed layer 152-4 and the patterned conductive layer 154-3 are formed on the dielectric layer 156-2. In some embodiments, after the formation of the patterned conductive layer 154-3, the inter-layer film 158-2 is formed on the dielectric layer 156-2 and laterally wrapped around the patterned conductive layer 154-3. The materials and formations of the seed layer 152-4 and the patterned conductive layer 154-3 are described in FIG. 24, the material and formation of the inter-layer film 158-2 is substantially the same or similar to the material and formation of the inter-layer film 158-1, and thus are not repeated herein.

In certain embodiments, as shown in FIG. 38, portions P4 of the patterned conductive layer 154-3 are protruded out of and exposed by the inter-layer film 158-2. In other words, the portions P4 of the patterned conductive layer 154-3 are not in physical contact with the inter-layer film 158-2. In some embodiments, top surfaces S154-3 of the portions P4 of the patterned conductive layer 154-3 are non-coplanar to a top surface S158-2 of the inter-layer film 158-2. In some embodiments, a height difference ΔH4 between the top surfaces S154-3 of the portions P4 of the patterned conductive layer 154-3 and the top surface S158-2 of the inter-layer film 158-2 is approximately ranging from 0.1 μm to 0.7 μm. In other words, the top surfaces S154-3 of the portions P4 of the patterned conductive layer 154-3 and the top surface S158-2 of the inter-layer film 158-2 are misaligned to each other along a direction X perpendicular to the stacking direction Z. In some embodiments, as shown in FIG. 38, the patterned conductive layer 154-3 is accessibly revealed by the dielectric layer 158-2, where the portions P4 of the patterned conductive layer 154-3 are free of the dielectric layer 158-2. In some embodiments, as shown in FIG. 38, an interface IF5 of the dielectric layer 156-2 and the inter-layer film 158-2 is located at a sidewall of the patterned conductive layer 154-2b.

Referring to FIG. 39, in some embodiments, after the formation of the inter-layer film 158-2, the dielectric layer 156-3 is formed on the inter-layer film 158-2 and over the carrier 112. As shown in FIG. 39, for example, the dielectric layer 156-3 covers the patterned conductive layer 154-3 and the inter-layer film 158-2 and exposes portions of the patterned conductive layer 154-3. The dielectric layer 156-3 is formed with a plurality of recesses R1 exposing portions of the patterned conductive layer 154-3, for example. In some embodiments, the formation and material of the dielectric layer 156-3 is described in FIG. 25, and thus are not repeated herein. In the disclosure, the seed layer 152-4 (including the first sub-layer 152-4a and the second sub-layer 152-4b), the patterned conductive layer 154-3, the inter-layer film 158-2, and the dielectric layer 156-3 are together referred to as a third build-up layer of the redistribution circuit structure 150'. In some embodiments, as shown in FIG. 39, an interface IF6 of the inter-layer film 158-2 and the dielectric layer 156-3 is located at a sidewall of the patterned conductive layer 154-3.

Upon this, the redistribution circuit structure 150' of the package structure PS5 is manufactured. In addition, the critical dimensions of the patterned conductive layer 154-1, 152-2a, 152-2b, and 152-3 can be controlled by respectively adjusting the thickness T1 of the seed layer 152-1, the thickness T2 of the seed layer 152-2, the thickness T3 of the seed layer 152-3, and the thickness T4 of the seed layer 152-4. That is, in the disclosure, the critical dimension of the metal features in the redistribution circuit structure 150' can be controlled by adjusting the seed layer underlying thereto while maintaining the reliability of the circuitry of the redistribution circuit structure 150'. For example, as shown in FIG. 39, due to the thickness T3 of the seed layer 152-3 is greater than the thickness T1 of the seed layer 152-1, the thickness T2 of the seed layer 152-2, and the thickness T4 of the seed layer 152-4, the critical dimension of the patterned conductive layer 154-2b is smaller the critical dimensions of the patterned conductive layer 154-1, 152-2a, and 152-3, where the critical dimension of the patterned conductive layer 154-2b may be reduced to less than 2 μm by controlling the thickness T3 of the seed layer 152-3. Also, owing to the presences of the inter-layer films 158-1 and 158-2, the reliability of the package structure PS1 is further enhanced as the topography of each of the patterned conductive layers 154-2a and 154-3 is modified and thus a great process window of the redistribution circuit structure 150' is achieved.

For illustration purpose, one of each of the first, second, and third build-up layers are included in the redistribution circuit structure 150' of FIG. 39; however, the disclosure is not limited thereto. The numbers of the first build-up layer, the second build-up layer, and the third build-up layer included in the redistribution circuit structure 150' is not limited in the disclosure, and may be determined based on the demand and the design layout. For example, the number of each of the first build-up layer, the second build-up layer, and the third build-up layer included in the redistribution circuit structure 150' may be zero, one, or more than one.

Referring to FIG. 40, in some embodiments, the package structure PS5 is manufactured by performing the processes described in FIG. 26 to FIG. 32 on the structure depicted in FIG. 39.

In some embodiments, as shown in FIG. 40, the redistribution circuit structure 150' is formed on the semiconductor dies 130 and the insulating encapsulation 140', where the redistribution circuit structure 150' is electrically connected to the semiconductor dies 130. For example, the redistribution circuit structure 150' is formed on the top surfaces of the semiconductor dies 130 and the top surface 140a of the insulating encapsulation 140'. In some embodiments, the redistribution circuit structure 150' is electrically connected to the semiconductor dies 130 through the conductive vias 130d and the pads 130b. In some embodiments, the redistribution circuit structure 150' is referred to as a front-side redistribution layer of the semiconductor dies 130 for providing routing function. In some embodiments, the semiconductor dies 130 are located between the redistribution circuit structure 150' and the connecting films CM, and the insulating encapsulation 140' are located between the redistribution circuit structure 150' and the debond layer 114. As shown in FIG. 40, the semiconductor dies 130 are electrically communicated to each other through the redistribution circuit structure 150', for example. In some embodiments, the redistribution circuit structure 118 is electrically coupled to the semiconductor dies 130 through the through vias 120 and the redistribution circuit structure 150'.

In some embodiments, the conductive terminals 190 are electrically connected to the redistribution circuit structure 118 through the UBM patterns 180. In some embodiments, the redistribution circuit structure 118 is located between the connecting films CM and the conductive terminals 190, between the semiconductor dies 130 and the conductive terminals 190, and between the insulating encapsulation 140' and the conductive terminals 190. In some embodiments, some of the conductive terminals 190 are electrically coupled to the redistribution circuit structure 150' through the UBM patterns 180, the redistribution circuit structure 118, and the through vias 120. In some embodiments, some of the conductive terminals 190 are electrically coupled to the semiconductor dies 130 through the UBM patterns 180, the redistribution circuit structure 118, the through vias 120, and the redistribution circuit structure 150'. In some embodiments, some of the conductive terminals 190 are electrically coupled to some of the conductive terminals 170 through the UBM patterns 180, the redistribution circuit structure 118, the through vias 120, and the redistribution circuit structure 150'.

Figure 41:
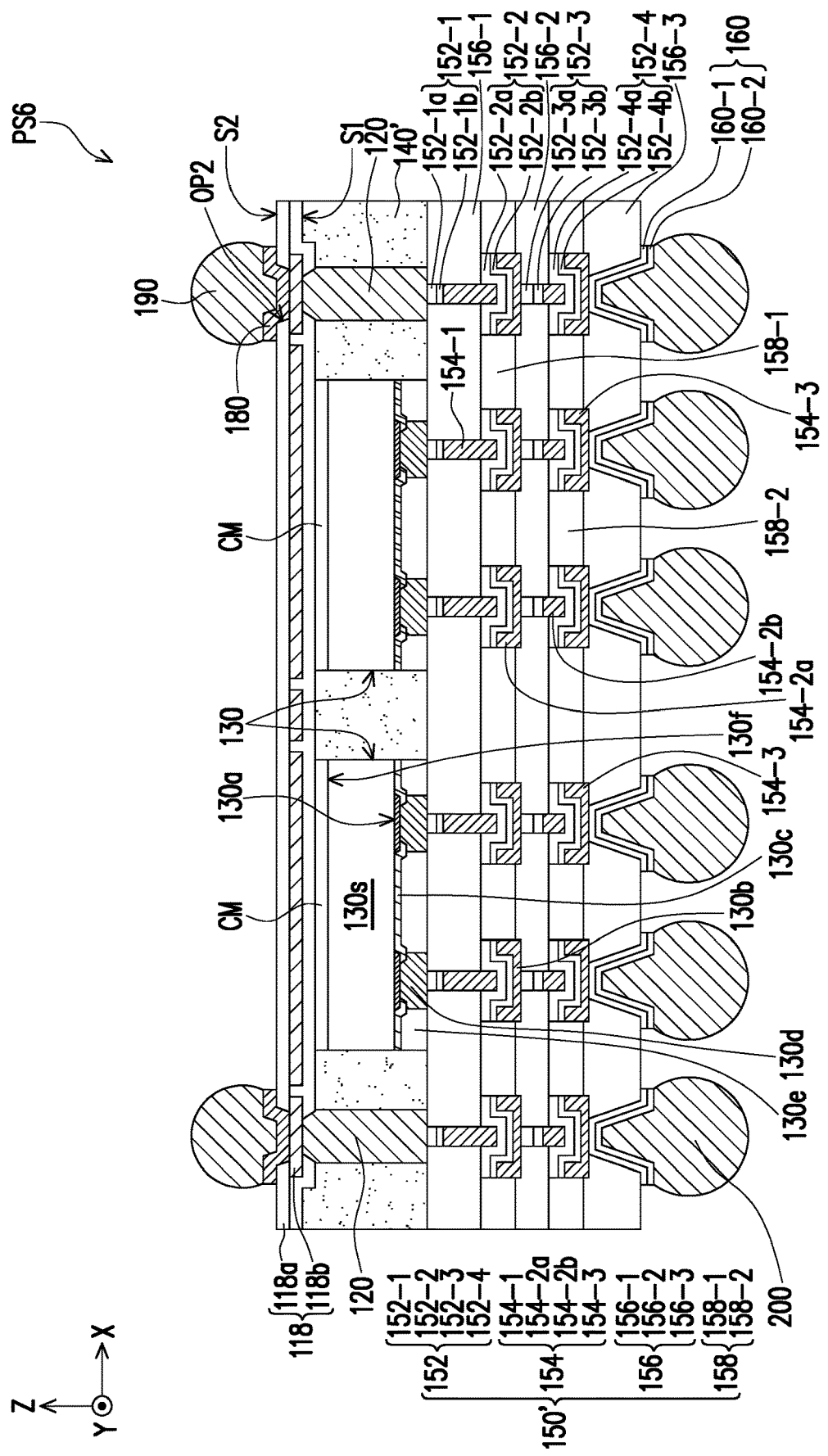
FIG. 41 is a schematic cross sectional view of a package structure in accordance with some other embodiments of the present disclosure.
Figure 42:
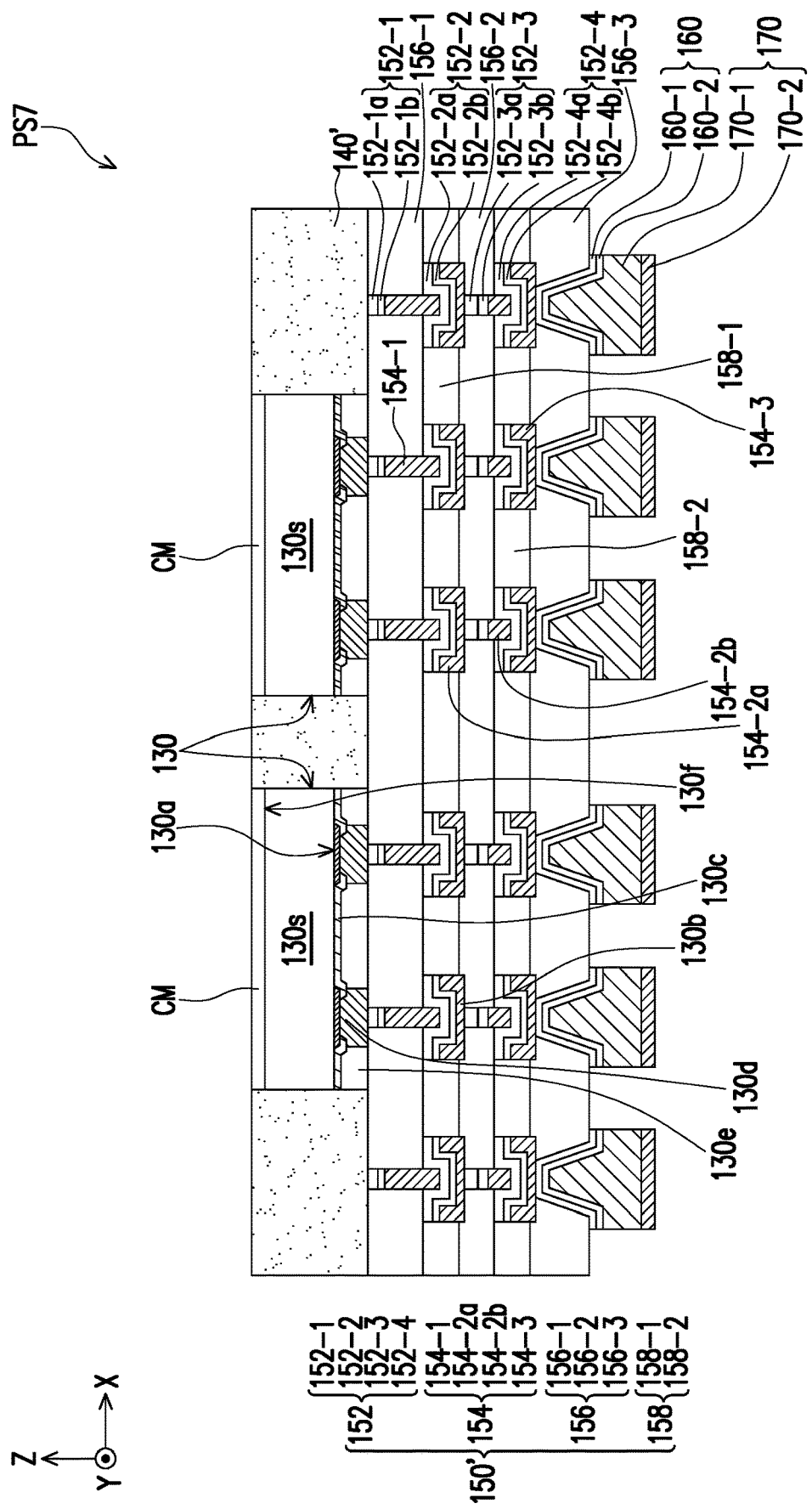
FIG. 42 is a schematic cross sectional view of a package structure in accordance with some other embodiments of the present disclosure.
Figure 43:
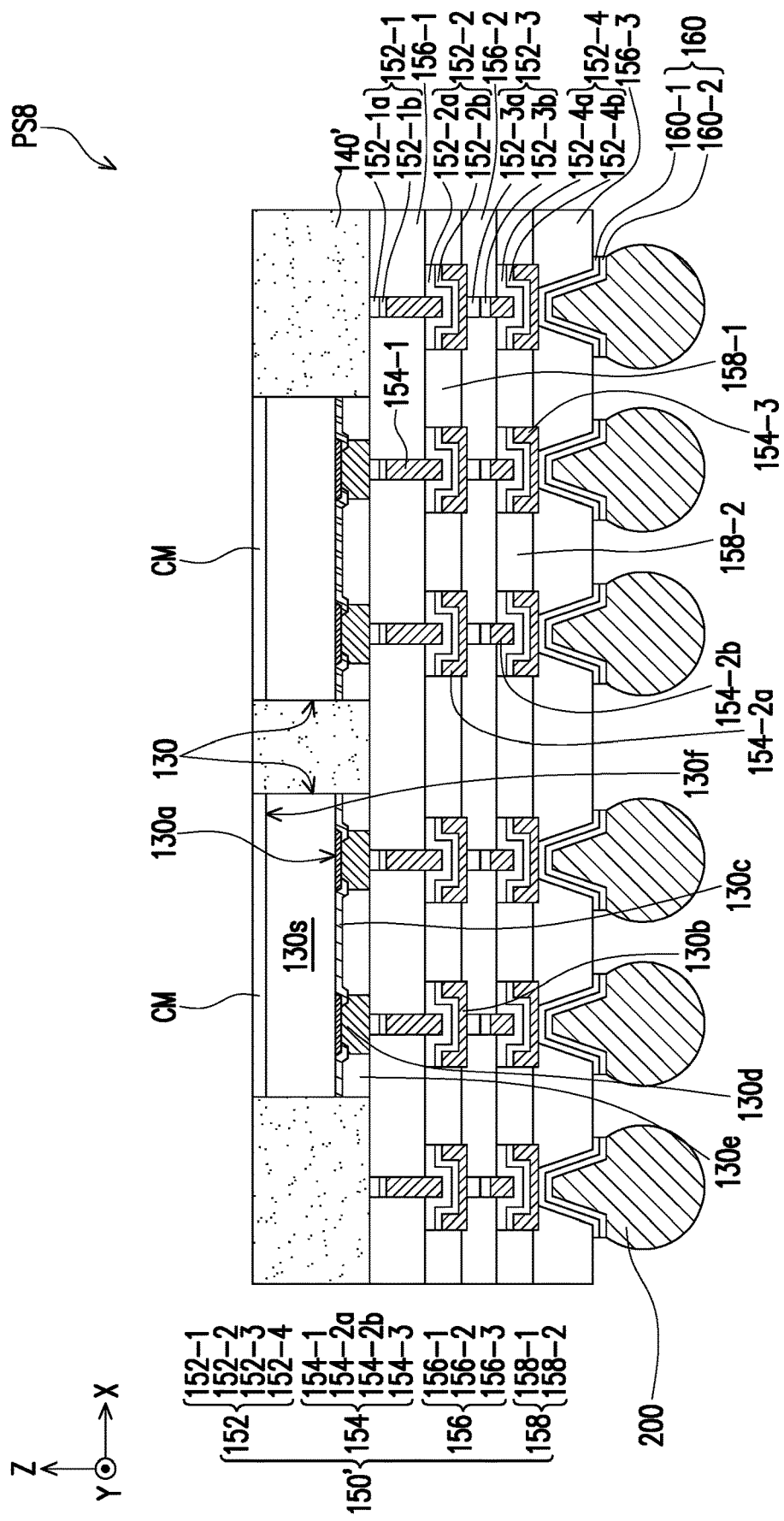
FIG. 43 is a schematic cross sectional view of a package structure in accordance with some other embodiments of the present disclosure.

However, the disclosure is not limited thereto. In certain embodiments, the conductive terminals 170 may be substituted by conductive terminals 200 which may include solder balls or BGA balls, see a package structure PS6 depicted in FIG. 41. In an alternative embodiment, the redistribution circuit structure 118, the through vias 120, the UBM patterns 180, and the conductive terminals 190 may be optionally omitted, see a package structure PS7 depicted in FIG. 42. In a further alternative embodiment, the conductive terminals 170 may be substituted by conductive terminals 200 which may include solder balls or BGA balls while the redistribution circuit structure 118, the through vias 120, the UBM patterns 180, and the conductive terminals 190 may be optionally omitted, see a package structure PS8 depicted in FIG. 43.

In further alternative embodiments, in addition to the conductive terminals 170, 190, and/or 200 in FIG. 40 to FIG. 43, an additional semiconductor element(s) (not shown) may be disposed on the seed layer patterns 160 and/or the UBM patterns 180 for electrically coupling at least one of the semiconductor dies 130. In some embodiments, the additional semiconductor element(s) may include a passive component or active component. The number of the additional semiconductor element(s) is not limited in the disclosure, and may be designated based on the demand and design layout.

In some embodiments, the package structures PS1 to PS8 may be further mounted with an additional package, chips/dies, other electronic devices, or a suitable substrate (e.g. an organic substrate) to form a stacked package structure, the disclosure is not limited thereto. In the disclosure, owing to the configuration of the interface IF1 to IF6, the reliability of the package structures PS1 to PS8 is further enhanced.

In accordance with some embodiments, a package structure includes a semiconductor die and a first redistribution circuit structure. The first redistribution circuit structure is disposed on and electrically connected to the semiconductor die, and includes a first build-up layer. The first build-up layer includes a first metallization layer and a first dielectric layer laterally wrapping the first metallization layer, wherein at least a portion of the first metallization layer is protruded out of the first dielectric layer.

In accordance with some embodiments, a package structure includes a semiconductor die, an insulating encapsulation, a redistribution circuit structure, and conductive elements. The insulating encapsulation encapsulates the semiconductor die. The redistribution circuit structure is disposed on the insulating encapsulation and electrically connected to the semiconductor die, and includes a first build-up layer and a second build-up layer. The first build-up layer includes a first metallization layer and a first seed layer sandwiched between the first metallization layer and the semiconductor die. The second build-up layer includes a second metallization layer having a first portion and a second portion stacked on the first portion, a second seed layer sandwiched between the first portion of the second metallization layer and the first metallization layer, and a third seed layer sandwiched between the first portion and the second portion. A thickness of the third seed layer is greater than a thickness of the first seed layer and a thickness of the second seed layer. The conductive elements are disposed on and electrically connected to the redistribution circuit structure, wherein the redistribution circuit structure is located between the conductive elements and the insulating encapsulation.

In accordance with some embodiments, a method of manufacturing package structure includes the following steps, providing a semiconductor die; encapsulating the semiconductor die in an insulating encapsulation; forming a first redistribution circuit structure, wherein the first redistribution circuit structure is electrically connected to the semiconductor die, and forming the redistribution circuit structure includes forming a first metallization layer on the insulating encapsulation, disposing a first dielectric material to embed the first metallization layer therein, and planarizing the first dielectric material to form a first dielectric layer, wherein at least a portion of the first metallization layer is protruded out of the first dielectric layer; and forming conductive elements on the first redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
a semiconductor die; and
a first redistribution circuit structure, disposed on and electrically coupled to the semiconductor die, and comprising:
   a first build-up layer, comprising:
      a first metallization layer;
      a first seed layer sandwiched between the first metallization layer and the semiconductor die; and
      a first dielectric layer, laterally covering the first metallization layer and the first seed layer, wherein a first portion of the first metallization layer is protruding out of the first dielectric layer,
      wherein the first metallization layer has a first surface at the first portion protruding out the first dielectric layer and a second surface at a second portion being embedded in the first dielectric layer and opposite to the first portion, and a first lateral size of the first surface is less than a second lateral size of the second surface, wherein the first surface is free from the first seed layer, and the second surface is in contact with the first seed layer.

2. The package structure of claim 1, further comprising:
an insulating encapsulation, laterally encapsulating the semiconductor die; and
a plurality of conductive terminals, disposed on and connected to the first redistribution circuit structure, the first redistribution circuit structure being between the insulating encapsulation and the plurality of conductive terminals.

3. The package structure of claim 1, wherein the first redistribution circuit structure further comprises:
a second build-up layer, comprising:
   a second metallization layer, having a third portion and a fourth portion stacked on the third portion;
   a second seed layer, sandwiched between the third portion of the second metallization layer and the first metallization layer;
   a third seed layer, sandwiched between the third portion and the fourth portion; and
   a second dielectric layer, laterally covering the second metallization layer, wherein a portion of the fourth portion of the second metallization layer is protruded out of the second dielectric layer, wherein the fourth portion of the second metallization layer has a third surface at the portion protruding out the second dielectric layer and a fourth surface at an opposite portion being embedded in the second dielectric layer, and a third lateral size of the third surface is less than a fourth lateral size of the fourth surface, wherein the third surface is free from the second seed layer and the third seed layer.

4. The package structure of claim 3, wherein an interface of the first dielectric layer and the second dielectric layer is at a sidewall of the first metallization layer.

5. The package structure of claim 3, wherein the second build-up layer further comprises:
an inter-layer film, laterally covering the second metallization layer, the inter-layer film being disposed between the first dielectric layer and the second dielectric layer,
wherein a portion of the third portion of the second metallization layer is protruded out of the inter-layer film, wherein the third portion of the second metallization layer has a fifth surface at the portion protruding out the inter-layer film and a sixth surface at an opposite portion being embedded in the inter-layer film, and a fifth lateral size of the fifth surface is less than a sixth lateral size of the sixth surface.

6. The package structure of claim 5, wherein an interface of the first dielectric layer and the inter-layer film is at a sidewall of the first metallization layer, and an interface of the inter-layer film and the second dielectric layer is at a sidewall of the third portion of the second metallization layer.

7. The package structure of claim 1, further comprising:
an encapsulant, laterally encapsulating the semiconductor die;
a second redistribution circuit structure, disposed over the encapsulant and the semiconductor die;
a plurality of conductive pillars, penetrating the encapsulant and electrically coupling the first redistribution circuit structure and the second redistribution circuit structure;
a plurality of first connectors, disposed on and connected to the first redistribution circuit structure, the first redistribution circuit structure being between the encapsulant and the plurality of first connectors; and
a plurality of second connectors, disposed on and connected to the second redistribution circuit structure, the second redistribution circuit structure being between the encapsulant and the plurality of second connectors.

8. A package structure, comprising:
a semiconductor die;
a redistribution circuit structure, disposed on and electrically coupled to the semiconductor die, and comprising:
a first build-up layer, comprising:
a first metallization layer; and
a first seed layer, sandwiched between the first metallization layer and the semiconductor die; and
a second build-up layer, comprising:
a second metallization layer, having a first portion and a second portion stacked on the first portion;
a second seed layer, sandwiched between the first portion of the second metallization layer and the first metallization layer; and
a third seed layer, sandwiched between the first portion and the second portion, wherein a thickness of the third seed layer is greater than a thickness of the first seed layer and a thickness of the second seed layer; and
a plurality of conductive elements, disposed on and connected to the redistribution circuit structure, wherein the redistribution circuit structure is disposed between the plurality of conductive elements and the semiconductor die.

9. The package structure of claim 8, wherein the first build-up layer further comprises a first dielectric layer laterally wrapping around the first metallization layer, and a portion of the first metallization layer is protruded out of the first dielectric layer.

10. The package structure of claim 9, wherein a top surface and a sidewall of the portion of the first metallization layer protruded out of the first dielectric layer are wrapped by the second seed layer.

11. The package structure of claim 10, wherein the portion of the first metallization layer has a bevel surface connecting the top surface and the sidewall, and an angle between an extending plane of the bevel surface and a top surface of the first dielectric layer is approximately ranging from 100° to 140°.

12. The package structure of claim 10, wherein a distance between the top surface of the portion of the first metallization layer and a top surface of the first dielectric layer is approximately ranging from 0.1 µm to 0.7 µm.

13. The package structure of claim 9, wherein the second build-up layer further comprising a second dielectric layer laterally wrapping around the second metallization layer, and a portion of the second portion of the second metallization layer is protruded out of the second dielectric layer.

14. The package structure of claim 13, wherein the portion of the second portion of the second metallization layer has a top surface, a sidewall and a bevel surface connecting the top surface and the sidewall, and an angle between an extending plane of the bevel surface and a top surface of the second dielectric layer is approximately ranging from 100° to 140°.

15. The package structure of claim 13, wherein a distance between a top surface of the portion of the second portion of the second metallization layer and a top surface of the second dielectric layer is approximately ranging from 0.1 µm to 0.7 µm.

16. A package structure, comprising:
a plurality of dies;
an insulating encapsulation, encapsulating the plurality of dies;
a first routing structure, disposed over the insulating encapsulation and electrically coupled to the plurality of dies, and comprising:
a stack of inner build-up layers, wherein the inner build-up layers are stacked on each other and electrically coupled to each other, and each of the inner build-up layers comprises:
a metallization layer;
a seed layer sandwiched between the metallization layer and the plurality of dies; and
a dielectric layer, laterally covering the metallization layer and the seed layer, wherein a first portion of the metallization layer is protruding out of the dielectric layer,
wherein the metallization layer has a first surface at the first portion protruding out the dielectric layer and a second surface at a second portion being embedded in the dielectric layer and opposite to the first portion, and a first lateral size of the first surface is less than a second lateral size of the second surface, wherein the first surface is free from the first seed layer, and the second surface is in contact with the first seed layer; and
a plurality of conductive terminals, disposed over and electrically coupled to the first routing structure, wherein the first routing structure is disposed between the plurality of conductive terminals and the insulating encapsulation.

17. The package structure of claim 16, wherein first routing structure further comprises:
- a topmost build-up layer, disposed on and electrically coupled to the stack of inner build-up layers, comprising:
  - a topmost metallization layer;
  - a topmost seed layer sandwiched between the topmost metallization layer and the stack of inner build-up layers; and
  - a topmost dielectric layer, laterally covering the topmost metallization layer and the topmost seed layer, wherein the plurality of conductive terminals are electrically coupled to the topmost metallization layer exposed by a plurality of openings formed in and penetrating through the topmost dielectric layer.

18. The package structure of claim 16, wherein first routing structure further comprises:
- a topmost build-up layer, disposed on the stack of inner build-up layers, comprising:
  - a topmost dielectric layer, covering the first portion of the metallization layer of a topmost layer of the inner build-up layers,
  - wherein the plurality of conductive terminals are electrically coupled to the metallization layer of a topmost layer of the inner build-up layers exposed by a plurality of openings formed in and penetrating through the topmost dielectric layer.

19. The package structure of claim 16, further comprising:
- a second routing structure, disposed over and electrically coupled to the plurality of dies;
- a plurality of through-dielectric vias, next to the plurality of dies and penetrating through the insulating encapsulation, the plurality of through-dielectric vias connecting the first routing structure and the second routing structure; and
- a plurality of additional conductive terminals, disposed over and electrically coupled to the second routing structure, wherein the second routing structure is disposed between the plurality of additional conductive terminals and the insulating encapsulation.

20. The package structure of claim 16, further comprising at least one of
- a plurality of first under-ball metallurgies, disposed between and electrically coupling the plurality of conductive terminals and the first routing structure, or
- a plurality of second under-ball metallurgies, disposed between and electrically coupling the plurality of additional conductive terminals and the second routing structure.

\* \* \* \* \*